(12) United States Patent
Yamaguchi

(10) Patent No.: US 9,263,498 B2
(45) Date of Patent: Feb. 16, 2016

(54) METHOD OF MANUFACTURING SEMICONDUCTOR DEVICE

(71) Applicant: Renesas Electronics Corporation, Kawasaki-shi, Kanagawa (JP)

(72) Inventor: Tadashi Yamaguchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/287,045

(22) Filed: May 25, 2014

(65) Prior Publication Data

US 2014/0370645 A1    Dec. 18, 2014

(30) Foreign Application Priority Data

Jun. 12, 2013    (JP) .................... 2013-123698

(51) Int. Cl.
*H01L 21/00*    (2006.01)
*H01L 27/146*   (2006.01)

(52) U.S. Cl.
CPC ...... *H01L 27/14698* (2013.01); *H01L 27/1462* (2013.01); *H01L 27/1463* (2013.01); *H01L 27/14636* (2013.01); *H01L 27/14638* (2013.01); *H01L 27/14685* (2013.01)

(58) Field of Classification Search
USPC ....................................... 438/69–72
See application file for complete search history.

(56) References Cited

U.S. PATENT DOCUMENTS

| 8,426,285 | B2 | 4/2013 | Yoshino et al. |
| 2006/0046369 | A1* | 3/2006 | Ihara et al. ............ 438/199 |
| 2009/0289282 | A1* | 11/2009 | Tsuno ................. 257/219 |
| 2010/0032659 | A1* | 2/2010 | Yoshida ............... 257/40 |
| 2010/0062562 | A1* | 3/2010 | Smythe et al. ........ 438/102 |
| 2010/0203667 | A1* | 8/2010 | Hirota et al. ......... 438/72 |
| 2012/0126297 | A1 | 5/2012 | Yamaguchi |

FOREIGN PATENT DOCUMENTS

| JP | 01-120817 A | 5/1989 |
| JP | 2002-043329 A | 2/2002 |
| JP | 2011-077408 A | 4/2011 |
| JP | 2012-109503 A | 6/2012 |
| JP | 2013-051317 A | 3/2013 |

* cited by examiner

*Primary Examiner* — Karen Kusumakar
(74) *Attorney, Agent, or Firm* — Shapiro, Gabor and Rosenberger, PLLC

(57) ABSTRACT

An improvement is achieved in the performance of a semiconductor device. In a method of manufacturing the semiconductor device, in an n-type semiconductor substrate, a p-type well as a p-type semiconductor region forming a part of a photodiode is formed and a gate electrode of a transfer transistor is formed. Then, after an n-type well as an n-type semiconductor region forming the other part of the photodiode is formed, a microwave is applied to the semiconductor substrate to heat the semiconductor substrate. Thereafter, a drain region of the transfer transistor is formed.

12 Claims, 49 Drawing Sheets

METHOD OF MANUFACTURING SEMICONDUCTOR DEVICE

CROSS-REFERENCE TO RELATED APPLICATIONS

The disclosure of Japanese Patent Application No. 2013-123698 filed on Jun. 12, 2013 including the specification, drawings and abstract is incorporated herein by reference in its entirety.

BACKGROUND

The present invention relates to a method of manufacturing a semiconductor device, which can be used appropriately as a method of manufacturing, e.g., a semiconductor device including a solid-state image sensing element.

The development of a CMOS image sensor using a CMOS (Complementary Metal Oxide Semiconductor) as a solid-state image sensing element has been promoted. The CMOS image sensor is configured to include a plurality of pixels each having a photodiode and a transfer transistor. The photodiode and the transfer transistor are formed in a pixel region of a semiconductor substrate. On the other hand, in a peripheral circuit region of the semiconductor substrate, a transistor forming a logic circuit, i.e., a logic transistor is formed.

A manufacturing process of a semiconductor device including a CMOS image sensor as a solid-state image sensing element includes the step of introducing an impurity by ion implantation and the step of performing annealing, i.e., heat treatment for activating the impurity introduced by the ion implantation or curing crystal defects caused by the ion implantation. As a method for performing the annealing for activating the impurity or curing the crystal defects, furnace annealing using a batch-type or single-wafer-type annealing furnace, RTA (Rapid Thermal Anneal), laser annealing, or the like is used. When the annealing is performed by such a method, the annealing needs to be performed at a high temperature of not less than 800° C.

On the other hand, as a method for performing such annealing at a lower temperature, microwave annealing is used.

Japanese Unexamined Patent Publication No. 2011-77408 (Patent Document 1) discloses a technique which cures crystal defects by microwave annealing and activates the impurity ions introduced by ion implantation by flash lamp annealing or laser annealing.

Japanese Unexamined Patent Publication No. 2002-43329 (Patent Document 2) discloses a technique which performs the step of activating an impurity element by a thermal annealing method using a furnace annealing furnace.

Japanese Unexamined Patent Publication No. Hei 1(1989)-120817 (Patent Document 3) discloses a technique which implants ions into a p-type silicon substrate and then applies a microwave thereto to activate the impurity ions.

Japanese Unexamined Patent Publication No. 2012-109503 (Patent Document 4) discloses a technique which performs, when a silicide layer is formed, first heat treatment using a single-wafer-type thermally conductive annealing device and then performs second heat treatment using a microwave annealing device.

Japanese Unexamined Patent Publication No. 2013-51317 (Patent Document 5) discloses a technique which forms photodiode and a transfer transistor each forming a solid-state image sensing element in a semiconductor substrate, further forms an interlayer insulating film over the semiconductor substrate, and then applies a microwave to the semiconductor substrate to heat the semiconductor substrate.

RELATED ART DOCUMENTS

Patent Documents

[Patent Document 1]
   Japanese Unexamined Patent Publication No. 2011-77408
[Patent Document 2]
   Japanese Unexamined Patent Publication No. 2002-43329
[Patent Document 3]
   Japanese Unexamined Patent Publication No. Hei 1(1989)-120817
[Patent Document 4]
   Japanese Unexamined Patent Publication No. 2012-109503
[Patent Document 5]
   Japanese Unexamined Patent Publication No. 2013-51317

SUMMARY

In a typical semiconductor device manufacturing process, activation annealing is performed at a high temperature of about 1000° C. every several steps to activate the impurity introduced by ion implantation. By performing the activation annealing, it is also expected to cure crystal defects resulting from the ion implantation.

However, in the typical semiconductor device manufacturing process, before the activation annealing after the ion implantation is performed, when, e.g., an anti-reflection film is formed, a semiconductor substrate may be heated to a temperature of, e.g., about 600° C. At the temperature of about 600° C., crystal defects such as point defects are slightly cured, but are not completely cured, resulting in a state where a given amount of dislocation formed by the diffused point defects remains in the semiconductor substrate. The dislocation moves/increases using a stress in a crystal as a thrust force. In the state where a given number of dislocation defects thus remain in the semiconductor substrate, even when the activation annealing is subsequently performed at a temperature of, e.g., about 1000° C., it is difficult to completely cure the remaining dislocation defects.

Accordingly, to enhance the effect of reducing the point defects and the dislocation, it is effective to perform annealing at a higher temperature. However, in a manufacturing process of a semiconductor device including a pixel region and a peripheral circuit region, when annealing is performed at a temperature of not less than 800° C., the impurity may be diffused in the peripheral circuit region to possibly vary the characteristics of semiconductor elements including transistors such as MISFETs (Metal Insulator Semiconductor Field Effect Transistors) and other elements, resulting in the degradation of the performance of the semiconductor device. Therefore, in terms of curing crystal defects in a photodiode or the like formed in the pixel region, it is desirable to perform annealing at a high temperature. However, in terms of suppressing variations in the characteristics of the semiconductor elements formed in the peripheral circuit region, it is not desirable to perform annealing at a high temperature so that the steps in which annealing can be performed at a high temperature and the number of times annealing is performed at a high temperature are limited.

It can also be considered to use microwave annealing which can cure crystal defects even when the annealing is performed at a low temperature instead of furnace annealing or the like which cannot cure crystal defects unless annealing is performed at a high temperature. However, in the case of performing the microwave annealing to cure crystal defects resulting from ion implantation, depending on where the microwave annealing is performed in a sequence, the effect of curing crystal defects decreases to degrade the performance of the semiconductor device.

Other problems and novel features of the present invention will become apparent from a statement in the present specification and the accompanying drawings.

According to an embodiment, in a method of, manufacturing a semiconductor device, in an n-type semiconductor substrate, a p-type semiconductor region forming a part of a photodiode is formed and a gate electrode of a transfer transistor is formed. Then, after an n-type semiconductor region forming the other part of the photodiode is formed, a microwave is applied to the semiconductor substrate to heat the semiconductor substrate. Thereafter, a drain region of the transfer transistor is formed.

According to another embodiment, in a method of manufacturing a semiconductor device, in an n-type semiconductor substrate, a p-type semiconductor region forming a part of a photodiode is formed and then a microwave is applied to the semiconductor substrate to heat the semiconductor substrate. Thereafter, a gate electrode of transfer transistor is formed, an n-type semiconductor region forming the other part of the photodiode is formed, and a drain region of the transfer transistor is formed.

According to still another embodiment, in a method of manufacturing a semiconductor device, in an n-type semiconductor substrate, a p-type semiconductor region forming a part of a photodiode is formed, a gate electrode of a transfer transistor is formed, and an n-type semiconductor region forming the other part of the photodiode is formed. Then, after a drain region of the transfer transistor is formed, a microwave is applied to the semiconductor substrate to heat the semiconductor substrate.

According to the embodiment, it is possible to improve the performance of the semiconductor device.

DETAILED DESCRIPTION

Figure 1:
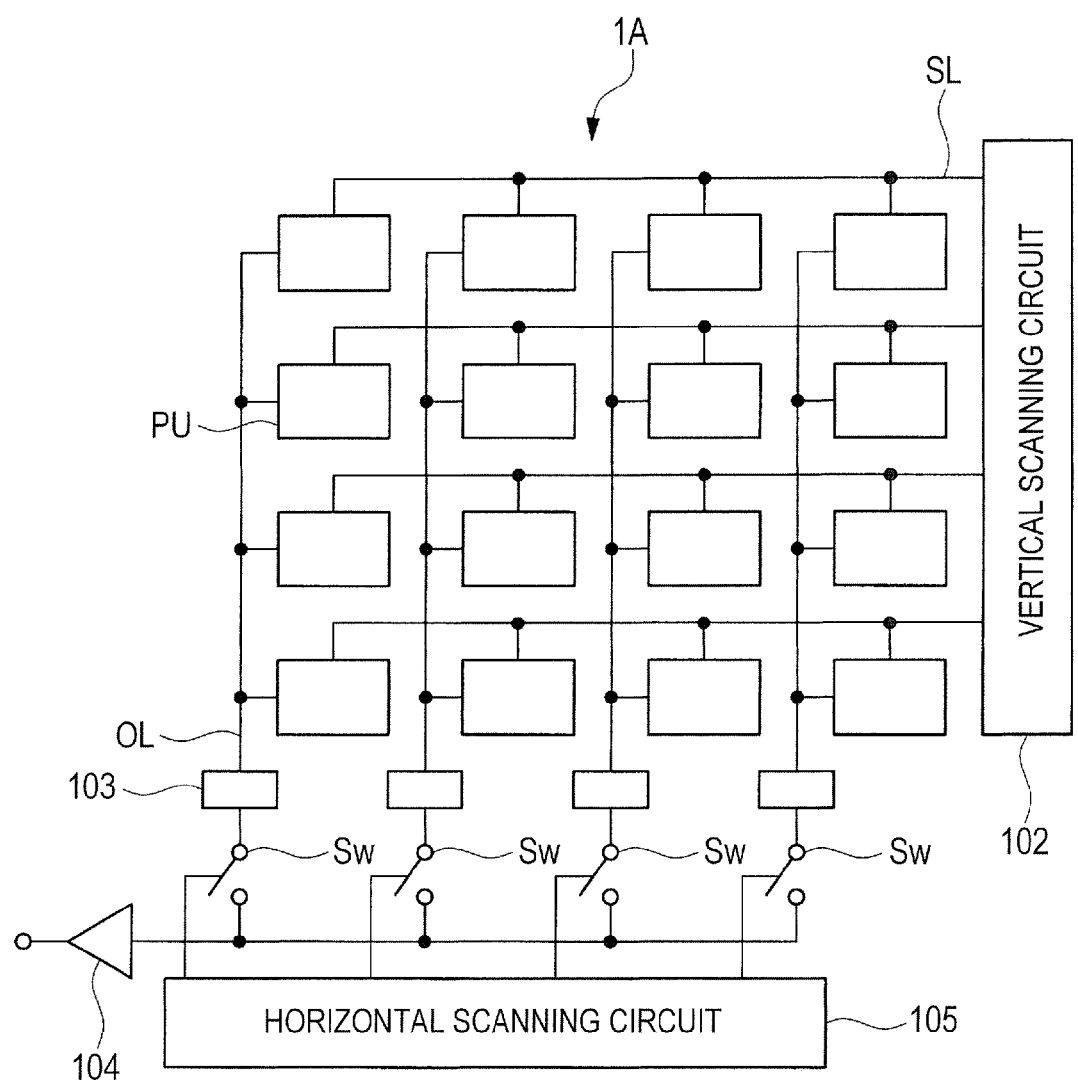
FIG. 1 is a circuit block diagram showing an example of a configuration of a semiconductor device of Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Hereinbelow, representative embodiments will be described in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

In a cross-sectional view and a plan view, the sizes of individual portions do not correspond to those in a real device. For improved clarity of illustration, a specific portion may be shown in a relatively large size. Even when a plan view and a cross-sectional view correspond to each other, each of the portions may be shown in different sizes.

Note that, when a range is shown by "A to B" in the following embodiments, it is assumed that the range of not less than A and not more than B is shown thereby unless particularly explicitly described otherwise.

(Embodiment 1)

Referring now to the drawings, a detailed description will be given below of a structure of a semiconductor device of Embodiment 1 and a manufacturing process thereof. In Embodiment 1, a description will be given of an example in which the semiconductor device is a CMOS image sensor as a front-side-illuminated image sensor on which light is incident from the front side of a semiconductor substrate.

<Configuration of Semiconductor Device>

Figure 2:
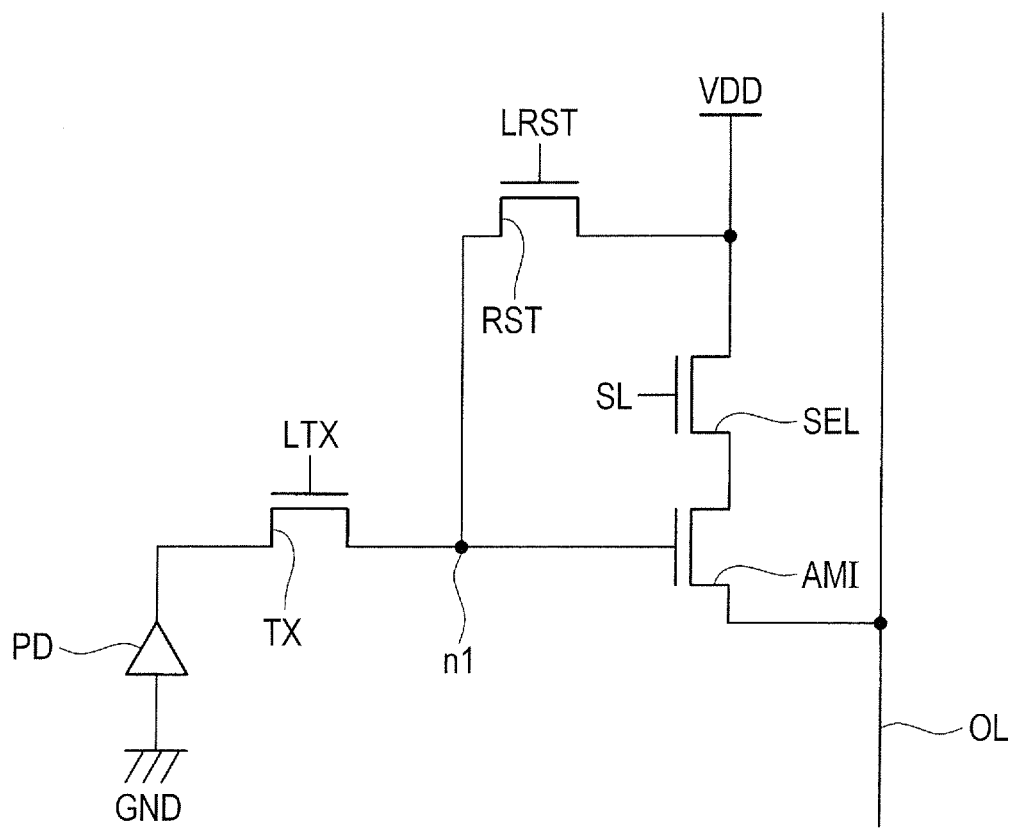
FIG. 2 is a circuit diagram showing an example of configuration of a pixel.

FIG. 1 is a circuit block diagram showing an example of a configuration of the semiconductor device of Embodiment 1. FIG. 2 is a circuit diagram showing an example of a configuration of a pixel. Note that, in FIG. 1, sixteen pixels arranged in the form of an array of 4 rows and 4 columns are shown, but the number of pixels actually used in an electronic device such as a camera may be several million.

In a pixel region 1A shown in FIG. 1, a plurality of pixels are arranged in the form of an array and, around the pixels, driving circuits such as a vertical scanning circuit 102 and a horizontal scanning circuit 105 are arranged. That is, the semiconductor device of Embodiment 1 has a pixel array in which the plurality of pixels are arranged in the form of an array.

Each of pixels PU is placed at an intersection of a corresponding selection line SL and a corresponding output line OL. The selection lines SL are each coupled to the vertical scanning circuit 102 and the output lines OL are coupled to column circuits 103. The column circuits 103 are each coupled to an output amplifier 104 via switches Sw. The switches Sw are each coupled to the horizontal scanning circuit 105 and controlled by the horizontal scanning circuit 105.

For example, an electric signal read from the pixel PU selected by the vertical scanning circuit 102 and the horizontal scanning circuit 105 is output via the corresponding output line OL and the output amplifier 104.

As shown in, e.g., FIG. 2, the pixel PU is configured to include a photodiode PD and four MOSFETs. Each of these MOSFETs is of an n-type. RST is a reset transistor, TX is a transfer transistor, SEL is a selection transistor, and AMI is an amplification transistor. The transfer transistor TX transfers charges generated by the photodiode PD. Note that, in addition to these transistors, another transistor or an element such as a capacitor element may also be integrated in the pixel PU. The form in which these transistors are coupled to each other includes various modified/applied forms. "MOSFET" is the abbreviation of Metal Oxide Semiconductor Field Effect Transistor, which may also be shown as MISFET. Also, "FET" is the abbreviation of Field Effect Transistor.

In the circuit example shown in FIG. 2, between a ground potential GND and a node n1, the photodiode PD and the transfer transistor TX are coupled in series. Between the node n1 and a power source potential VDD, the reset transistor RST is coupled. The power source potential VDD is a potential in a power source potential line LVDD (see FIG. 4 described later). Between the power source potential VDD and the output line OL, the selection transistor SEL and the amplification transistor AMI are coupled in series. The gate electrode of the amplification transistor AMI is coupled to the node n1. The gate electrode of the reset transistor RST is coupled to a reset line LRST. On the other hand, the gate electrode of the selection transistor SEL is coupled to the selection line SL and the gate electrode of the transfer transistor TX is coupled to a transfer line LTX.

For example, the transfer line LTX and the reset line LRST are each caused to rise to a H level to bring the transfer transistor TX and the reset transistor RST into an ON state. As a result, the charges in the photodiode PD are extracted therefrom to deplete the photodiode PD. Then, the transfer transistor TX is brought into an OFF state.

Thereafter, when, e.g., the mechanical shutter of an electronic device such as a camera is opened, charges are generated by incident light in the photodiode PD and stored while the shutter is open. That is, the photodiode PD receives the incident light and generates the charges.

Then, after the shutter is closed, the reset line LRST is caused to fall to a L level to bring the reset transistor RST into an OFF state. In addition, the selection line SL and the transfer line LTX are each caused to rise to the H level to bring the selection transistor SEL and the transfer transistor TX into the ON state. As a result, the charges generated by the photodiode PD are transferred to the terminal portion (floating diffusion FD shown in FIG. 3 and described later) of the transfer transistor TX coupled to the node n1. At this time, the potential in the floating diffusion FD changes to a value in accordance with the charges transferred from the photodiode PD and the value is amplified by the amplification transistor AMI to appear on the output line OL. The potential in the output line OL becomes an electric signal (received light signal) and is read as an output signal from the output amplifier 104 via the column circuits 103 and the switches Sw.

Figure 3:
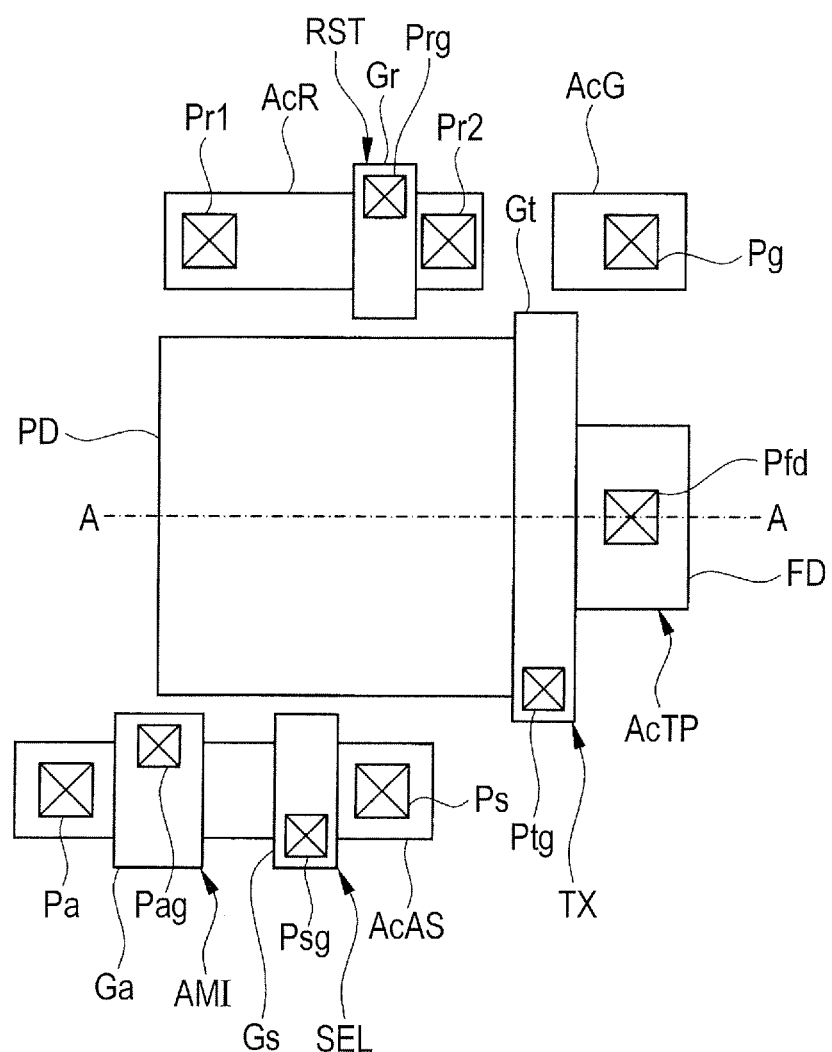
FIG. 3 is a plan view showing the pixel in the semiconductor device of Embodiment 1.
Figure 4:
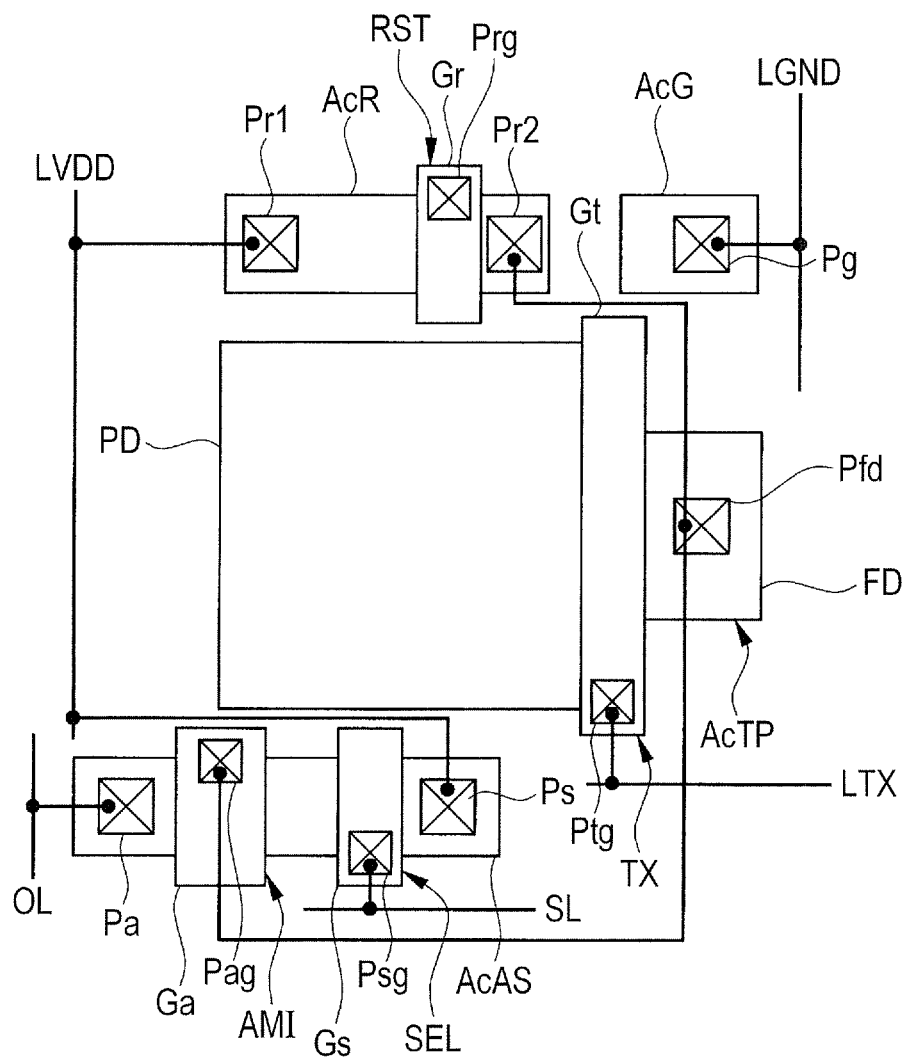
FIG. 4 is a view showing an example of wire coupling between individual plugs.

FIG. 3 is a plan view showing the pixel in the semiconductor device of Embodiment 1. FIG. 4 is a view showing an example of wire coupling between individual plugs.

As shown in FIGS. 3 and 4, each of the pixels PU (see FIG. 1) in the semiconductor device of Embodiment 1 has an active region AcTP where the photodiode PD and the transfer transistor TX are placed and an active region AcR where the reset transistor RST is placed. The pixel Pu also has an active region AcAS where the selection transistor SEL and the amplification transistor AMI are placed and an active region AcG where a plug Pg coupled to a ground potential line LGND is placed.

In the active region AcR, a gate electrode Gr is placed and, over source/drain regions on both sides thereof, plugs Pr1 and Pr2 are placed. The gate electrode Gr and the source/drain regions form the reset transistor RST.

In the active region AcTP, a gate electrode Gt is placed and, on one of both sides of the gate electrode Gt in planar view, the photodiode PD is placed. On the other of both sides of the gate electrode Gt in planar view, the floating diffusion FD having the function of a charge storage portion or a floating diffusion layer is placed. The photodiode PD is a pn junction diode and formed of, e.g., a plurality of n-type or p-type impurity regions, i.e., semiconductor regions. Alternatively, the floating diffusion FD is formed of, e.g., an n-type impurity region, i.e., a semiconductor region. Over the floating diffusion FD, a plug Pfd is placed.

That is, the floating diffusion (semiconductor region) FD is formed in the active region AcTP.

In the active region AcAS, a gate electrode Ga and a gate electrode Gs are placed. At the end portion of the active region AcAS closer to the gate electrode Ga, a plug Pa is placed and, at the end portion of the active region AcAS closer to the gate electrode Gs, a plug Ps is placed. On both sides of the gate electrodes Ga and Gs, source/drain regions are located. The gate electrodes Ga and Gs and the source/drain regions form the selection transistor SEL and the amplification transistor AMI that are coupled in series.

Over the active region AcG, the plug Pg is placed. The plug Pg is coupled to the ground potential line LGND. Consequently, the active region AcG serves as a power supply region for applying the ground potential GND to the well region of the semiconductor substrate.

The foregoing plugs Pr1, Pr2, Pg, Pfd, Pa, and Ps are coupled to each other with a plurality of interconnect layers (e.g., interconnects M1 to M3 shown in FIG. 7 and described later). Also, the plugs Prg, Ptg, Pag, and Psg respectively located over the gate electrodes Gr, Gt, Ga, and Gs are coupled to each other with a plurality of interconnect layers (e.g., interconnects M1 to M3 shown in FIG. 7 and described later). In this manner, the circuit shown in each of FIGS. 1 and 2 can be configured.

Figure 5:
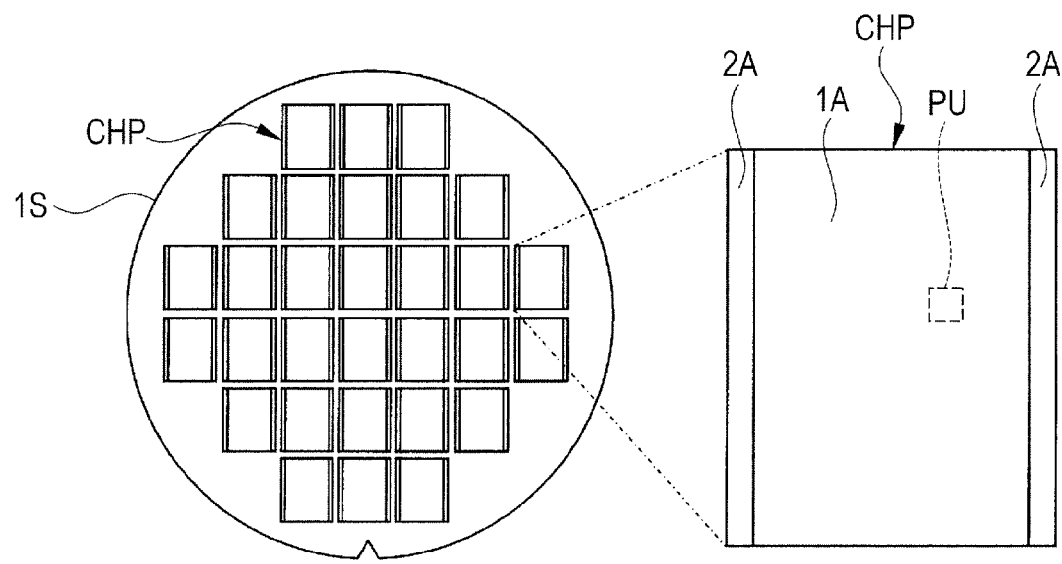
FIG. 5 is a plan view showing a semiconductor substrate and each of element regions where the semiconductor device of Embodiment 1 is formed.

FIG. 5 is a plan view showing a semiconductor substrate and each of element regions where the semiconductor device of Embodiment 1 is formed. As shown in FIG. 5, a semiconductor substrate 1S has a plurality of element regions CHP on the top surface side thereof. The pixel region 1A shown in FIG. 1 is formed together with peripheral circuit regions 2A different from the pixel region 1A in each one of the element regions CHP. The active region AcTP described above is formed in each f the pixel regions 1A on the top surface side of the semiconductor substrate 1S. In the peripheral circuit regions 2A, logical circuits, i.e., logic circuits are placed. Each of the logic circuits performs an arithmetic operation on an output signal output from the pixel region 1A and outputs image data on the basis of the result of the arithmetic operation.

Note that the semiconductor substrate 1S assumedly has the top surface as a first main surface and a back surface as a second main surface opposite to the top surface and the element regions CHP are assumedly formed on the top surface side.

Figure 6:
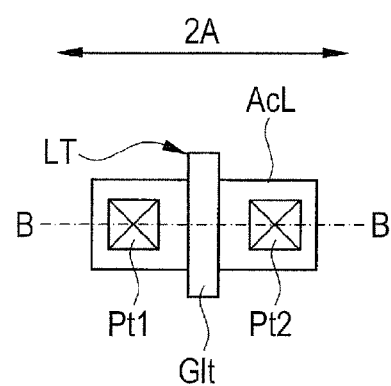
FIG. 6 is a plan view showing a transistor of the semiconductor device of Embodiment 1 formed in each of peripheral circuit regions.

FIG. 6 is a plan view showing a transistor of the semiconductor device of Embodiment 1 formed in each of the peripheral circuit regions.

Figure 8:
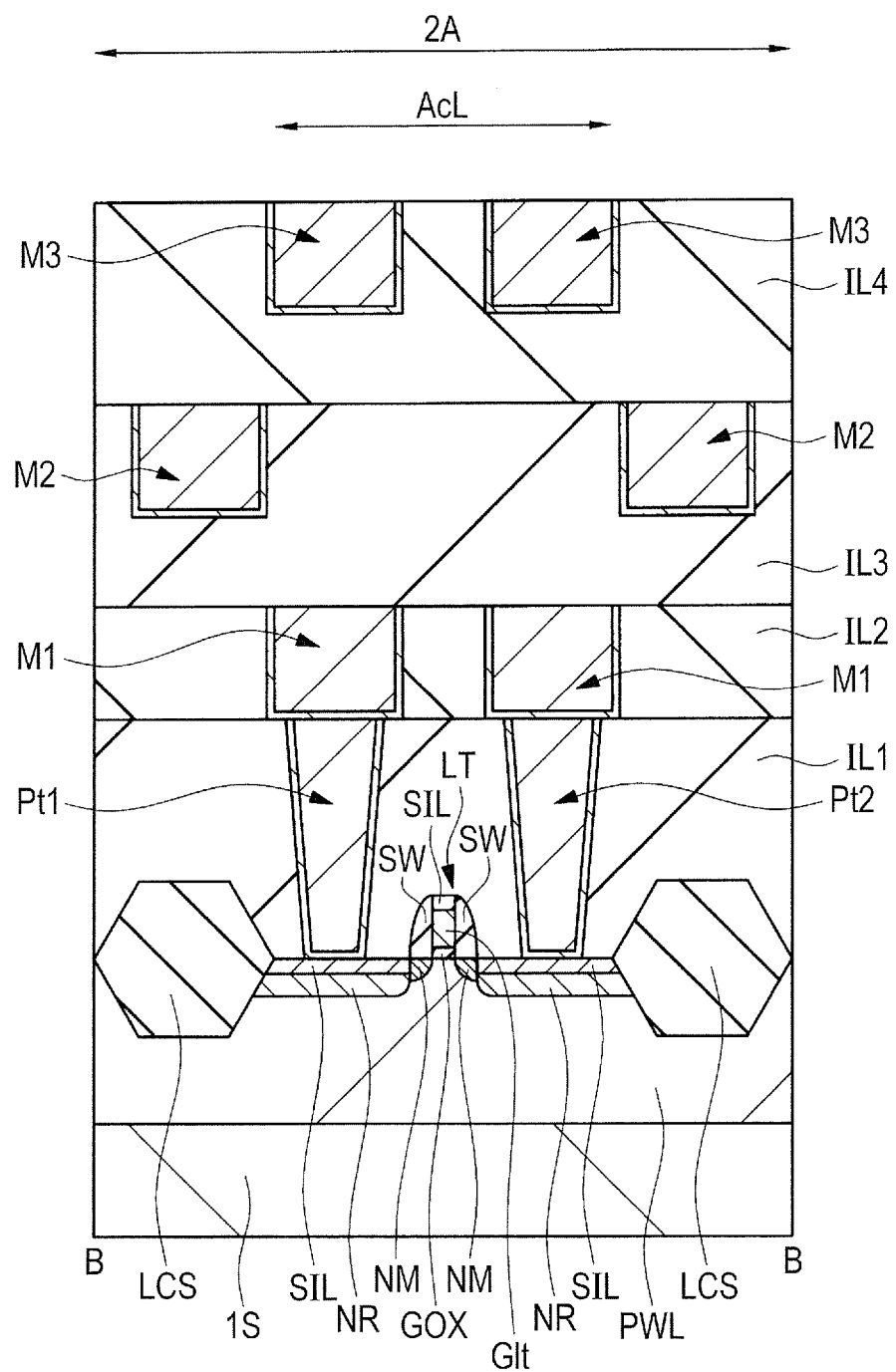
FIG. 8 is a cross-sectional view showing the configuration of the semiconductor device of Embodiment 1.

As shown in FIG. 6, in the peripheral circuit region 2A, a transistor LT as a logic transistor is placed. The transistor LT includes an N-type MOSFET (NMOSFET) using electrons as carriers and a P-type MOSFET using holes as carriers. The transistor LT shown in FIG. 6 is one of the transistors forming the logic circuit, e.g., one of the NMOSFETs. In each of the peripheral circuit regions 2A on the top surface side of the semiconductor substrate 1S, an active region AcL is formed. In the active region AcL, a gate electrode Glt is placed and, in the active region AcL on both sides of the gate electrode Glt, source/drain regions including higher-concentration semiconductor regions NR described later using FIG. 8 are formed. Over the source/drain regions, i.e., over the active region AcL, plugs pt1 and pt2 are placed.

In FIG. 6, only one transistor LT is shown. However, in the peripheral circuit region 2A, the plurality of transistors are placed. By coupling the plugs over the source/drain regions of the plurality of transistors or the plugs over the gate electrodes thereof with the plurality of interconnect layers (e.g., interconnects M1 to M3 shown in FIG. 7 and described later), the logic circuits can be configured. There may also be a case where an element other than the transistors, e.g., a capacitor element or a transistor having another configuration is integrated in the logic circuit.

In the following, an example in which the transistor LT is an n-channel MISFET will be described. However, the transistor LT may also be a p-channel MISFET.

<Structures of Elements in Pixel Region and Peripheral Circuit Region>

Next, the structures of the elements in each of the pixel regions and the peripheral circuit regions will be described. FIGS. 7 and 8 are cross-sectional views each showing the configuration of the semiconductor device of Embodiment 1. FIG. 7 corresponds to a cross section along the line A-A in FIG. 3. FIG. 8 corresponds to a cross section along the line B-B in FIG. 6.

Figure 7:
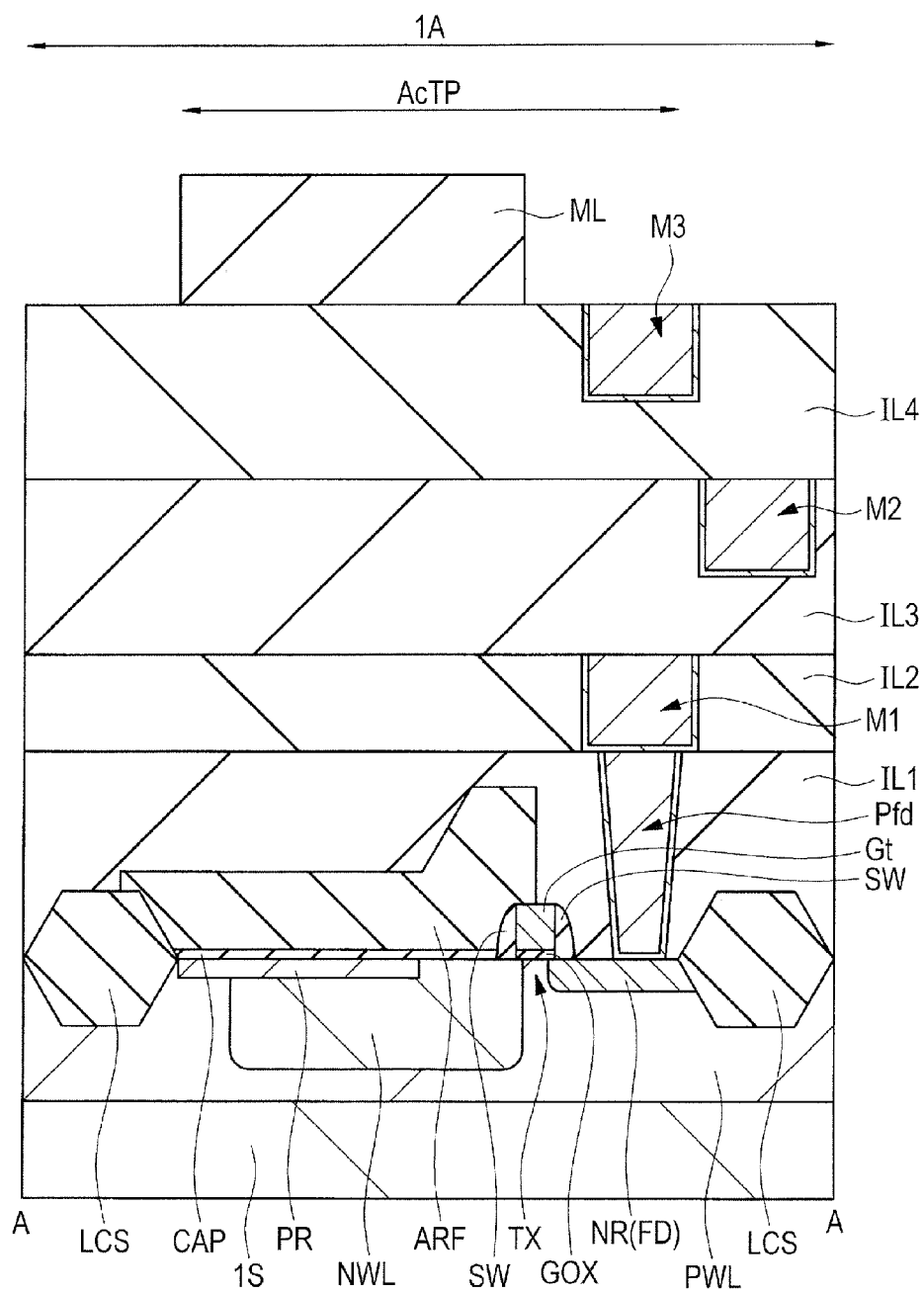
FIG. 7 is a cross-sectional view showing the configuration of the semiconductor device of Embodiment 1.

As shown in FIG. 7, in the active region AcTP of each of the pixel regions 1A of the semiconductor substrate 1S, the photodiode PD (see FIG. 3) including a p-type well PWL and an n-type well NWL and the transfer transistor TX are formed. As shown in FIG. 8, in the active region AcL of each of the peripheral circuit regions 2A of the semiconductor substrate 1S, the transistor LT is formed.

The semiconductor substrate 1S is formed of single-crystal silicon containing an n-type impurity (donor) such as, e.g., phosphorus (P) or arsenic (As). Around the outer periphery of the active region AcTP, an isolation region LCS is placed. Thus, the exposed region of the semiconductor substrate 1S surrounded by the isolation region LCS serves as an active region such as the active region AcTP, the active region AcL, or the like.

In each of the active regions AcTP and AcL, the p-type well PWL as a semiconductor region in which a p-type impurity such as boron (B) has been introduced is formed.

As shown in FIG. 7, in the active region AcTP, the n-type well NWL as a semiconductor region in which an n-type impurity such as phosphorus (P) or arsenic (As) has been introduced is formed so as to be included in the p-type well PWL. The p-type well PWL and the n-type well NWL form the photodiode.

In a part of the top surface of the n-type well NWL, $p^+$-type semiconductor region PR is formed. The $p^+$-type semiconductor region PR is formed so as to suppress the generation of electrons based on a large number of interface states formed in the top surface of the semiconductor substrate 1S. That is, in the top surface region of the semiconductor substrate 1S, under the influence of the interface states, electrons are generated even in a state without illumination with light, which may cause an increase in dark current. To prevent this, in the top surface of the n-type well NWL having electrons as majority carriers, the $p^+$-type semiconductor region PR having holes as majority carriers is formed to be able to suppress the generation of electrons in the state without illumination with light and suppress an increase in dark current.

In addition, the gate electrode Gt is formed so as to two-dimensionally overlap a part of the n-type well NWL. The gate electrode Gt is placed over the semiconductor substrate 1S via a gate insulating film GOX and, over the both side walls thereof, sidewalls SW as side-wall insulating films are formed.

On one side (opposite to the photodiode) of the gate electrode Gt, the n-type higher-concentration semiconductor region NR is formed in which an n-type impurity such as, e.g., phosphorus (P) or arsenic (As) has been introduced. The n-type higher-concentration semiconductor region NR is a semiconductor region as the floating diffusion FD and also serves as the drain region of the transfer transistor TX.

Over the top surface of the photodiode PD (see FIG. 3), i.e., over the top surfaces of the n-type well NWL and the $p^+$-type semiconductor region PR, a cap insulating film CAP is formed. The cap insulating film CAP is formed so as to hold the surface property of the semiconductor substrate 1S, i.e., the interface property thereof excellent. Over the cap insulating film CAP, an anti-reflection film ARF is formed. That is, the anti-reflection film ARF is formed over the n-type well NWL.

On the other hand, as shown in FIG. 8, over the p-type well PWL in the active region AcL, the gate electrode Glt is formed via the gate insulating film GOX and, over the both side walls thereof, the sidewalls SW are formed. Also, in the p-type well PWL on both sides of the gate electrode Glt having the sidewalls SW formed over the both side walls thereof, source/drain regions are formed. Each of the source/drain regions has a LDD (Lightly Doped Drain) structure and includes an n-type lower-concentration semiconductor region NM, i.e., $n^-$-type semiconductor region NM and the n-type higher-concentration semiconductor region NR, i.e., $n^+$-type semiconductor region NR. In the top surface of the n-type higher-concentration semiconductor region NR, a silicide layer SIL formed of a metal silicide such as, e.g., nickel silicide is formed. That is, in the upper portion of the n-type higher-concentration semiconductor region NR, the silicide layer SIL is formed.

Note that, in the top surface of the n-type higher-concentration semiconductor region NR as the floating diffusion FD, no silicide layer is formed. That is, in the upper portion of the floating diffusion FD, no silicide layer is formed.

In the pixel region 1A, an interlayer insulating film IL1 is formed so as to cover the semiconductor substrate 1S including the upper surfaces of the gate electrode Gt and the anti-reflection film ARF. The plug Pfd is formed so as to extend through the interlayer insulating film IL1 and reach the n-type higher-concentration semiconductor region NR as the floating diffusion FD. On the other hand, in the peripheral circuit region 2A, the interlayer insulating film IL1 is formed so as to cover the semiconductor substrate 1S including the gate electrode Glt. The plugs Pt1 and Pt2 are formed so as to extend through the interlayer insulating film IL1 and reach the top surfaces of the n-type higher-concentration semiconductor regions NR, i.e., the silicide layers SIL formed in the upper portions thereof.

The interlayer insulating film IL1 is formed of a silicon oxide film made from, e.g., TEOS (Tetra Ethyl Ortho Silicate) as a raw material. The plugs Pfd, Pt1, and Pt2 are formed by filling the contact holes formed in the interlayer insulating film IL1 with a barrier conductor film including, e.g., a titanium film and a titanium nitride film formed over the titanium film, i.e., a titanium/titanium nitride film and with a tungsten film formed over the barrier conductor film.

Note that plugs not shown in FIGS. 7 and 8 are also formed in the interlayer insulating film IL1. The reset transistor RST, the selection transistor SEL, and the amplification transistor AMI also have gate electrodes formed over the p-type well PWL via gate insulating films and source/drain regions formed in the p-type well PWL on both sides of the gate electrode, though not shown in FIGS. 7 and 8 (see FIG. 3). Since the selection transistor-SEL and the amplification transistor AMI are coupled in series, either one of the source/drain regions thereof is shared therebetween (see FIG. 3).

In the pixel region 1A and the peripheral circuit region 2A, over the interlayer insulating film IL1 formed with the plugs Pfd, Pt1, and Pt2, e.g., an interlayer insulating film IL2 is formed and the interconnects M1 are formed in the interlayer insulating film IL2. The interlayer insulating film IL2 is formed of, e.g., a silicon oxide film, but is not limited thereto. The interlayer insulating film IL2 can also be formed of a low-dielectric-constant film having a dielectric constant lower than that of the silicon oxide film. Examples of the low-dielectric-constant film include a SiOC film. The interconnects M1 are formed of, e.g., copper wires and can be formed using a damascene method. Note that the interconnects M1 are not limited to the copper wires and can also be formed of aluminum wires.

Over the interlayer insulating film IL2 formed with the wires M1, an interlayer insulating film IL3 formed of, e.g., silicon oxide film or a low-dielectric-constant film is formed. In the interlayer insulating film IL3, interconnects M2 are formed. Over the interlayer insulating film IL3 formed with the interconnects M2, an interlayer insulating film IL4 is formed. In the interlayer insulating film IL4, interconnects M3 are formed. The interconnects M1 to M3 form the interconnect layers. The interconnects M1 to M3 are formed so as not to two-dimensionally overlap the photodiode. This is for preventing light incident on the photodiode from being interrupted by the interconnects M1 to M3.

Over the interlayer insulating film IL4 formed with the interconnects M3, a microlens ML is further mounted. Note that, between the microlens ML and the interlayer insulating film IL4, a color filter may also be provided.

In FIG. 7, when the pixel PU (see FIG. 1) is illuminated with light, the incident light passes first through the microlens ML. Then, after passing through the interlayer insulating films IL4 to IL1 which are transparent with respect to visible light, the incident light is incident on the anti-reflection film ARF. The anti-reflection film ARF suppresses the reflection of the incident light so that the incident light in a sufficient amount is incident on the photodiode. In the photodiode, the energy of the incident light is larger than that of the band gap of silicon so that the incident light is absorbed therein by photoelectrical conversion to generate hole-electron pairs. The electrons generated at this time are stored in the n-type well NWL. Then, with a proper timing, the transfer transistor TX is turned ON. Specifically, to the gate electrode of the transfer transistor TX, a voltage of not less than the threshold voltage thereof is applied. Consequently, the channel region thereof is formed in a channel formation region immediately under the gate insulating film to provide electrical conduction between the n-type well NWL as the source region of the transfer transistor TX and the n-type higher-concentration semiconductor region NR as the drain region of the transfer transistor TX. As a result, the electrons stored in the n-type well NWL pass through the channel region, reach the drain region, and travel through the drain region and the interconnect layers to be retrieved into an external circuit.

Figure 9:
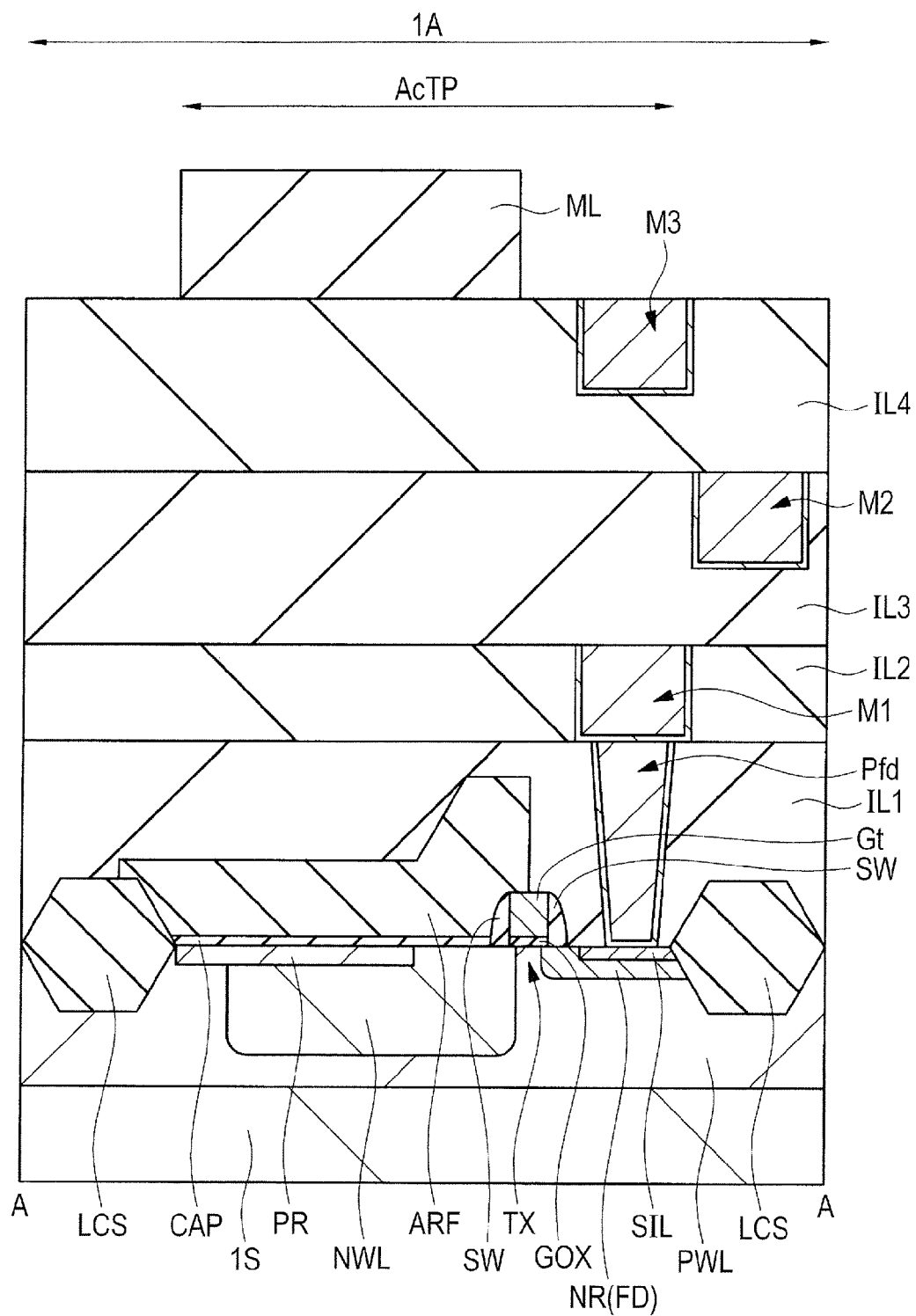
FIG. 9 is a cross-sectional view showing another configuration of the semiconductor device of Embodiment 1.

Thus, the device structure of the pixel PU (see FIG. 1) is formed. However, Embodiment 1 aims at providing not only the device structure shown in FIG. 7, but also the device structure shown in FIG. 9. FIG. 9 is a cross-sectional view showing another configuration of the semiconductor device of Embodiment 1. FIG. 9 corresponds to a cross section along the line A-A in FIG. 3.

The device structure of FIG. 7 and the device structure of FIG. 9 have substantially the same configuration, but are different in the following point. That is, in the top surface, i.e., upper portion of the n-type higher-concentration semiconductor region NR as the drain layer of the transfer transistor, the silicide layer SIL is formed. Accordingly, in the device structure shown in FIG. 9, the coupling resistance between the n-type higher-concentration semiconductor region NR and the plug Pfd can be reduced. Note that the silicide layer SIL can be formed of, e.g., a nickel platinum silicide layer, a nickel silicide layer, a titanium silicide layer, a cobalt silicide layer, a platinum silicide layer, or the like.

<Manufacturing Method of Semiconductor Device>

Next, a description will be given of a manufacturing method of the semiconductor device of Embodiment 1.

Figure 10:
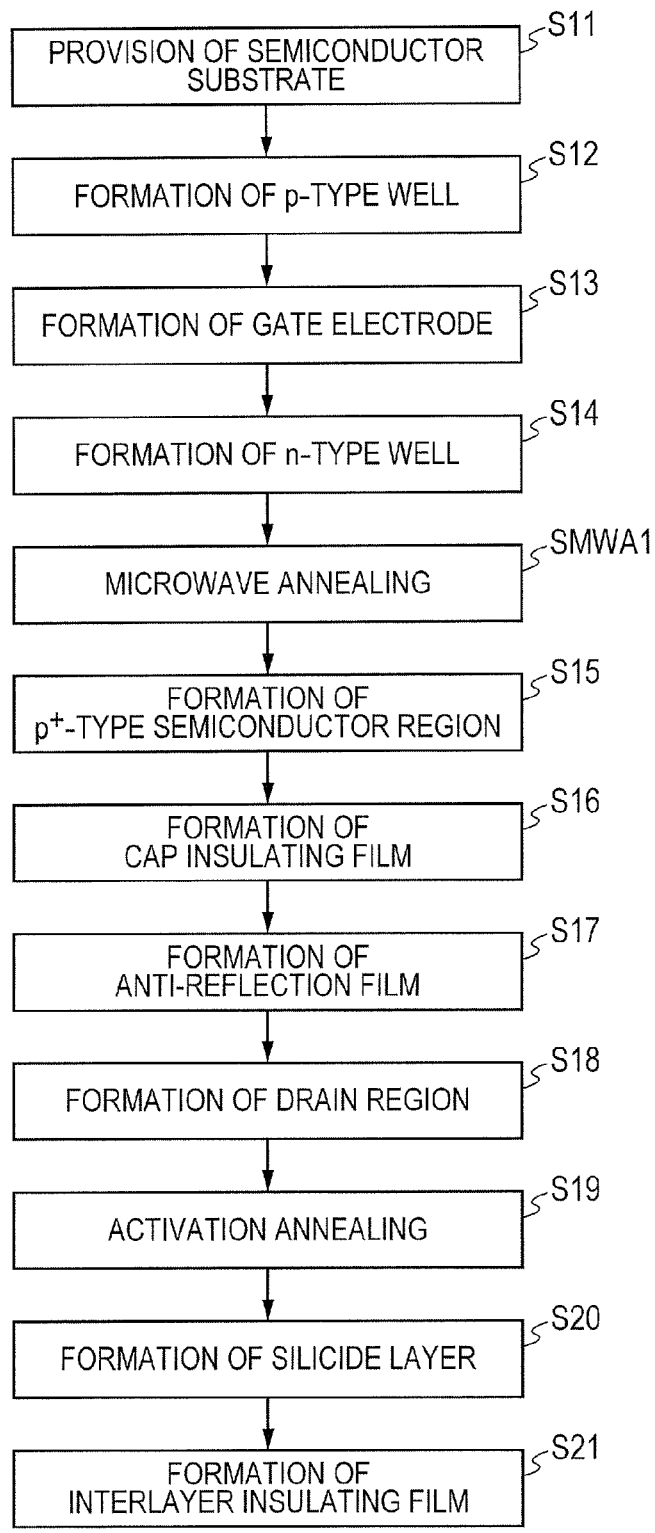
FIG. 10 is a process flow chart showing a part of a manufacturing process of the semiconductor device Embodiment 1.

FIG. 10 is a process flow chart showing a part of the manufacturing process of the semiconductor device of Embodiment 1. FIGS. 11 to 38 are cross-sectional views each showing the manufacturing process of the semiconductor device of Embodiment 1. FIG. 10 mainly shows, of the manufacturing process of the semiconductor device of Embodiment 1, the manufacturing process in the pixel region 1A. Each of the cross-sectional views of FIGS. 11 to 38 corresponds to a cross section along the line A-A in FIG. 3 or a cross section along the line B-B in FIG. 6.

Figure 11:
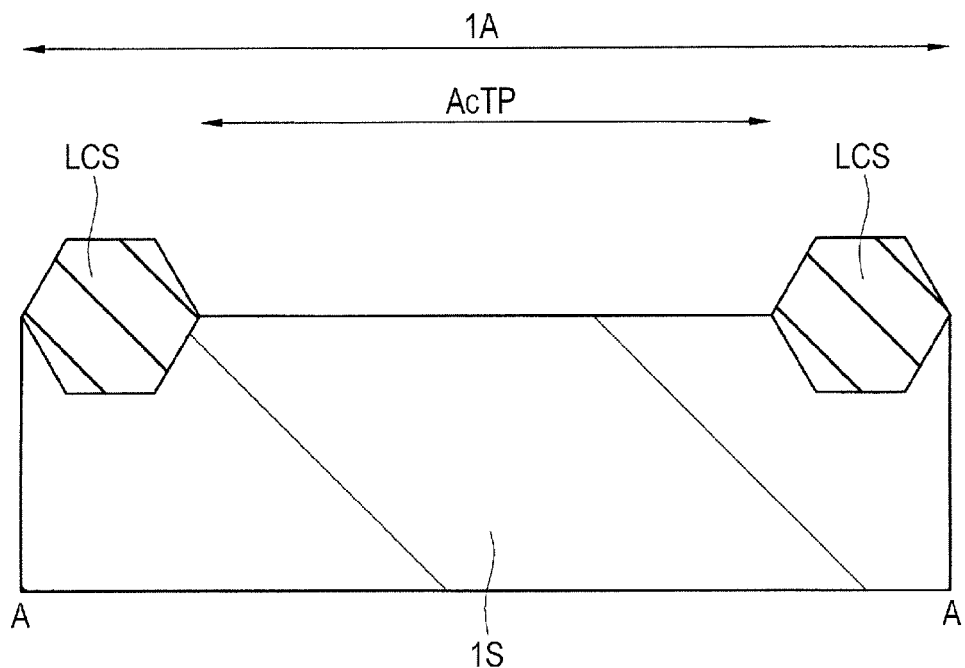
FIG. 11 is a cross-sectional view showing the manufacturing process of the semiconductor device Embodiment 1.
Figure 12:
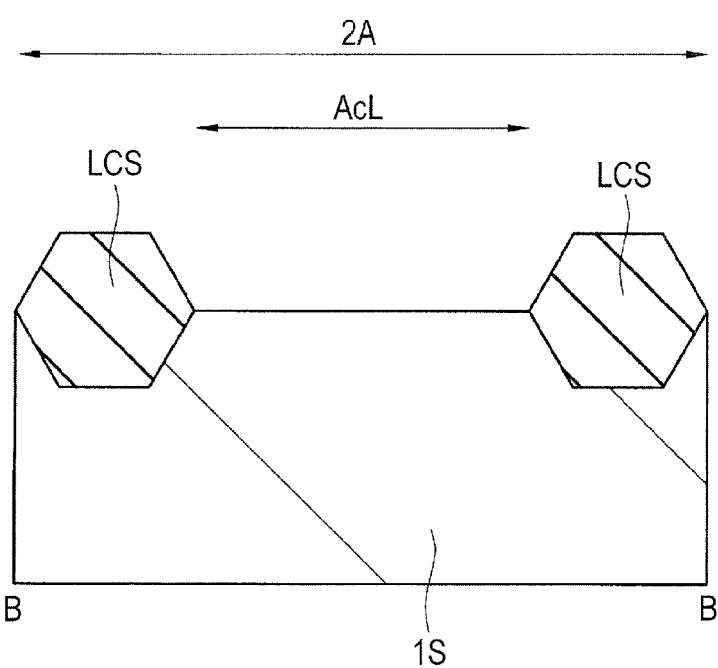
FIG. 12 is a cross-sectional view showing the manufacturing process of the semiconductor device of Embodiment 1.

As shown in FIGS. 11 and 12, as the semiconductor substrate 1S, an n-type single-crystal silicon substrate containing an n-type impurity such as, e.g., phosphorus (P) or arsenic (As) is provided (Step S11 in FIG. 10).

Then, in the semiconductor substrate 1S, the isolation region LCS is formed. The isolation region LCS is formed of a thermal oxidation film. For example, the regions of the semiconductor substrate 1S which serve as the active regions such as the active regions AcTP, AcL, and the like are covered with a silicon nitride film and subjected to thermal oxidation to form the isolation region LCS formed of an insulating member such as a silicon oxide film. Such an isolation method is referred to as a LOCOS (Local oxidation of silicon)

method. By the isolation region LCS, the active regions such as the active regions AcTP, AcL, and the like are defined, i.e., formed.

Note that the active region AcTP is formed in the pixel region 1A and the active region AcL is formed in the peripheral circuit region 2A.

Instead of the LOCOS method, a STI (Shallow Trench Isolation) method may also be used to form the isolation region. In this case, the isolation region is formed of an insulating member embedded in a trench in the semiconductor substrate 1S. For example, by etching the semiconductor substrate 1S using the foregoing silicon nitride film as a mask, the isolation trench is formed. Then, by embedding an insulating film such as a silicon oxide film in the isolation trench, the isolation region is formed.

Figure 13:
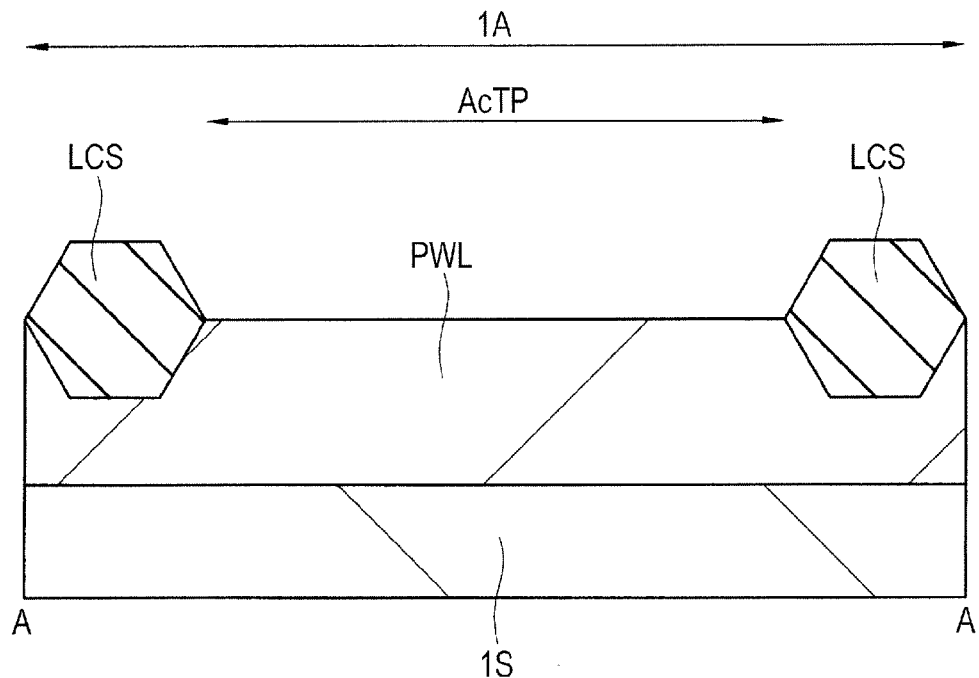
FIG. 13 is a cross-sectional view showing the manufacturing process of the semiconductor device of Embodiment 1.
Figure 14:
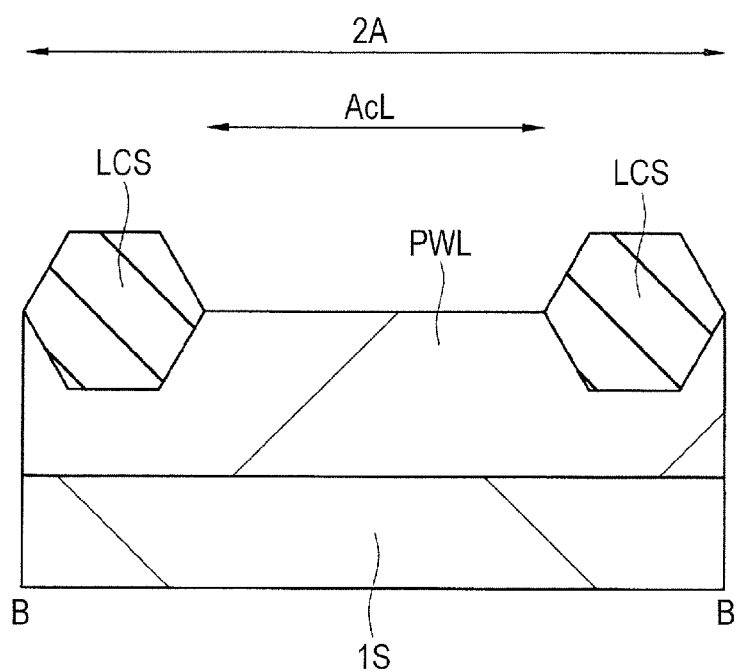
FIG. 14 is a cross-sectional view showing the manufacturing process of the semiconductor device of Embodiment 1.

Next, as shown in FIGS. 13 and 14, the p-type well PWL forming the photodiode is formed in the pixel region 1A and the p-type well PWL is formed in the peripheral circuit region 2A (Step S12 in FIG. 10).

In Step S12, by using a photolithographic technique and an ion implantation method, in the active region AcTP and the active region AcL, a p-type impurity such as boron (B) is introduced into the semiconductor substrate 1S. Thus, in the pixel region 1A and the peripheral circuit region 2A, the p-type wells PWL are formed. The conductivity type of each of the p-type wells PWL is a p-type, which is opposite to the n-type as the conductivity type of the semiconductor substrate 1S.

Figure 15:
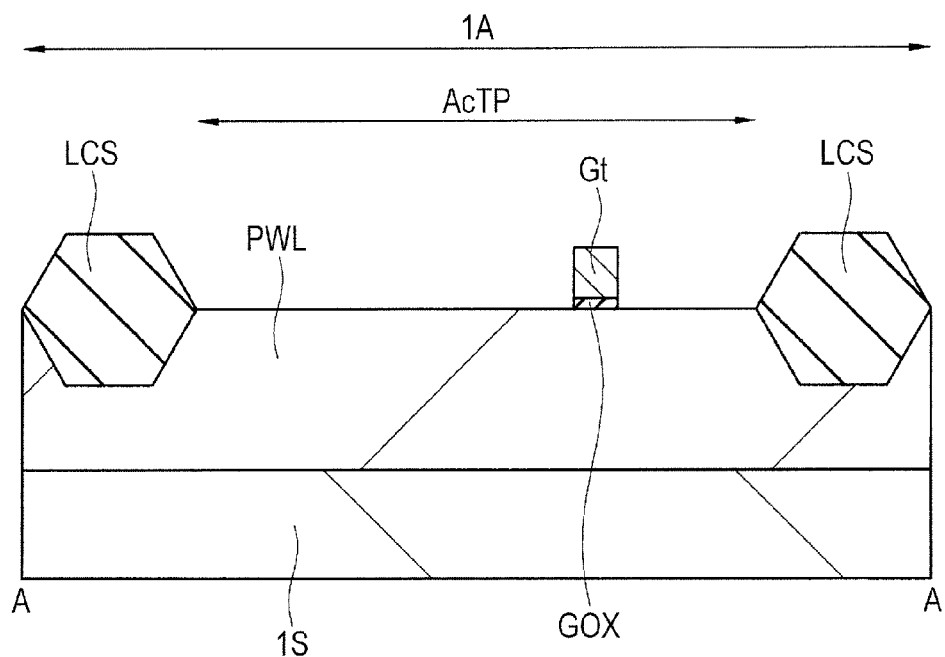
FIG. 15 is a cross-sectional view showing the manufacturing process of the semiconductor device of Embodiment 1.
Figure 16:
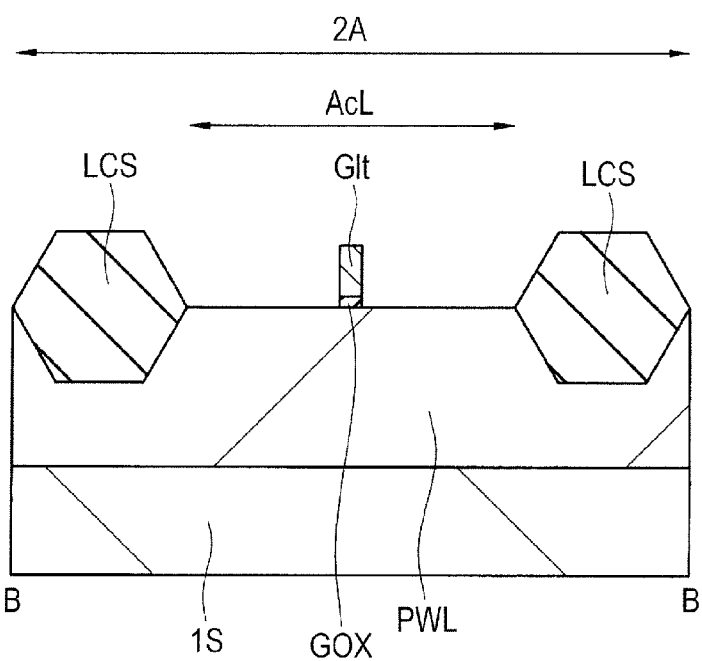
FIG. 16 is a cross-sectional view showing the manufacturing process of the semiconductor device of Embodiment 1.

Next, as shown in FIGS. 15 and 16, in the pixel region 1A, the gate electrode Gt is formed via the gate insulating film GOX and, in the peripheral circuit region 2A, the gate electrode Glt is formed via the gate insulating film GOX (Step S13 in FIG. 10).

First, in the pixel region 1A and the peripheral circuit region 2A, by thermally oxidizing the semiconductor substrate 1S, the gate insulating film GOX formed of a silicon oxide film is formed over the top surface of the p-type well PWL. As the gate insulating film GOX, a silicon nitride film, a silicon oxynitride film, or the like may also be used. Alternatively, a so-called high dielectric film having a dielectric constant higher than that of the silicon nitride film, such as a hafnium-based insulating film obtained by introducing a lanthanum oxide into a hafnium oxide, may also be used. These films can be formed using, e.g., a CVD (Chemical Vapor Deposition) method.

Next, over the semiconductor substrate 1S including the gate insulating film GOX, e.g., a polysilicon film is formed as a conductor film using a CVD method or the like. Next, the conductor film is patterned. Specifically, over the conductor film, a photoresist film (illustration thereof is omitted) is formed and subjected to exposure/development using a photolithographic technique to be left in the regions where the gate electrodes Gt and Glt are to be formed. Then, using the photoresist film as a mask, the conductor film and the silicon oxide film are etched. In this manner, in the pixel region 1A, the gate electrode Gt formed of the conductor film is formed via the gate insulating film GOX formed of a silicon oxide film and, in the peripheral circuit region 2A, the gate electrode Glt formed of the conductor film is formed via the gate insulating film GOX formed of the silicon oxide film. Then, the photoresist film is removed by ashing or the like. Such a process from the formation of the photoresist film to the removal thereof is referred to as patterning. At this time, the gate electrodes Gr, Gs, and Ga of the other transistors shown in, e.g., FIG. 3, i.e., the reset transistor RST, the selection transistor SEL, and the amplification transistor AMI may also be formed.

Note that the process in Step S13 can be performed at any time after the p-type well PWL is formed by performing Step S12 and before Step S18 described later is performed.

Figure 17:
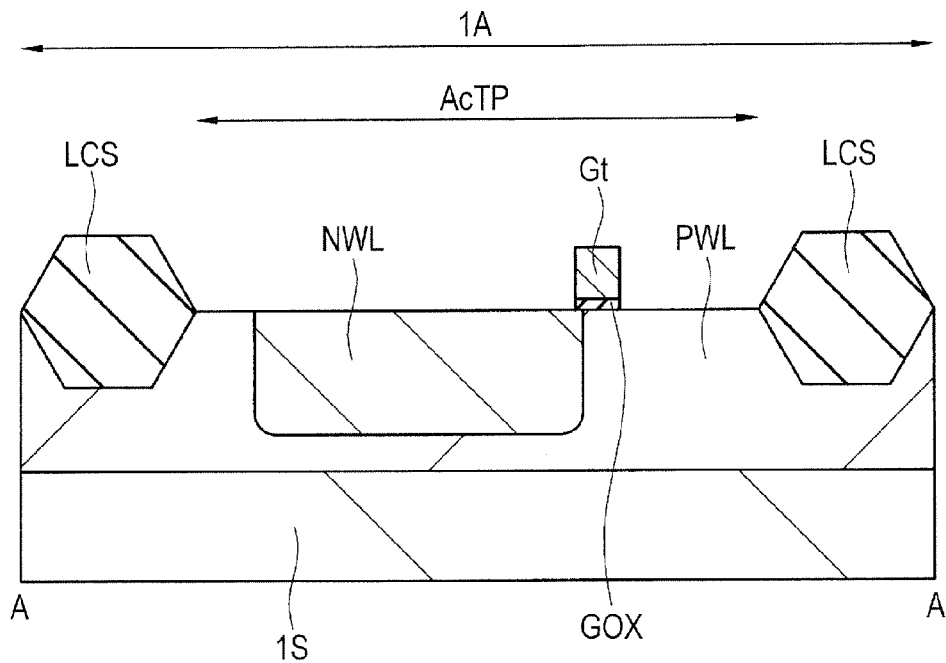
FIG. 17 is a cross-sectional view showing the manufacturing process of the semiconductor device of Embodiment 1.
Figure 18:
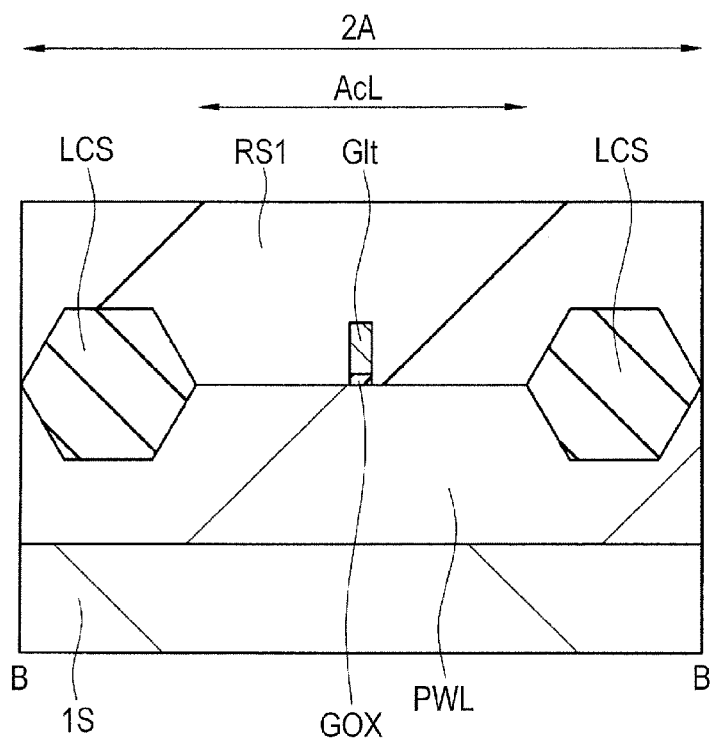
FIG. 18 is a cross-sectional view showing the manufacturing process of the semiconductor device of Embodiment 1.

Next, as shown in FIGS. 17 and 18, in the pixel region 1A, the n-type well NWL forming the photodiode is formed so as to be included in the p-type well PWL on one side (left-hand side in FIG. 17) of the gate electrode Gt (Step S14 in FIG. 10).

For example, using a photoresist film (illustration thereof is omitted) having an opening corresponding to one of both sides of the gate electrode Gt as a mask, an n-type impurity is ion-implanted. Thus, as shown in FIG. 17, the n-type well NWL included in the p-type well PWL is formed. Of the p-type well PWL and the n-type well NWL, the photodiode is formed. A part of the n-type well NWL is formed so as to overlap the gate electrode Gt of the transfer transistor in planar view. By thus causing the part of the n-type well NWL to overlap the gate electrode Gt of the transfer transistor, the n-type well NWL is allowed to function also as the source region of the transfer transistor.

Note that, in the process in Step S14, as shown in FIG. 18, in the peripheral circuit region 2A, e.g., a resist film PS1 is formed over the semiconductor substrate 1S including the top surface of the gate electrode Glt.

Figure 19:
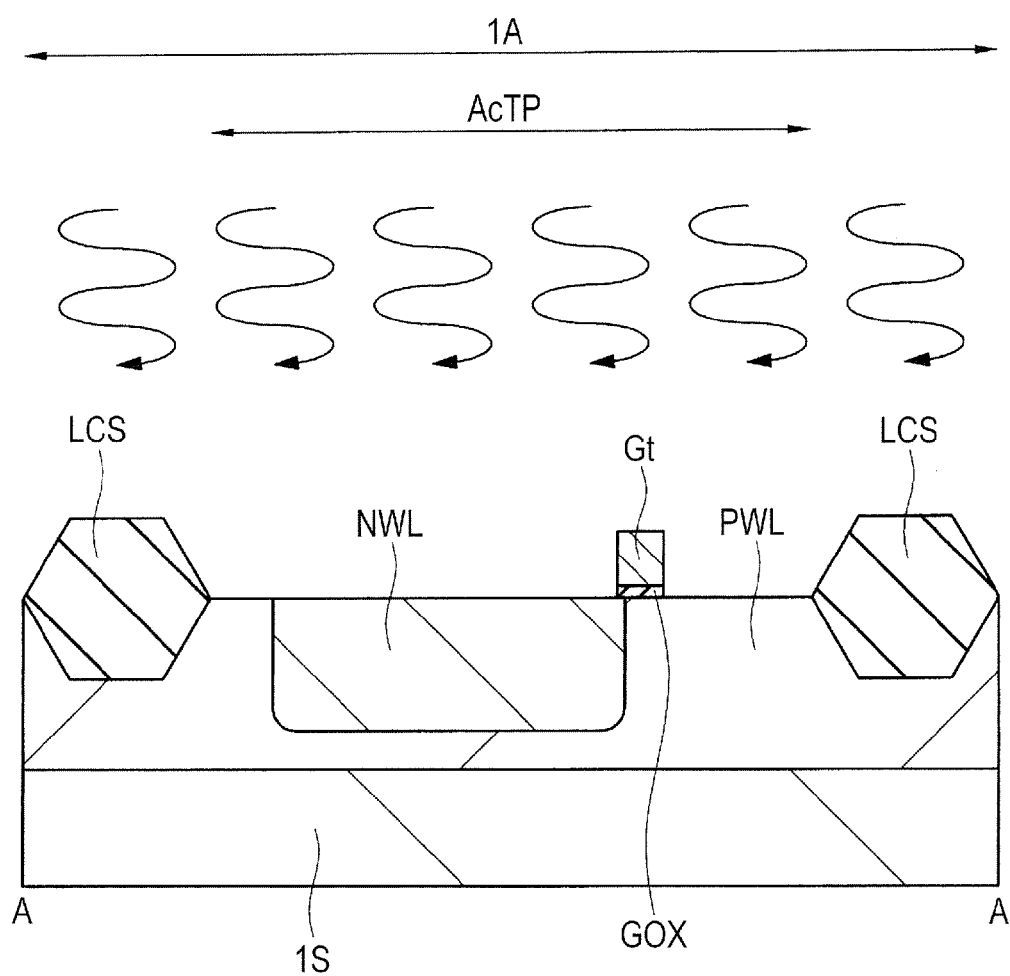
FIG. 19 is a cross-sectional view showing the manufacturing process of the semiconductor device of Embodiment 1.

Next, as shown in FIG. 19, microwave annealing is performed (Step SMWA1 in FIG. 10). For example, by applying a microwave at a frequency which allows the microwave to be resonantly absorbed by a silicon crystal, e.g., 5.8 GHz to the semiconductor substrate 1S from the top surface or back surface thereof, the microwave is resonantly absorbed by the silicon crystal forming the semiconductor substrate 1S to directly induce the lattice vibration of the silicon crystal and thus heat the semiconductor substrate 1S. Specifically, the microwave can be applied with a power of, e.g., about 2 to 10 kW for about 5 to 30 minutes.

When the n-type well NWL is formed in the process in Step S14, an ion implantation method is used so that a large number of crystal defects are formed in the n-type well NWL including a deep region in the semiconductor substrate 1S. On the other hand, by performing the microwave annealing, the lattice vibration of the silicon crystal can be directly induced. This allows the silicon crystal in the semiconductor substrate 1S including the deep region therein to be uniformly heated. As a result, even when the crystal defects formed in the n-type well NWL are formed in a region at a depth of, e.g., 500 nm to several micrometers from the top surface of the semiconductor substrate, the crystal defects formed in the n-type well NWL can be cured.

As will be described later using FIG. 46, the microwave can be applied preferably with a power of, e.g., about 5 to 10 kW for about 15 to 30 minutes. This allows the crystal defects formed in the n-type well NWL to be more efficiently cured.

Also, with the microwave annealing, a high temperature need not be achieved to cure the crystal defects formed in the deep region in the semiconductor substrate 1S. Accordingly, it is possible to prevent or suppress impurity diffusion in the peripheral circuit region 2A. Therefore, with the microwave annealing, it is possible to prevent or suppress the degradation of the characteristics of the MISFETs formed in the peripheral circuit region 2A.

Figure 20:
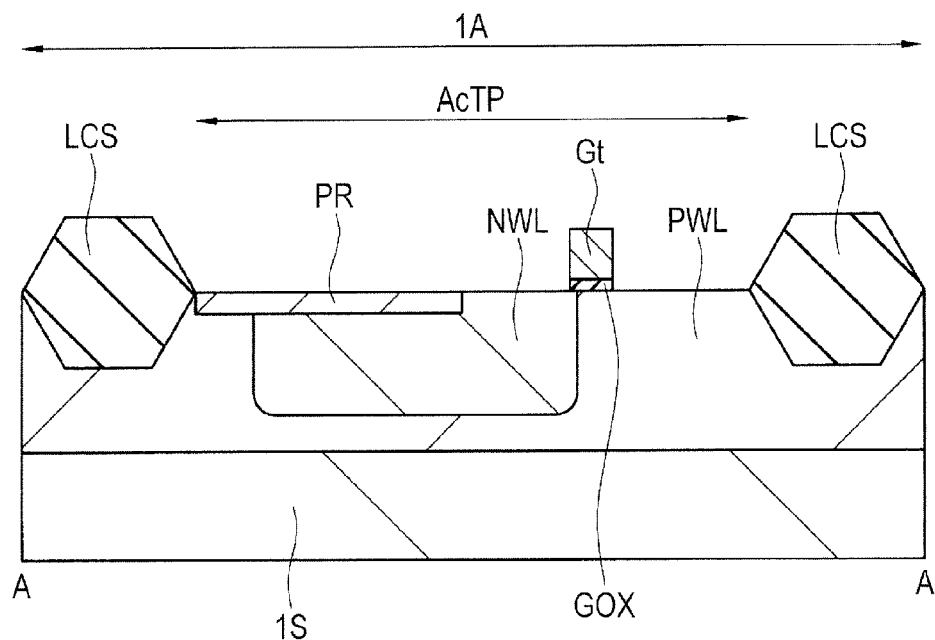
FIG. 20 is a cross-sectional view showing the manufacturing process of the semiconductor device of Embodiment 1.
Figure 21:
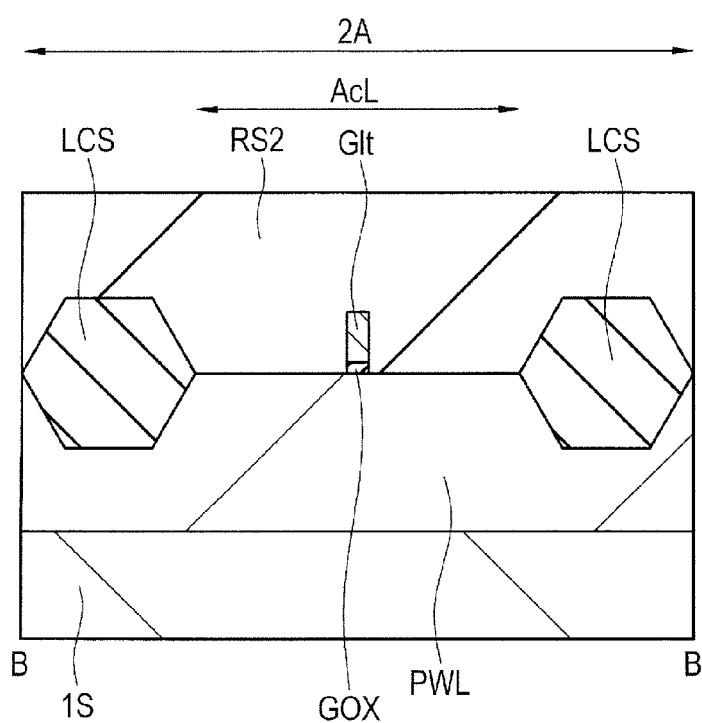
FIG. 21 is a cross-sectional view showing the manufacturing process of the semiconductor device of Embodiment 1.

Next, as shown in FIGS. 20 and 21, in the pixel region 1A, the $p^+$-type semiconductor region PR is formed in the top surface region of the n-type well NWL (S15 in FIG. 10). For example, by using a photolithographic method and an ion implantation method, p-type impurity ions are implanted into the top surface region of the n-type well NWL. Thus, as shown in FIG. 20, in the top surface region of the n-type well NWL, the $p^+$-type semiconductor region PR is formed.

Note that, in the process in Step S15, as shown in FIG. 21, in the peripheral circuit region 2A, e.g., a photoresist film RS2 is formed over the semiconductor substrate 1S including the top surface of the gate electrode Glt. That is, in the peripheral circuit region 2A, the p-type well PWL is covered with, e.g., the resist film RS2 such that the p-type impurity ions are not implanted therein.

When, e.g., furnace annealing using an annealing furnace is performed instead of the microwave annealing, the problem of the occurrence of variations in the characteristics of the peripheral circuit or the like arises. On the other hand, when the microwave annealing is performed, the temperature is low, impurity diffusion in the peripheral circuit is suppressed, and there is no characteristic variation. As will be described later using FIG. 53, when, e.g., the microwave annealing is performed and then the furnace annealing using the annealing furnace performed at the time of, e.g., activation annealing is performed, it is possible to suppress the occurrence of dislocation in the crystal lattice of silicon. As a result, not only crystal defects are cured by the microwave annealing, but also crystal defects formed in the n-type well NWL can be more efficiently cured, while the occurrence of the dislocation in the crystal lattice of silicon is suppressed.

Figure 22:
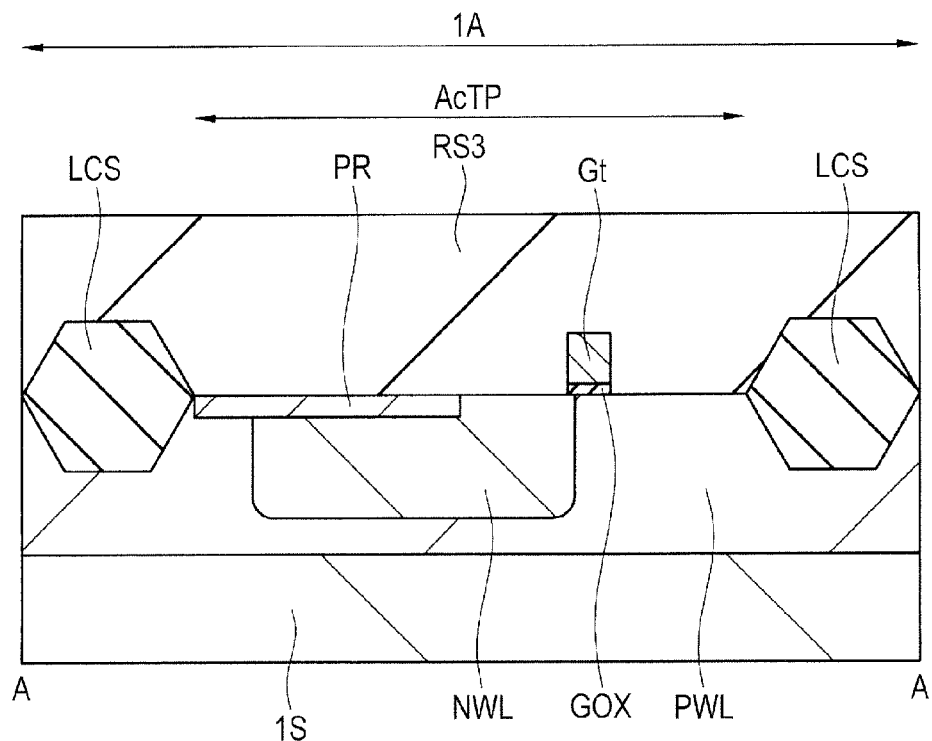
FIG. 22 is a cross-sectional view showing the manufacturing process of the semiconductor device of Embodiment 1.
Figure 23:
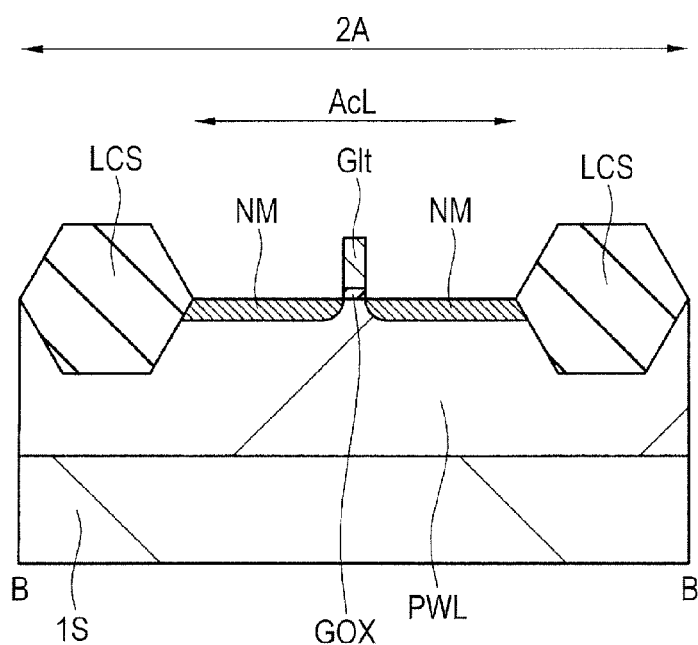
FIG. 23 is a cross-sectional view showing the manufacturing process of the semiconductor device of Embodiment 1.

Next, as shown in FIGS. 22 and 23, in the peripheral circuit region 2A, the n-type lower-concentration semiconductor regions NW are formed in the p-type well PWL on both sides of the gate electrode Glt. For example, using a photoresist film (illustration thereof is omitted) having an opening corresponding to the peripheral circuit region 2A and the gate electrode Glt as a mask, n-type impurity ions are implanted. Thus, in the p-type well PW on both sides of the gate electrode Glt, the n-type lower-concentration semiconductor regions NM are formed.

Note that, in the step of forming the n-type lower-concentration semiconductor regions NM, as shown in FIG. 22, e.g., a resist film RS3 is formed over the semiconductor substrate 1S including the top surface of the gate electrode Gt in the pixel region 1A. That is, in the pixel region 1A, the p-type well PWL, the n-type well NWL, and the p$^+$-type semiconductor region PR3 are covered with, e.g., the resist film RS such that the n-type impurity ions are not implanted therein.

Figure 24:
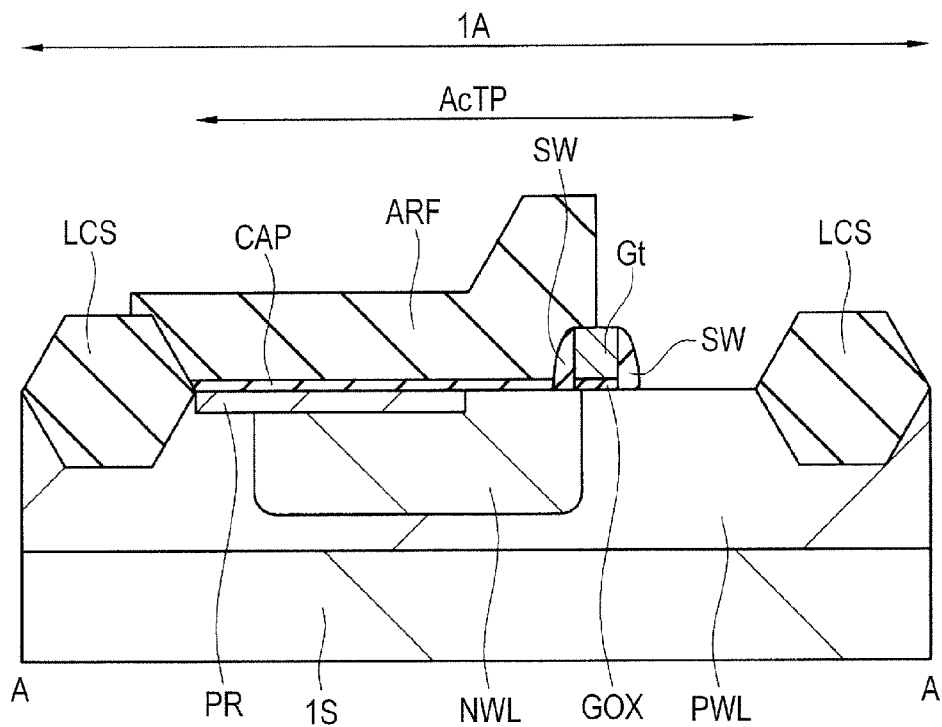
FIG. 24 is a cross-sectional view showing the manufacturing process of the semiconductor device of Embodiment 1.
Figure 25:
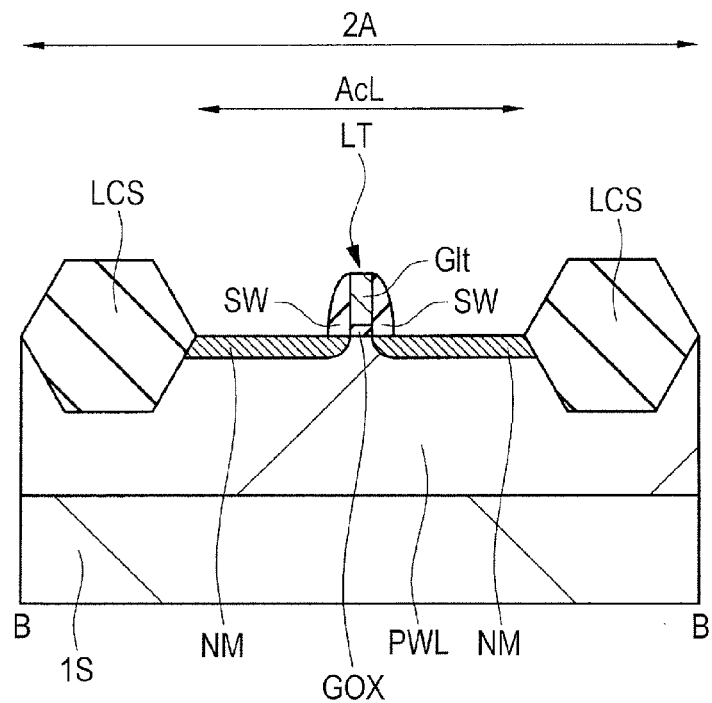
FIG. 25 is a cross-sectional view showing the manufacturing process of the semiconductor device of Embodiment 1.

Next, as shown in FIGS. 24 and 25, in the pixel region 1A, the cap insulating film CAP is formed (Step S16 in FIG. 10).

First, over the side walls of the gate electrodes Gt and Glt, the sidewalls SW each made of an insulating film are formed. For example, over the semiconductor substrate 1S, a silicon oxide film, a silicon nitride film, or a laminate film thereof is deposited as an insulating film using a CVD method or the like, and the insulating film is anisotropically etched using a RIE (Reactive Ion Etching) method or the like. In this manner, it is possible to leave the sidewalls SW each formed of the insulating film over the side walls of the gate electrodes Gt and Glt.

After the sidewalls SW are thus formed, in the pixel region 1A, the cap insulating film CAP is formed. For example, after a silicon oxide film is formed as an insulating film over the semiconductor substrate 1S by a CVD method or the like, the insulating film is patterned. Thus, in the pixel region 1A, over the top surface regions of the n-type well NWL and the p$^+$-type semiconductor region PR each located on one side of the gate electrode Gt, the cap insulating film CAP made of the silicon oxide film is formed. As the insulating film forming the cap insulating film CAP, instead of the silicon oxide film, a silicon nitride film may also be used.

Next, as shown in FIGS. 24 and 25, in the pixel region 1A, the anti-reflection film ARF is formed (Step S17 in FIG. 10).

Over the semiconductor substrate 1S, as the anti-reflection film ARF, e.g., a silicon oxynitride film is formed by a CVD method or the like and then patterned. In this manner, over the cap insulating film CAP on one side of the gate electrode Gt, i.e., over the n-type well NWL on one side of the gate electrode Gt, the anti-reflection film ARF is formed.

Note that the sidewalls SW and the anti-reflection film ARF can also be formed simultaneously. For example, after the deposition of the sidewalls SW, a resist mask is formed only in the photodiode region of the pixel region 1A and anisotropically etched by a RIE method. Thus, in the peripheral circuit region 2A and on the floating diffusion FD (see FIG. 7) side in the pixel region 1A, the sidewalls SW are formed while, on the photodiode side in the pixel region 1A, the anti-reflection film ARF is formed.

Figure 26:
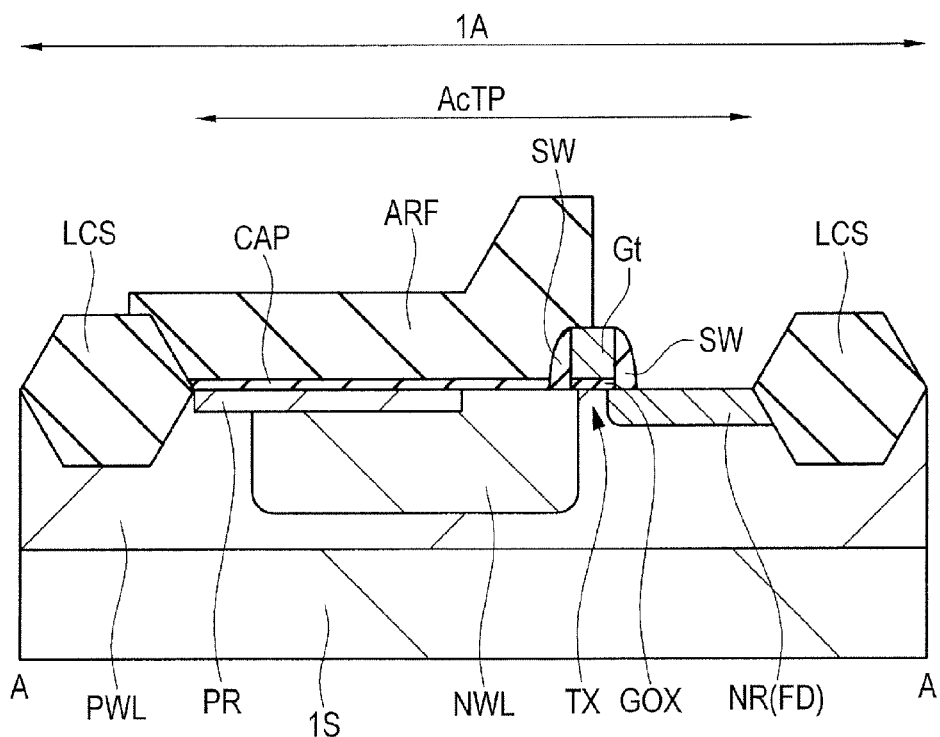
FIG. 26 is a cross-sectional view showing the manufacturing process of the semiconductor device of Embodiment 1.
Figure 27:
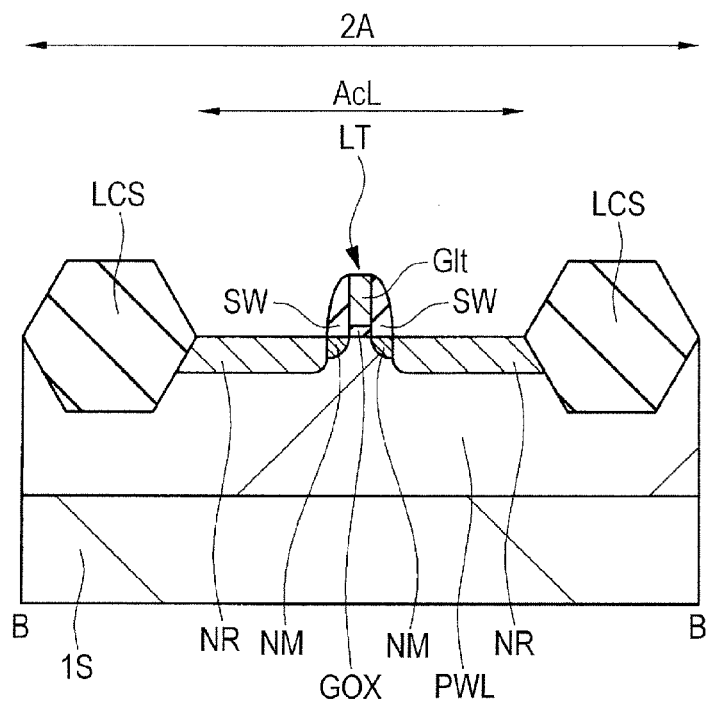
FIG. 27 is a cross-sectional view showing the manufacturing process of the semiconductor device of Embodiment 1.

Next, as shown in FIGS. 26 and 27, in the pixel region 1A, the n-type higher-concentration semiconductor region NR serving as the drain region of the transfer transistor is formed in the p-type well PWL on the other side (right-hand side in FIG. 26) of the gate electrode Gt (Step S18 in FIG. 10). For example, using the anti-reflection film ARF and the gate electrode Gt as a mask, n-type impurity ions are implanted. Thus, as shown in FIG. 26, the n-type higher-concentration semiconductor region NR is formed in the p-type well PWL on the other side (right-hand side in FIG. 26) of the gate electrode Gt of the transfer transistor TX. The n-type higher-concentration semiconductor region NR serves also as the drain region of the transfer transistor TX and as the floating diffusion FD of the photodiode.

In the process in Step S18, in the peripheral circuit region 2A, the n-type higher-concentration semiconductor regions NR are preferably formed in the p-type well PWL on both sides of a composite of the gate electrode Glt and the sidewalls SW. For example, using the gate electrode Glt and the sidewalls SW as a mask, n-type impurity ions are implanted. Thus, as shown in FIG. 27, the source/drain regions of the transistor LT, i.e., source/drain regions each having the LDD structure including the n-type lower-concentration semiconductor region NM and the n-type higher-concentration semiconductor region NR can be formed.

Note that the process in Step S18 may also be used to form the source/drain regions of the other transistors shown in, e.g., FIG. 3, i.e., the reset transistor RST, the selection transistor SEL, and the amplification transistor AMI.

When a p-type MISFET is formed in the peripheral circuit region 2A, in the peripheral circuit region 2A, p-type higher-concentration semiconductor regions serving as the source/drain regions of the p-type MISFET may also be formed. For example, into an n-type well on both sides of the gate electrode of the p-type MISFET not shown in the peripheral circuit region 2A, p-type impurity ions are implanted. As the p-type impurity ions, e.g., boron (B) can be used. At this time, boron may also be ion-implanted into the active region AcG.

Then, to active the impurities implanted in the foregoing process, activation annealing is performed (Step S19 in FIG. 10). Note that the order of implanting the individual impurities is not limited to the order in the foregoing process. Into a plurality of semiconductor regions of the same conductivity type, an impurity can be implanted simultaneously in one step to allow adjustment of the steps of implanting the individual impurities.

Note that, besides the activation annealing in Step S19, annealing at a temperature of not less than 800° C. may also be performed appropriately after the microwave annealing to the extent that the threshold voltage of the peripheral circuit does not vary.

By the foregoing process, in the pixel region 1A of the semiconductor substrate 1S, the photodiode PD (see FIG. 3), the transfer transistor TX, and the other transistors not shown in the cross-sectional views of FIGS. 26 and 27, i.e., the reset transistor RST, the selection transistor SEL, and the amplification transistor AMI are formed (see FIG. 3). Also, in the peripheral circuit region 2A of the semiconductor substrate 1S, the transistor LT as the MISFET is formed (see FIG. 6).

Next, as shown in FIGS. 28 to 31, a silicide layer is formed (Step S20 in FIG. 10).

Figure 28:
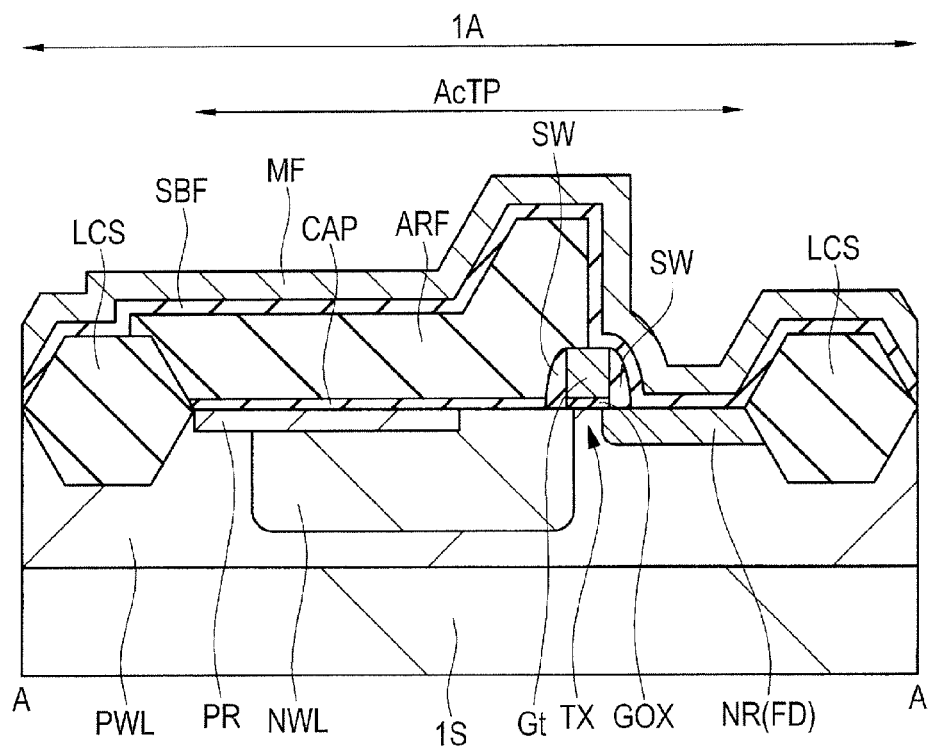
FIG. 28 is a cross-sectional view showing the manufacturing process of the semiconductor device of Embodiment 1.
Figure 29:
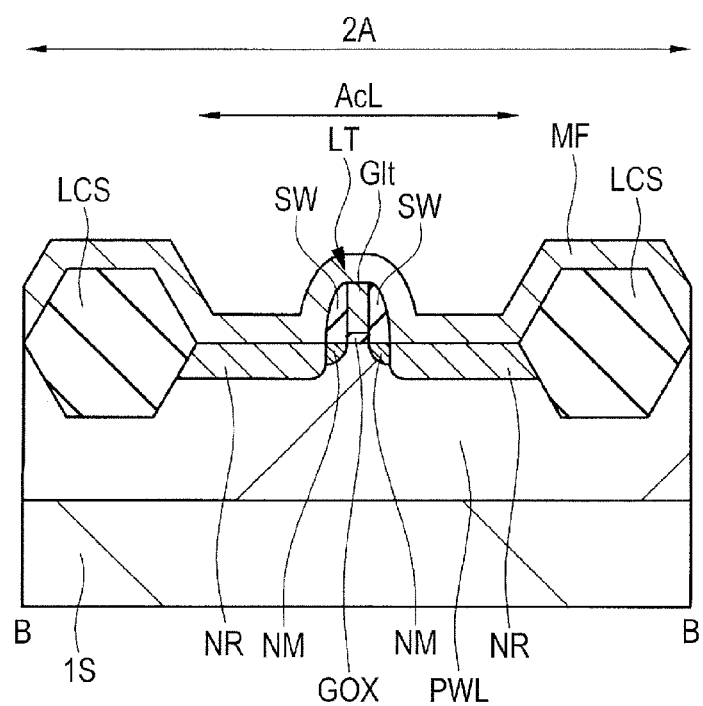
FIG. 29 is a cross-sectional view showing the manufacturing process of the semiconductor device of Embodiment 1.

In the process in Step S20, first, as shown in FIGS. 28 and 29, a silicide blocking film SBF is formed and then a metal film MF is formed. For example, over the semiconductor substrate 1S, a silicon oxide film is formed as an insulating film by a CVD method or the like and then patterned. Thus, in the pixel region 1A of the semiconductor substrate 1S, the silicide blocking film SBF covering the floating diffusion FD, the anti-reflection film ARF, and the gate electrode Gt from above is formed. Besides, in the region where the silicide layer need not be formed, the silicide blocking film SBF is left. On the other hand, in the peripheral circuit region 2A of the semiconductor substrate 1S, the silicide layer SIL (see FIG. 31 described later) is formed in the top surface, i.e., upper portion of each of the higher-concentration semiconductor regions NR as the source/drain regions of the transistor LT. Accordingly, the silicide blocking film SBF covering the transistor LT from above is not formed.

Then, over the semiconductor substrate 1S, as the metal film MF, e.g., a nickel (Ni) film is formed using a puttering method or the like. Besides the nickel film, a metal film such as a titanium (Ti) film, a cobalt (Co) film, or a platinum (Pt) film or an alloy film thereof may also be used.

Figure 30:
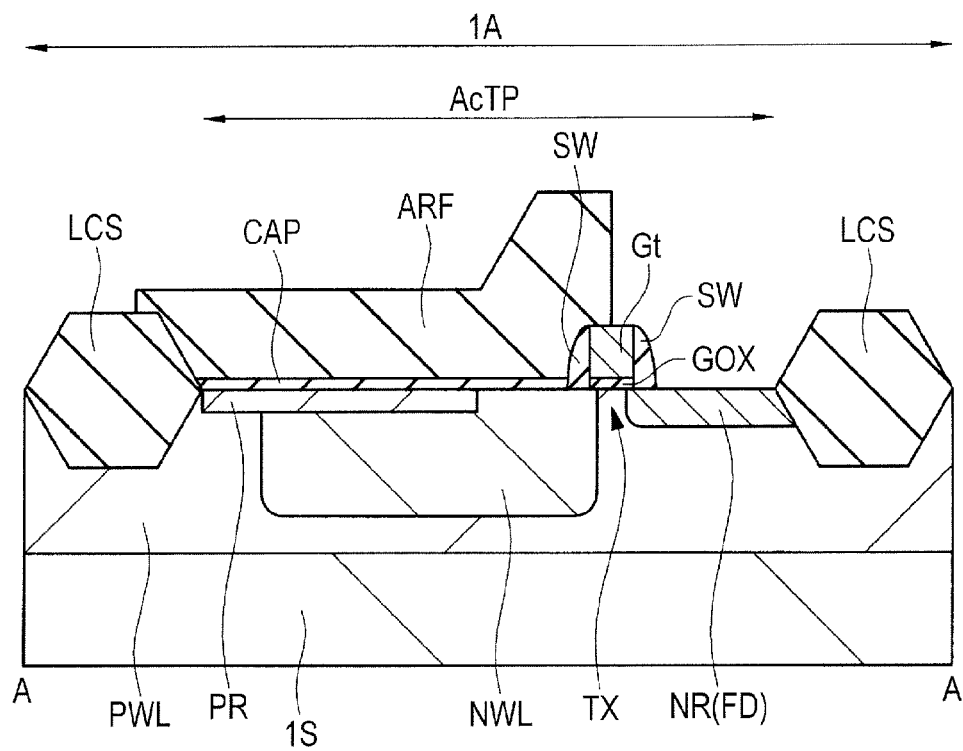
FIG. 30 is a cross-sectional view showing the manufacturing process of the semiconductor device of Embodiment 1.
Figure 31:
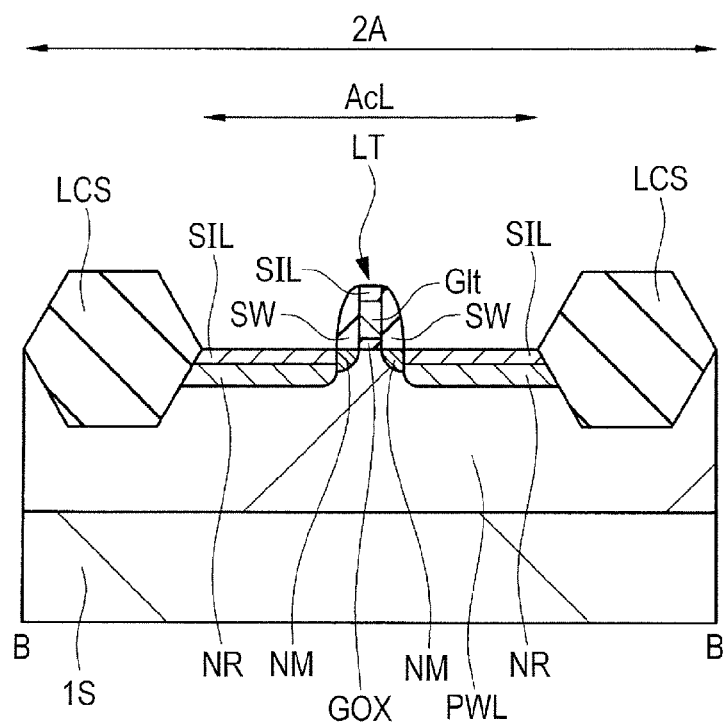
FIG. 31 is a cross-sectional view showing the manufacturing process of the semiconductor device of Embodiment 1.

Then, by subjecting the semiconductor substrate 1S to heat treatment, in the peripheral circuit region 2A of the semiconductor substrate 1S, the metal film MF is caused to react with silicon forming the n-type higher-concentration semiconductor regions NR to form the silicide layers SIL each made of, e.g., a nickel silicide layer, as shown in FIGS. 30 and 31. On the other hand, in the pixel region 1A of the semiconductor substrate 1S, no silicide layer is formed. Thereafter, the unreacted metal film MF is removed. Thus, over the floating diffusion FD of the pixel region 1A, no silicide layer is formed while, over the n-type higher-concentration semiconductor regions NR and the gate electrode Git, the silicide layers SIL are formed.

Note that, at this time, e.g., in the top surfaces, i.e., upper portions of the gate electrodes Gr, Gs, and Ga of the other transistors shown in, e.g., FIG. 3, i.e., the reset transistor RST, the selection transistor SEL, and the amplification transistor AMI and the source/drain regions thereof also, the silicide layers are formed. The silicide layers allow a reduction in the contact resistance between each of the regions and the plug.

The semiconductor substrate 1S provided by performing the foregoing process has the n-type higher-concentration semiconductor region NR formed in the pixel region 1A, made of silicon, and serving as each of the floating diffusion FD and the drain region of the transfer transistor TX. The semiconductor substrate 1S also has the n-type higher-concentration semiconductor regions NR formed in the peripheral circuit region 2A, made of silicon, and serving as the source/drain regions of the transistor LT. The semiconductor substrate 1S also has the silicide layers SIL formed in the top surfaces, i.e., upper portions of the higher-concentration semiconductor regions NR serving as the source/drain regions of the transistor LT.

Figure 32:
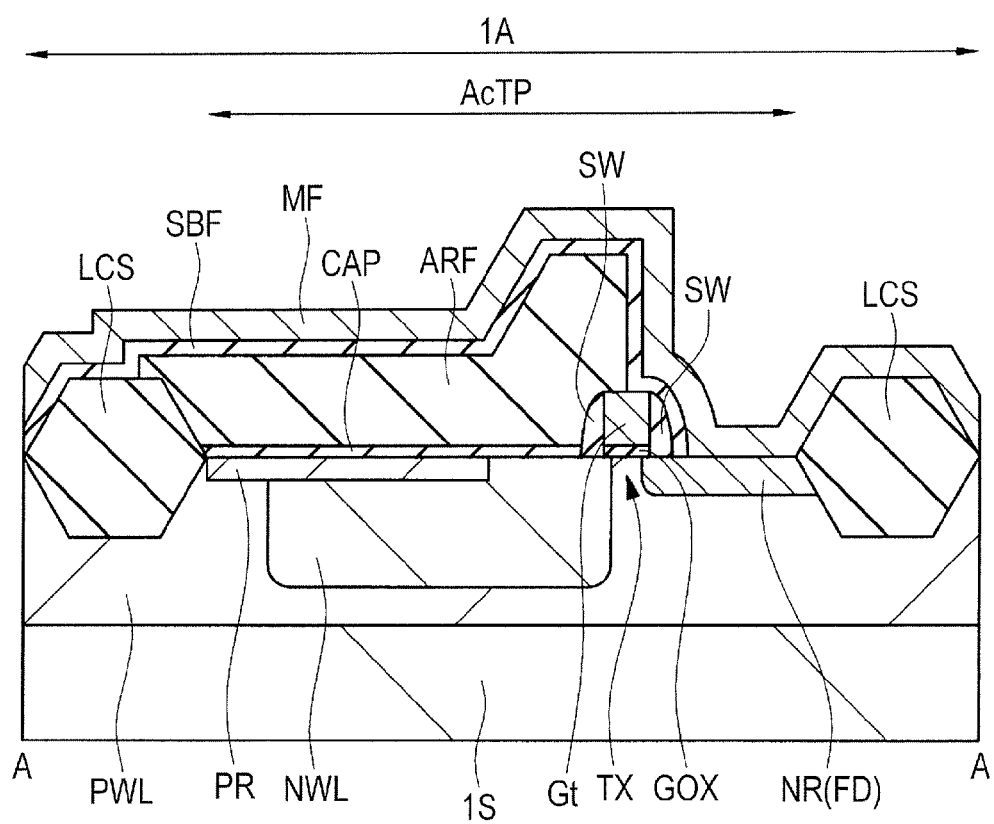
FIG. 32 is a cross-sectional view showing the manufacturing process of the semiconductor device of Embodiment 1.
Figure 33:
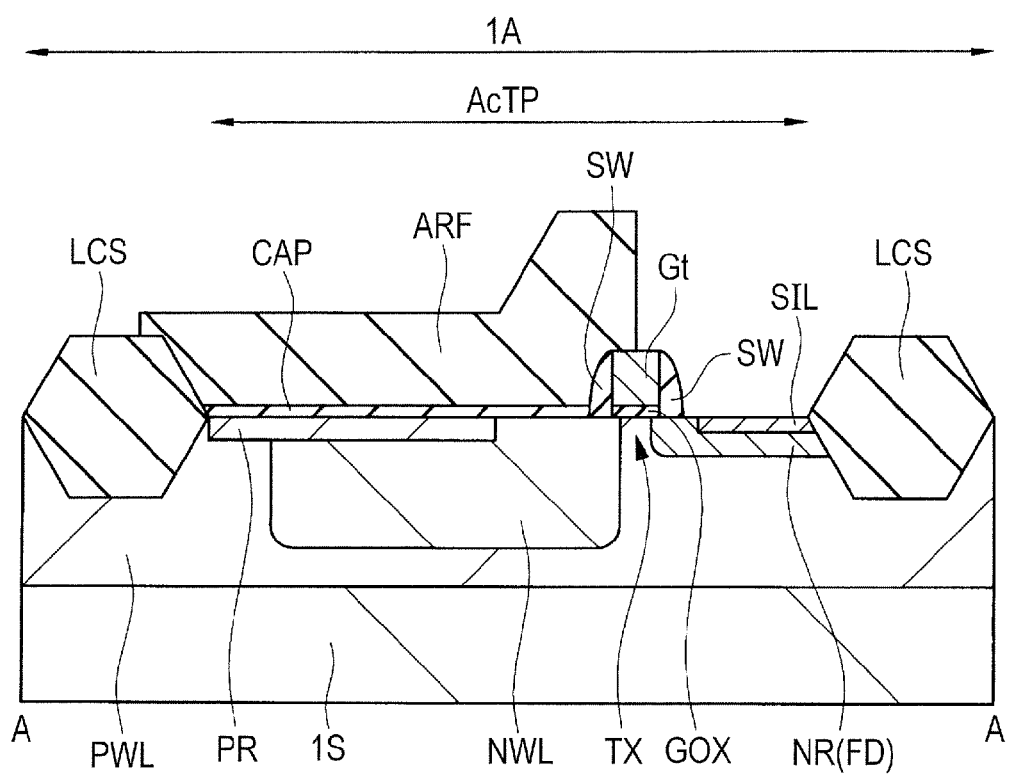
FIG. 33 is a cross-sectional view showing the manufacturing process of the semiconductor device of Embodiment 1.

When the silicide layer SIL is formed in the n-type higher-concentration semiconductor region NR as the drain region of the transfer transistor TX in the pixel region 1A in the process in Step S20, as shown in FIG. 32, the silicide blocking film SBF is removed from the top surface of the n-type higher-concentration semiconductor region NR. Then, as shown in FIG. 32, over the semiconductor substrate 1S, e.g., a nickel (Ni) film is formed as the metal film MF using a sputtering method or the like. Thereafter, the semiconductor substrate 1S is subjected to heat treatment. Thus, as shown in FIG. 33, in the pixel region 1A, the metal film MF is caused to react with silicon forming the n-type higher-concentration semiconductor region NR as each of the floating diffusion FD and the drain region of the transfer transistor TX to form the silicide layer SIL.

Figure 34:
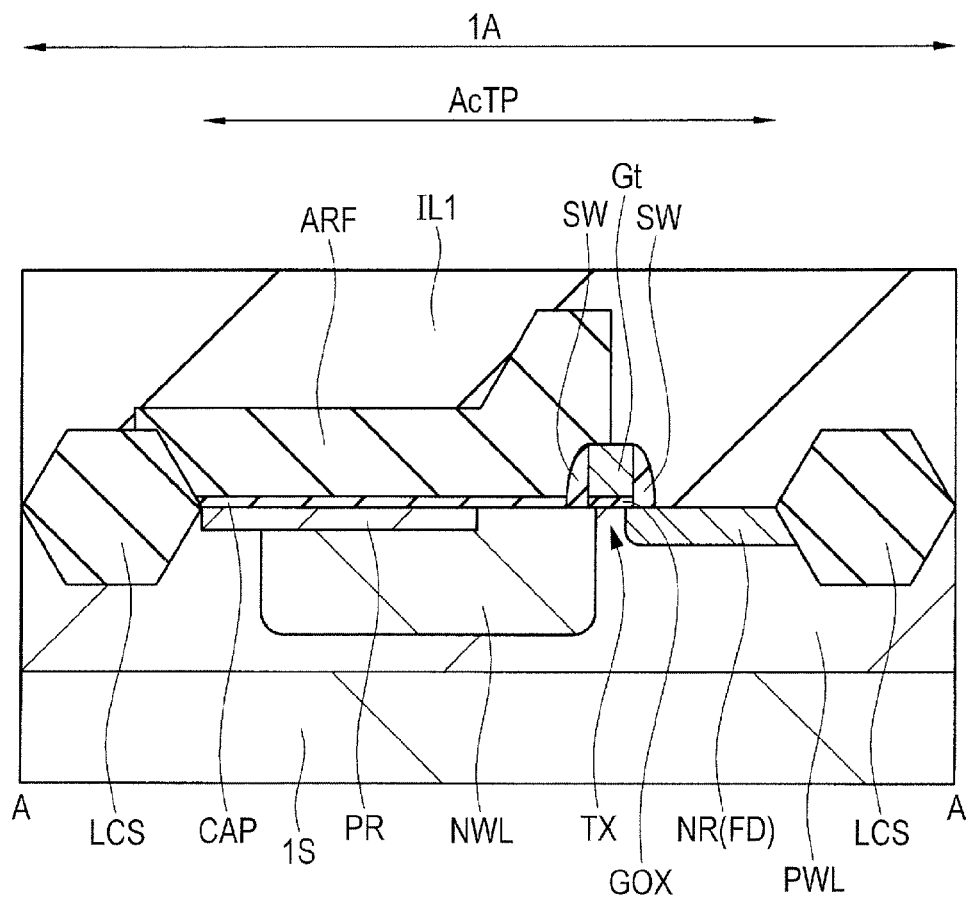
FIG. 34 is a cross-sectional view showing the manufacturing process of the semiconductor device of Embodiment 1.
Figure 35:
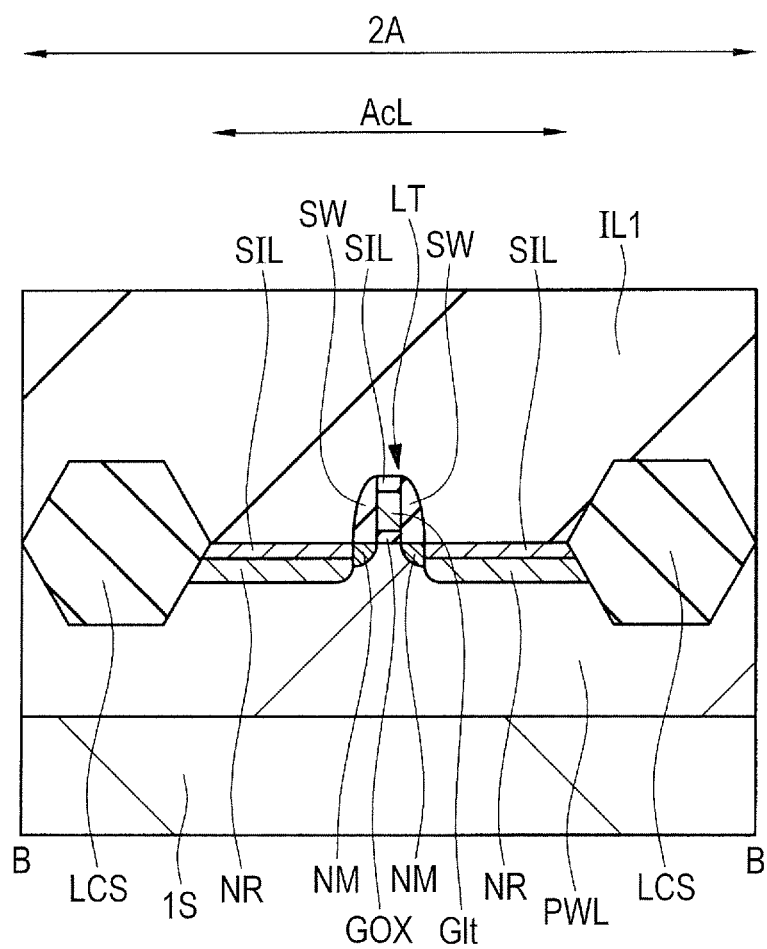
FIG. 35 is a cross-sectional view showing the manufacturing process of the semiconductor device of Embodiment 1.

Next, as shown in FIGS. 34 and 35, in the pixel region 1A and the peripheral circuit region 2A, the interlayer insulating film IL1 is formed over the semiconductor substrate 1S (S21 in FIG. 10). In the following process, as shown in FIG. 30, the case where no silicide layer is formed in the top surface of the n-type higher-concentration semiconductor region NR as each of the floating diffusion FD and the drain region of the transfer transistor TX will be described by way of example.

For example, over the semiconductor substrate 1S, a silicon oxide film is deposited by a CVD method using a TEOS gas as a raw material gas. Then, as necessary, the top surface of the interlayer insulating film IL1 is planarized using a CMP (Chemical Mechanical Polishing) method or the like.

Figure 36:
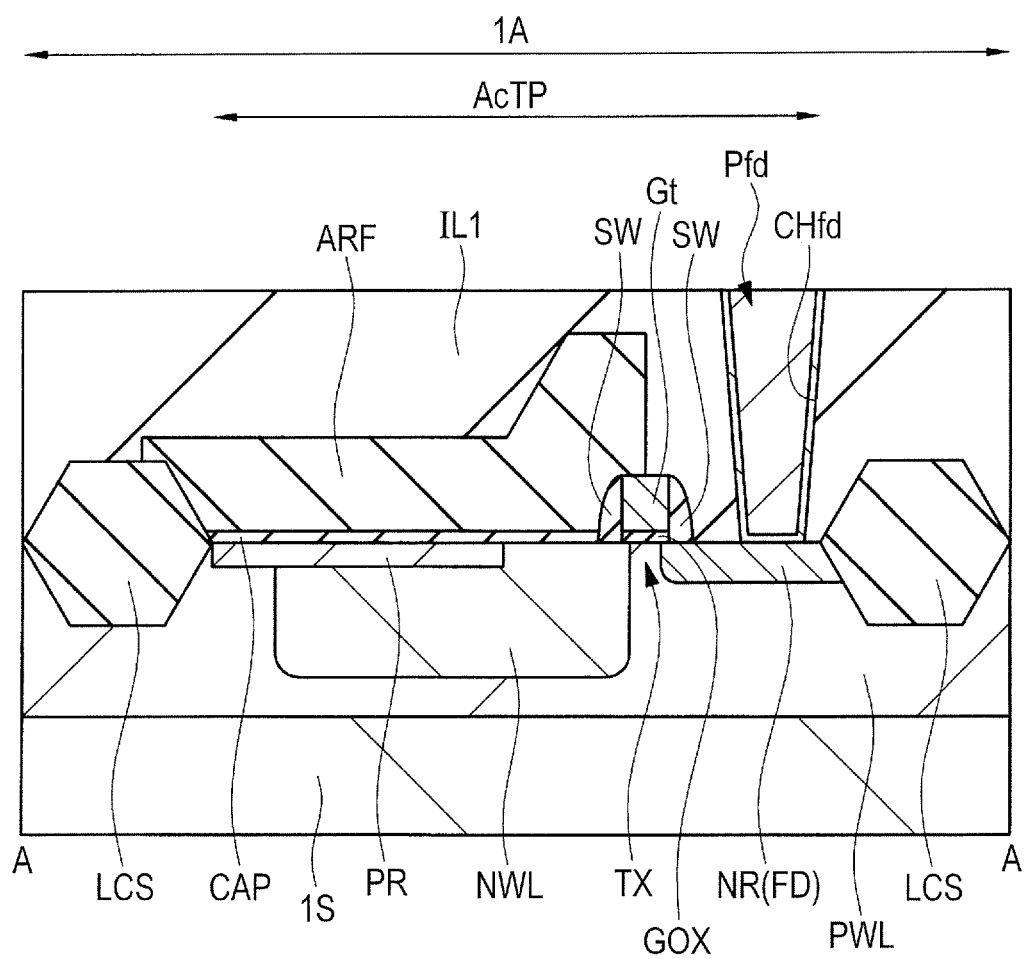
FIG. 36 is a cross-sectional view showing the manufacturing process of the semiconductor device of Embodiment 1.
Figure 37:
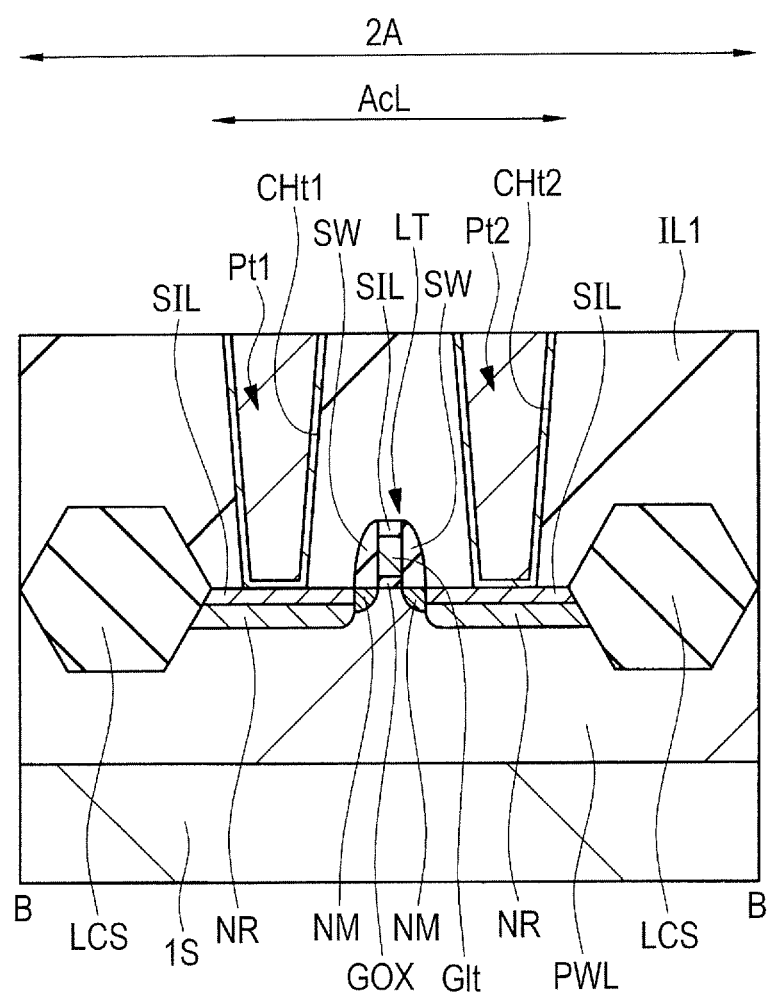
FIG. 37 is a cross-sectional view showing the manufacturing process of the semiconductor device of Embodiment 1.

Next, as shown in FIGS. 36 and 37, the interlayer insulating film IL1 is patterned to form contact holes CHfd, CHt1, and CHt2. The contact hole CHfd is formed to extend through the interlayer insulating film IL1 above the n-type higher-concentration semiconductor region NR as each of the floating diffusion FD and the drain region of the transfer transistor TX and reach the n-type higher-concentration semiconductor region NR. Also, the contact holes CHt1 and CHt2 are formed to extend through the interlayer insulating films IL1 above the n-type higher-concentration semiconductor regions NR as the source/drain regions of the transistor LT and reach the silicide layers SIL formed in the top surfaces, i.e., upper portions of the n-type higher-concentration semiconductor regions NR.

At this time, over the gate electrode Gt of the transfer transistor TX also, a contact hole is formed. Also at this time, over the gate electrodes Gr, Gs, and Ga of the other transistors shown in, e.g., FIG. 3, i.e., the reset transistor RST, the selection transistor SEL, and the amplification transistor AMI and the source/drain regions thereof also, contact holes are formed.

Next, as shown in FIGS. 36 and 37, into the contact holes CHfd, CHt1 and CHt2, a conductive film is embedded to form the plugs Pfd, Pt1, and Pt2.

First, over the interlayer insulating film IL1 including the bottom surfaces and inner walls of the contact holes CHfd, CHt1, and CHt2, a titanium/titanium nitride film is formed. The titanium/titanium nitride film is formed of a laminate film of a titanium film and a titanium nitride film located over the titanium film and can be formed using, e.g., sputtering method. The titanium/titanium nitride film has a so-called diffusion barrier property which prevents, e.g., tungsten as the material of a film embedded in the subsequent step from being diffused into silicon.

Then, a tungsten film is formed over the entire main surface of the semiconductor substrate 1S so as to be embedded in each of the contact holes CHfd, CHt1, and CHt2. The tungsten film can be formed using, e.g., a CVD method. Then, by removing the unneeded titanium/titanium nitride film and tungsten film each formed over the interlayer insulating film IL1 by, e.g., a CMP method, the plugs Pfd, Pt1, and Pt2 can be formed.

Figure 38:
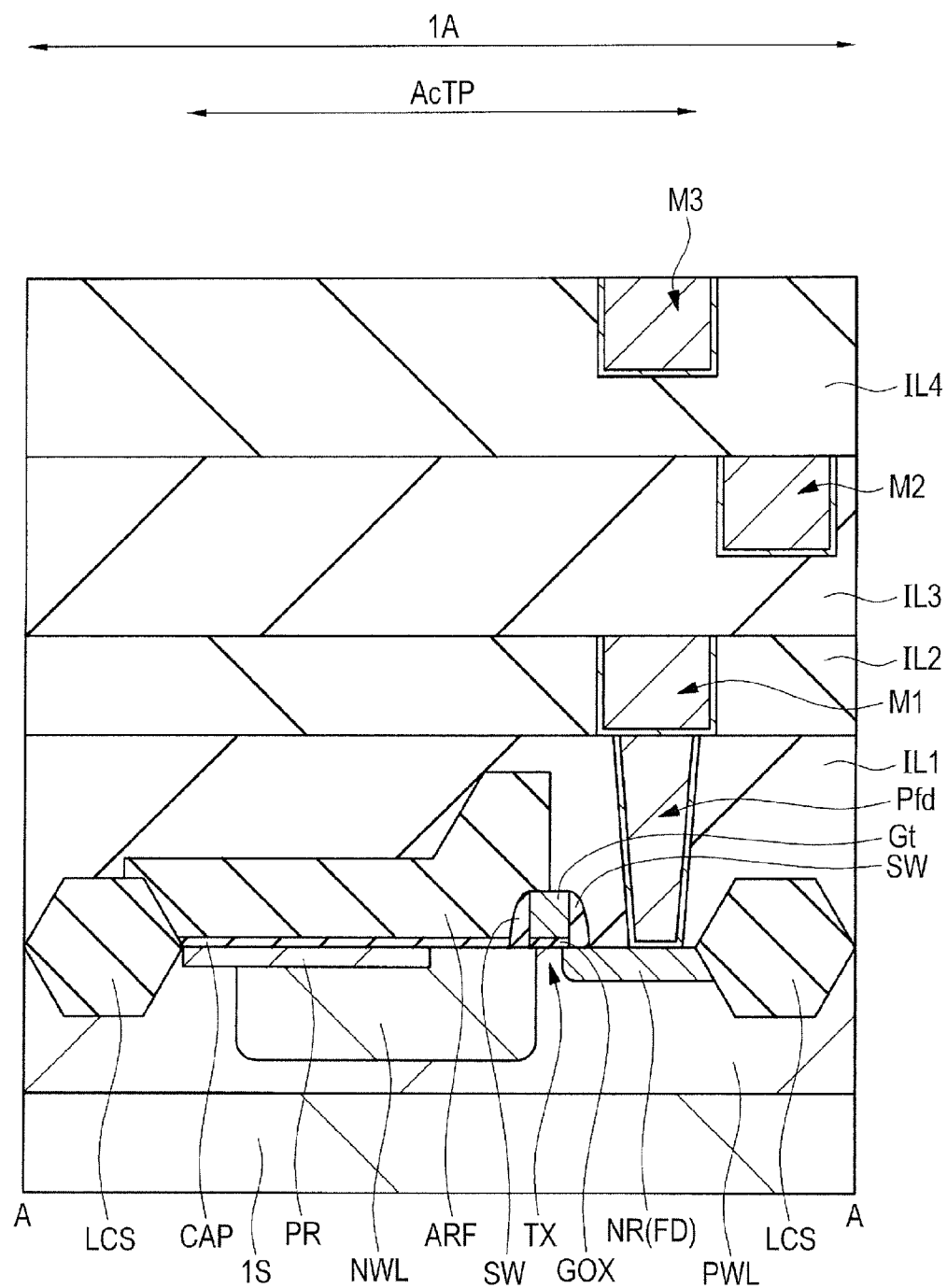
FIG. 38 is a cross-sectional view showing the manufacturing process of the semiconductor device of Embodiment 1.

Next, as shown in FIGS. 38 and 8, over the interlayer insulating film IL1 formed with the plugs Pfd, Pt1, and Pt2, the interlayer insulating films IL2 to IL4 and the interconnects M1 to M3 are formed. For example, over the interlayer insulating film IL1, a laminate film of a silicon nitride film and a silicon oxide film located thereover is formed as the interlayer insulating film IL2 by a CVD method or the like. Then, by patterning the laminate film, interconnect trenches are formed. Then, over the interlayer insulating film IL2 including the insides of the interconnect trenches, a laminate film of a tantalum (Ta) film and tantalum nitride (TaN) film located thereover is deposited as a barrier film by a sputtering method or the like. Then, over the barrier film, a thin copper film is deposited as a seed film (illustration thereof is omitted) by a sputtering method or the like and, over the seed film, a copper film is deposited by an electrolytic plating method.

Then, the unneeded barrier film, seed film, and copper film over the interlayer insulating film IL2 are removed by a CMP method or the like. By thus embedding the barrier film, the seed film, and the copper film in each of the interconnect trenches, the interconnects M1 can be formed (single damascene method).

Subsequently, as shown in FIGS. 38 and 8, the interlayer insulating film IL3 is similarly formed over the interlayer insulating film IL2 formed with the interconnects M1, the interconnects M2 are formed in the interlayer insulating film IL3, the interlayer insulating film IL4 is formed over the interlayer insulating film IL3 formed with the interconnects M2, and the interconnects M3 are formed in the interlayer insulating film IL4.

Next, as shown in FIG. 7, onto the interlayer insulating film IL4 in the uppermost layer, the microlens ML as an on-chip lens is attached so as to overlap the n-type well NWL forming the photodiode in planar view. Note that, between the microlens ML and the interlayer insulating film IL4, a camera filter may also be provided.

By the foregoing process, the semiconductor device of Embodiment 1 can be manufactured.

Note that, in Embodiment 1, the respective conductivity types of, e.g., the semiconductor substrate 1S, the p-type well PWL, the n-type well NWL, the $p^+$-type semiconductor regions PR, and the n-type higher-concentration semiconductor regions NR may also be collectively changed to the opposite conductivity types (the same holds true in each of the following modifications, Embodiment 2, and modifications thereof).

<First Modification of Manufacturing Method of Semiconductor Device>

Figure 39:
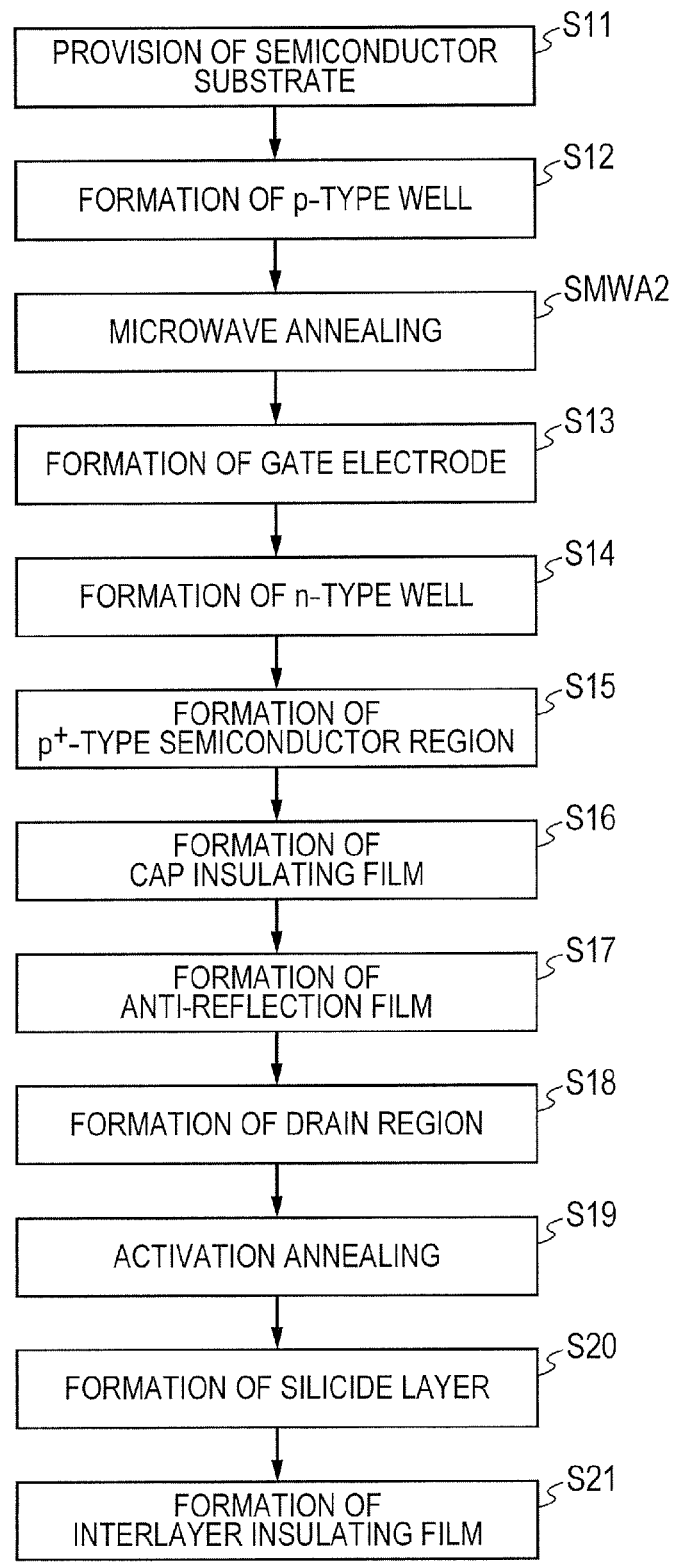
FIG. 39 is a process flow chart showing a part of a manufacturing process of a semiconductor device of a first modification of Embodiment 1.
Figure 40:
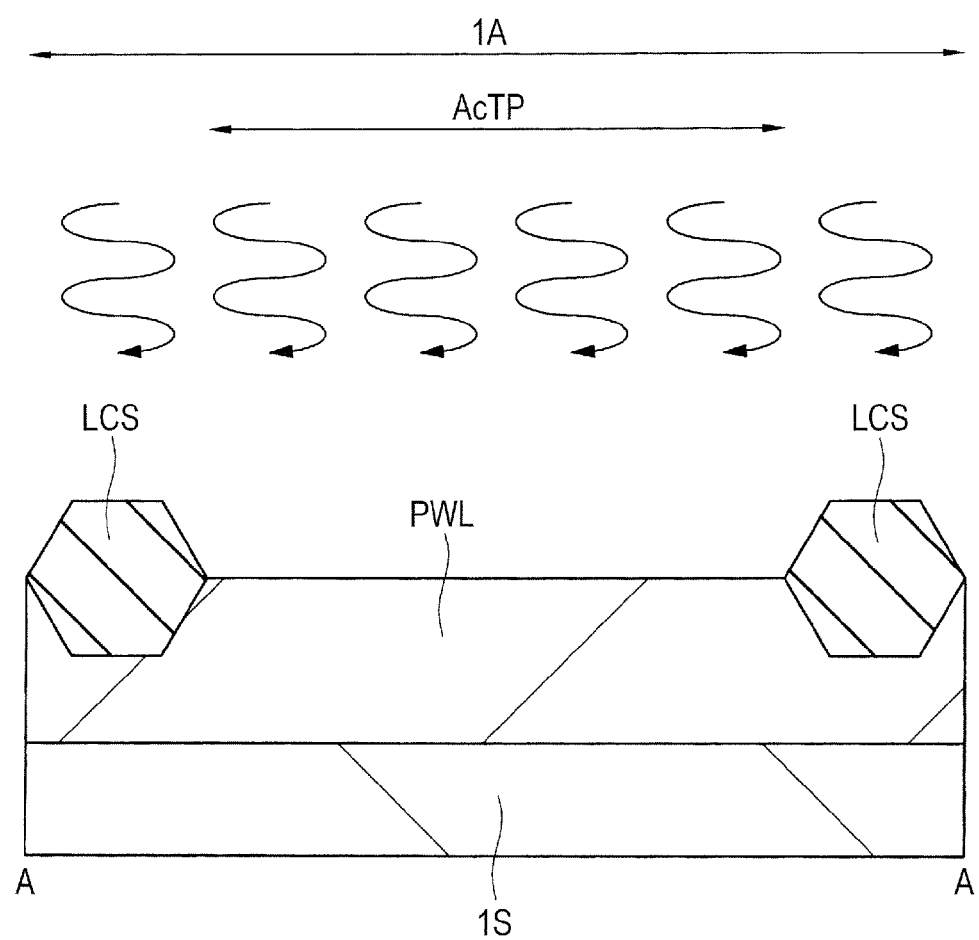
FIG. 40 is a cross-sectional view showing the manufacturing process of the semiconductor device of the first modification of Embodiment 1.

Next, a description will be given of the first modification of Embodiment 1. FIG. 39 is a manufacturing process flow chart showing a part of the manufacturing process of the semiconductor device of the first modification of Embodiment 1. FIG. 40 is a cross-sectional view showing the manufacturing process of the semiconductor device of the first modification of Embodiment 1. Note that FIG. 39 mainly shows, of the manufacturing process of the semiconductor device of the first modification of Embodiment 1, the manufacturing process performed for the pixel region 1A. The cross-sectional view of FIG. 40 corresponds to a cross section along the line A-A in FIG. 3.

The manufacturing method of the semiconductor device of the first modification is different from the manufacturing method of the semiconductor device of Embodiment 1 in that, after the process in Step S12 is performed and before the process in Step S13 is performed, microwave annealing is performed.

In the first modification, the same processes as in Steps S11 and S12 in FIG. 10 (Steps S11 and S12 in FIG. 39) are performed to form the p-type well PWL as shown in FIGS. 13 and 14, and then microwave annealing is performed as shown in FIG. 40 (Step SMWA2 in FIG. 39). For example, by applying a microwave at a frequency which allows the microwave to be resonantly absorbed by a silicon crystal, e.g., 5.8 GHz to the semiconductor substrate 1S from the top surface or back surface thereof, the microwave is resonantly absorbed by the silicon crystal forming the semiconductor substrate 1S to directly induce the lattice vibration of the silicon crystal. As a result, the semiconductor substrate 1S is heated. Specifically, the microwave can be applied with a power of, e.g., about 2 to 10 kW for about 5 to 30 minutes.

When the p-type well PWL is formed in the process in Step S12, an ion implantation method is used so that a large number of crystal defects are formed in the p-type well PWL including a deep region in the semiconductor substrate 1S. On the other hand, by performing the microwave annealing, the lattice vibration of the silicon crystal can be directly induced. This allows the silicon crystal in the semiconductor substrate 1S including the deep region therein to be uniformly heated. As a result, even when the crystal defects formed in the p-type well PWL are formed in a region at a depth of, e.g., 500 nm to several micrometers from the top surface of the semiconductor substrate, the crystal defects formed in the p-type well PWL can be cured.

As will be described later using FIG. 46, the microwave can be applied preferably with a power of, e.g., about 5 to 10 kW for about 15 to 30 minutes. This allows the crystal defects formed in the p-type well PWL to be more efficiently cured.

Also, with the microwave annealing, a high temperature need not be provided to cure the crystal defects formed in the deep region in the semiconductor substrate 1S. Accordingly, it is possible to prevent or suppress impurity diffusion in the peripheral circuit region 2A. Therefore, with the microwave annealing, it is possible to prevent or suppress the degradation of the characteristics of the MISFETs formed in the peripheral circuit region 2A.

When, e.g., furnace annealing using an annealing furnace is performed instead of the microwave annealing, the problem of the occurrence of variations in the characteristics of the peripheral circuit or the like arises. On the other hand, when the microwave annealing is performed, the temperature is low, impurity diffusion in the peripheral circuit is suppressed, and there is no characteristic variation. As will be described later using FIG. 53, when, e.g., the microwave annealing is performed and then the furnace annealing using the annealing furnace performed at the time of, e.g., activation annealing is performed, it is possible to suppress the occurrence of dislocation in the crystal lattice of silicon. As a result, not only crystal defects are cured by the microwave annealing, but also crystal defects formed in the p-type well PWL can be more efficiently cured, while the occurrence of the dislocation in the crystal lattice of silicon is suppressed.

Subsequently, by performing the same processes as in Steps S13, S14, and S15 to S21 in FIG. 10 (Steps S13 to S21 in FIG. 39), the interlayer insulating film IL1 can be formed. The subsequent processes can also be performed in the same manner as in Embodiment 1.

Note that, in the first modification, in addition to the process of the microwave annealing in Step SMWA2, in the same manner as in Embodiment 1, microwave annealing can be performed after the process in Step S14 is performed and before the process in Step S15 is performed, as shown in FIG. 19 (Step SMWA1 in FIG. 10). Therefore, the same effect as obtained from Step SMWA1 in Embodiment 1 can be obtained and the crystal defect formed in each of the processes can be cured immediately.

<Second Modification of Manufacturing Method of Semiconductor Device>

Figure 41:
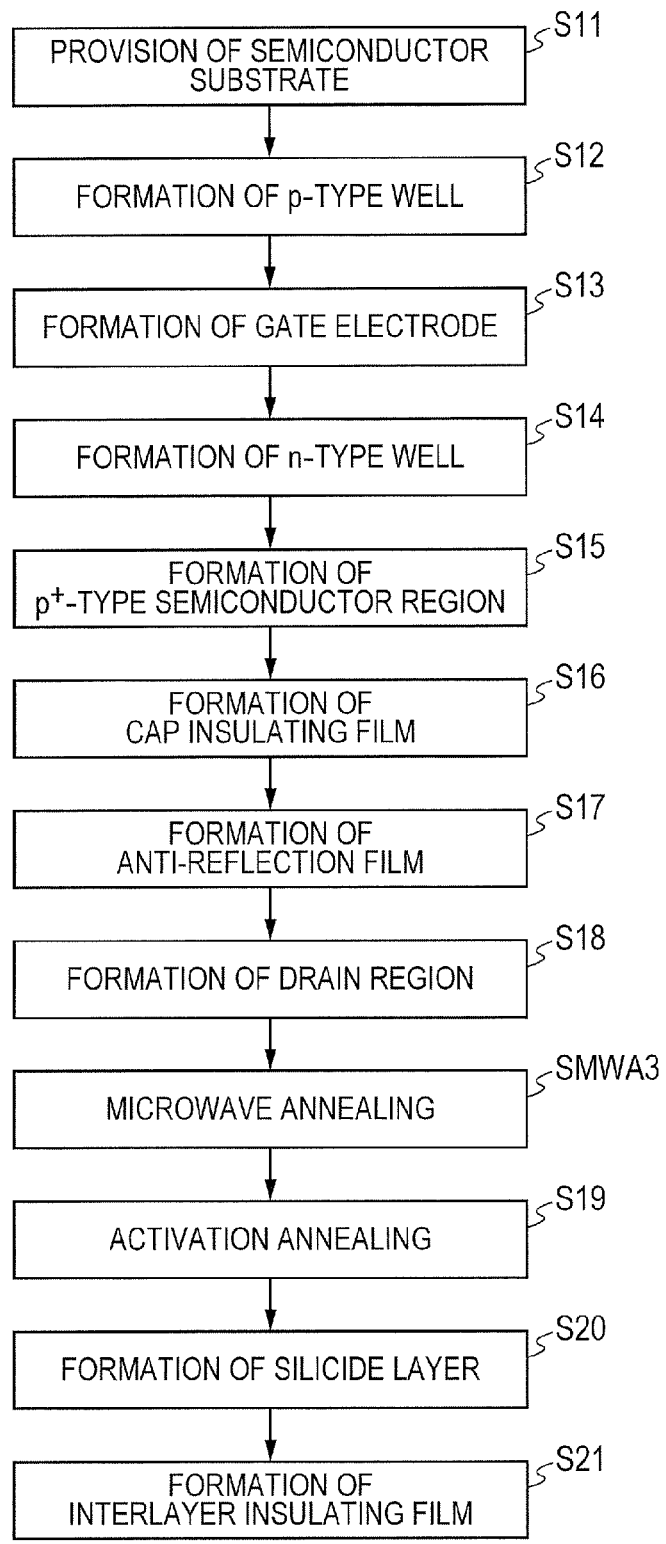
FIG. 41 is a process flow chart showing a part of a manufacturing process of a semiconductor device of a second modification of Embodiment 1.
Figure 42:
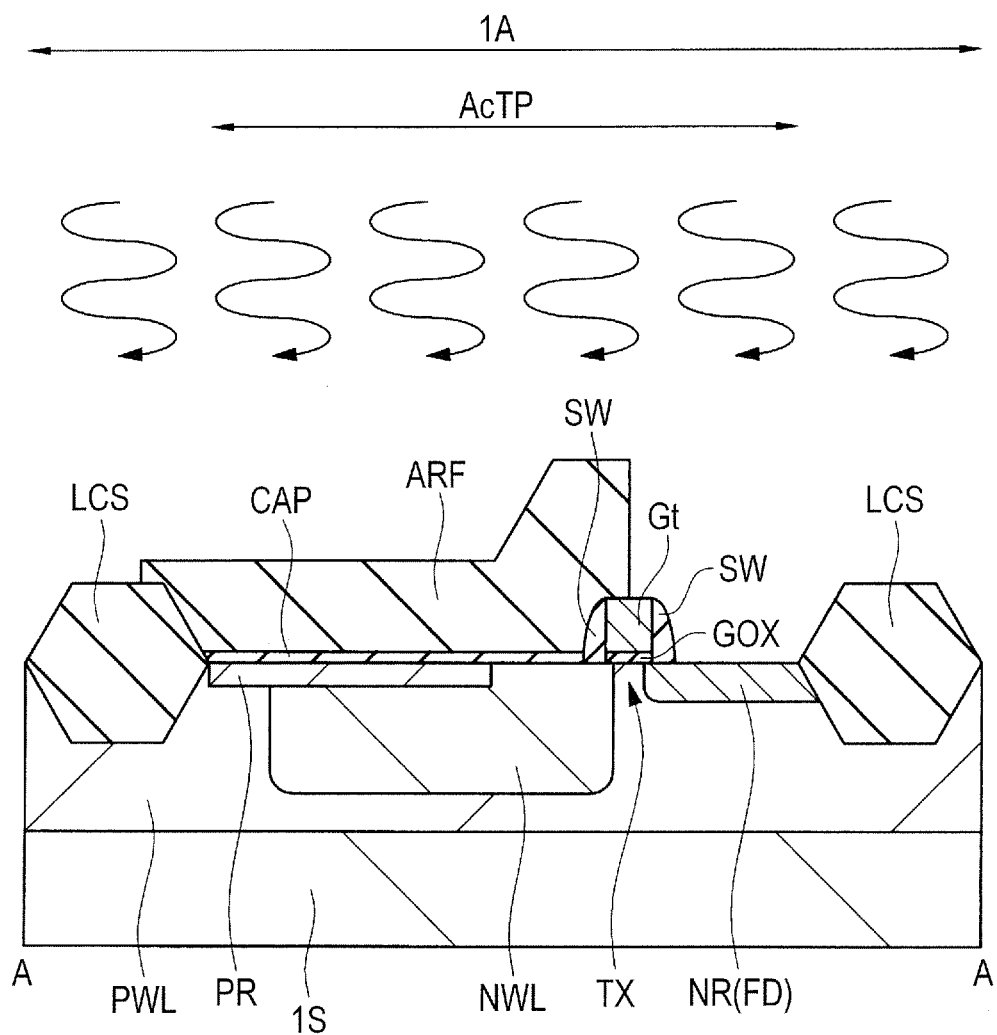
FIG. 42 is a cross-sectional view showing the manufacturing process of the semiconductor device of the second modification of Embodiment 1.

Next, a description will be given of the second modification of Embodiment 1. FIG. 41 is a manufacturing process flow chart showing a part of the manufacturing process of the semiconductor device of the second modification of Embodiment 1. FIG. 42 is a cross-sectional view showing the manufacturing process of the semiconductor device of the second modification of Embodiment 1. Note that FIG. 41 mainly shows, of the manufacturing process of the semiconductor device of the second modification of Embodiment 1, the manufacturing process performed for the pixel region 1A. The cross-sectional view of FIG. 42 corresponds to a cross section along the line A-A in FIG. 3.

The manufacturing method of the semiconductor device of the second modification is different from the manufacturing method of the semiconductor device of Embodiment 1 in that, after the process in Step S18 is performed and before the process in Step S19 is performed, microwave annealing is performed.

In the second modification, the same processes as in Steps S11 to S14 and S15 to S18 in FIG. 10 (Steps S11 to S18 in FIG. 41) are performed to form the n-type higher-concentration semiconductor region NR as the drain region of the transfer transistor TX, as shown in FIGS. 26 and 27. Then, after the n-type higher-concentration semiconductor region NR is formed, as shown in FIG. 42, microwave annealing is performed (Step SMWA3 in FIG. 41). For example, by applying a microwave at a frequency which allows the microwave to be resonantly absorbed by a silicon crystal, e.g., 5.8 Hz to the semiconductor substrate 1S from the top surface or back surface thereof, the microwave is resonantly absorbed by the silicon crystal forming the semiconductor substrate 1S to directly induce the lattice vibration of the silicon crystal. As a result, the semiconductor substrate 1S is heated. Specifically, the microwave can be applied with a power of, e.g., about 2 to 10 kW for about 5 to 30 minutes.

When the n-type higher-concentration semiconductor region NR is formed in the process of Step S18, an ion implantation method is used so that a large number of crystal defects are formed in the n-type higher-concentration semiconductor region NR. On the other hand, by performing the microwave annealing, the lattice vibration of the silicon crystal can be directly induced. This allows the silicon crystal in the semiconductor substrate 1S including the deep region therein to be uniformly heated. As a result, the crystal defects formed in the n-type higher-concentration semiconductor region NR can be cured.

As will be described later using FIG. 46, the microwave can be applied preferably with a power of, e.g., about 5 to 10 kW for about 15 to 30 minutes. This allows the crystal defects formed in the n-type higher-concentration semiconductor region NR to be more efficiently cured.

In addition, the microwave annealing does not need a high temperature for curing the crystal defects formed in the semiconductor substrate 1S. Therefore, it is possible to prevent or suppress impurity diffusion in the peripheral circuit region 2A and prevent or suppress the degradation of the characteristics of the MISFETs formed in the peripheral circuit region 2A.

Subsequently, by performing the same processes as in Steps S19 to S21 in FIG. 10 (Steps S19 to S21 in FIG. 41), the interlayer insulating film IL1 can be formed. The subsequent processes can also be performed in the same manner as in Embodiment 1.

At this time, by performing the same process as in Step S19 in FIG. 10 (Step S19 in FIG. 41) and thus performing the activation annealing on the semiconductor substrate 1S, in the same manner as in Embodiment 1, it is possible to cure the crystal defects formed in the n-type well NWL, while suppressing the occurrence of dislocation in the crystal lattice of silicon. That is, in the second modification, by performing the activation annealing in Step S19, after the microwave annealing, the semiconductor substrate 1S can be subjected to heat treatment at a temperature of, e.g., not less than 800° C.

However, in the second modification, when the processes in Steps S11 to S18 in FIG. 41 are performed, the semiconductor substrate may be heated to a temperature of, e.g., about 600° C. to result in the occurrence of dislocation in the crystal lattice of silicon. When such dislocation occurs, it is not easy to remove the dislocation that has occurred by the microwave annealing. Accordingly, in the second modification, the effect of curing the crystal defects in each of the layers in the p-type well PWL and the n-type well NWL is lower than in Embodiment 1 and the first modification of Embodiment 1.

Note that, in the second modification, in the same manner as in Embodiment 1, after the process in Step S14 is performed and before the process in Step S15 is performed, the microwave annealing can be performed, as shown in FIG. 19 (Step SMWA1 in FIG. 10). This allows the same effect as the effect obtained from Step SMWA1 in Embodiment 1 to be obtained and allows the crystal defects formed in each of the processes to be cured immediately.

Also, in the second modification, in the same manner as in the first modification of Embodiment 1, after the process in Step S12 is performed and before the process in Step S13 is performed, the microwave annealing can be performed, as shown in FIG. 40 (Step SMWA2 in FIG. 39). This, allows the same effect as the effect obtained from Step SMWA2 in the first modification of Embodiment 1 to be obtained and allows the crystal defects formed in each of the processes to be cured immediately.

In addition, in the second modification, the microwave annealing in Step SMWA1 in FIG. 10 and the microwave annealing in Step SMWA2 in FIG. 39 can be performed. This allows the same effect as the effect obtained from Step SMWA1 in Embodiment 1 and the effect obtained from Step SMWA2 in the first modification of Embodiment 1 to be obtained and allows the crystal defect formed in each of the processes to be cured immediately.

That is, as the modification of Embodiment 1, any two or three of Steps SMWA1, SMWA2, and SMWA3 can be performed in combination. This allows the same effect as the effect of the microwave annealing in each of the combined steps to be obtained and allows the crystal defects formed in each of the processes to be cured immediately.

<About Crystal Defects in Image Sensor>

In the image sensor having the configuration described above, it is important to reduce a dark current and improve the performance thereof. The dark current refers to a phenomenon in which a current flows even in a state without illumination with light. When the dark current increases, it is determined that, in spite, of no illumination with light, there is illumination with light and erroneous lighting occurs to form white points and cause the degradation of a displayed image. Accordingly, in the image sensor, it is necessary to minimize the dark current in terms of improving the characteristics of the image sensor. One conceivable cause of the dark current is the crystal defects formed in the semiconductor region forming the photodiode.

Figure 43:
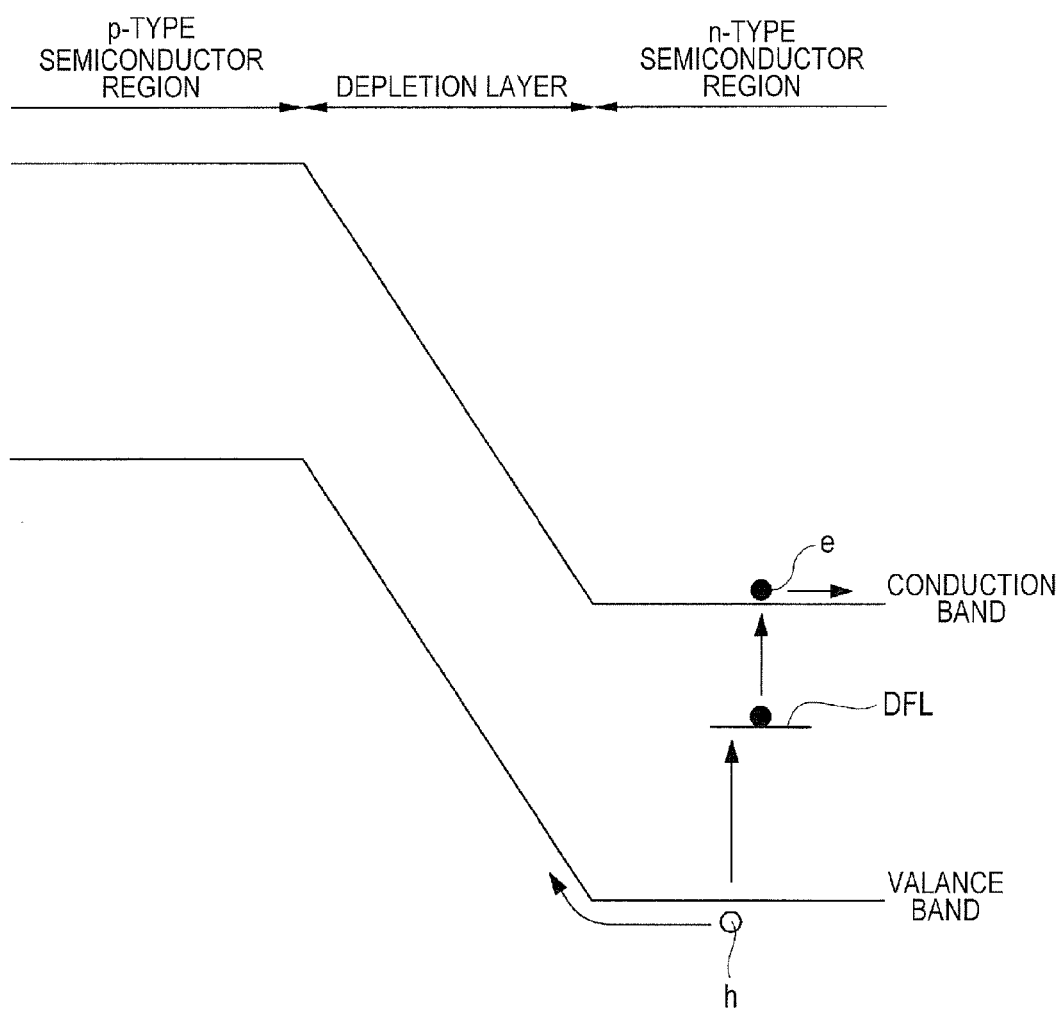
FIG. 43 is a view showing the band structure of a photodiode resulting from a pn junction.

FIG. 43 is a view showing the band structure of the photodiode resulting from a pn junction. As shown in FIG. 43, the left-hand region is a p-type semiconductor region corresponding to the p-type well PWL and the right-hand region is an n-type semiconductor region corresponding to the n-type well NWL. The boundary between the p-type semiconductor region and the n-type semiconductor region corresponds to a middle region, which serves as a depletion layer.

In the n-type semiconductor region shown in FIG. 43, when there is no crystal defect, no defect level is formed between a valence band and a conduction band. Unless light having an energy of not less than that of the band gap is incident, electrons present in the valence band are seldom excited to the conduction band. Accordingly, in an ideal photodiode with no crystal defect, there is substantially no electron excited to the conduction band unless the photodiode is illuminated with light so that a dark current flowing in the photodiode is extremely small.

On the other hand, as shown in FIG. 43, when there is a crystal defect in the n-type semiconductor region, a defect level DLF is formed between the valence band and the conduction band. Accordingly, even when there is no illumination with light having an energy of not less than that of the band gap, electrons are easily excited from the valence band to the conduction band through the defect level. That is, when there is a crystal defect, even when the photodiode is not illuminated with light, due to a thermal excitation phenomenon or the like, electrons are excited from the valence band to the conduction band through the defect level DFL to thus increase the dark current. Therefore, to reduce the dark current in the image sensor, it is necessary to reduce the crystal defects present in the photodiode.

<About Method of Measuring Defect Density and Temperature Dependency of Defect Density>

Next, a method of evaluating crystal defects will be described. In the following, as the method of evaluating crystal defects, a method using a TW (Thermal Wave) method will be described. The TW method is disclosed in, e.g., W. L. Smith et al., "Ion implant monitoring with thermal wave technology", Appl. Phys. Lett. 47, 584 (1985). The TW method is also disclosed in, e.g., D. Fournier et al., "Photothermal investigation of transport in semiconductors: Theory and experiment", J. Appl. Phys. 59, 787 (1986).

In the TW method, in a state where the surface of sample under measurement is illuminated with argon ion ($Ar^+$) laser light modulated at a frequency of, e.g., several megahertz and applied as pump light, the same region is illuminated with, e.g., helium-neon (He—Ne) laser light applied as probe light. Then, in the TW method, a defect density is evaluated on the basis of the measured TW value obtained by detecting the reflected light of the probe light.

Figure 44:
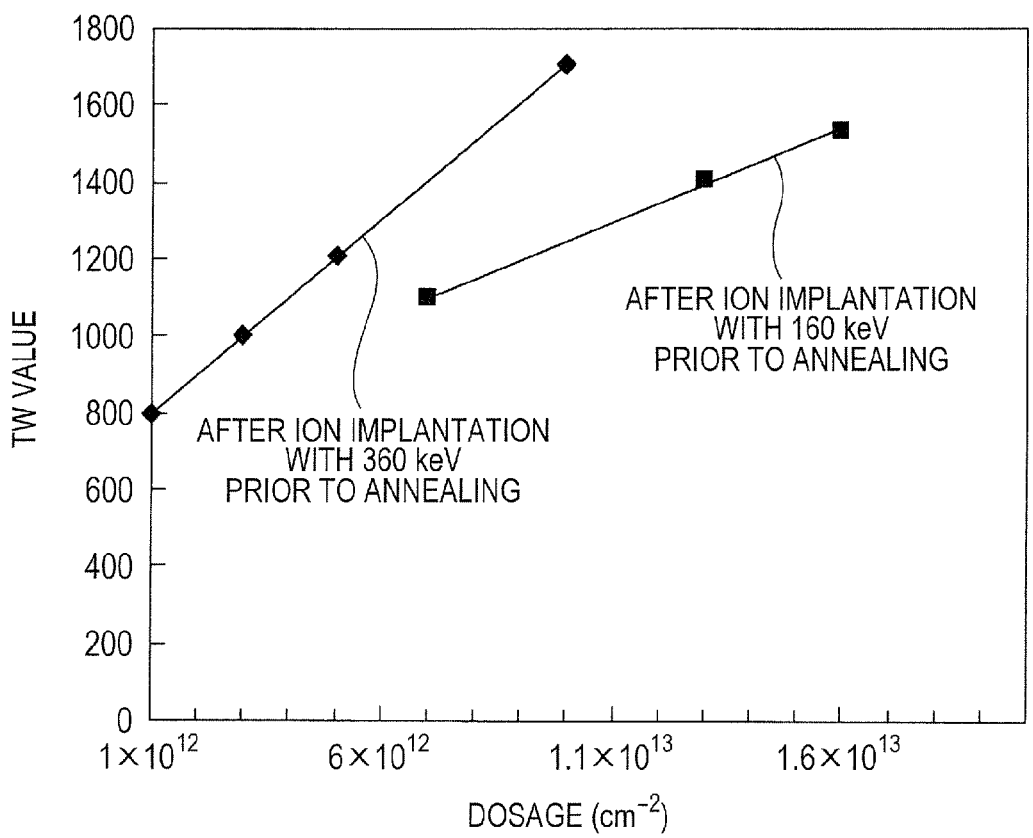
FIG. 44 is a graph showing the relationship between a dosage and a TW value when ion implantation of arsenic into a semiconductor substrate was performed.

FIG. 44 is a graph showing the relationship between a quantity of implanted ions when ion implantation of arsenic (As) into a semiconductor substrate was performed, i.e., a dosage and the TW value. FIG. 44 shows the result of measuring the TW values after the ion implantation was performed with an energy of each of 160 keV and 360 keV and before annealing was performed.

As shown in FIG. 44, in either of the cases where the ion implantation was performed with an energy of 160 keV and where the ion implantation was performed with an energy of 360 keV, as the dosage increases, the TW value increases. It can be considered that, before annealing is performed, as the dosage increases, the defect density in the semiconductor substrate increases. Thus, from the result of FIG. 44, it is obvious that, as the dosage, i.e., the defect density increases, the TW value also increases. Accordingly, by measuring the TW value, the defect density in the semiconductor substrate can be measured.

<About Annealing Condition Dependency of Defect Density>

Figure 45:
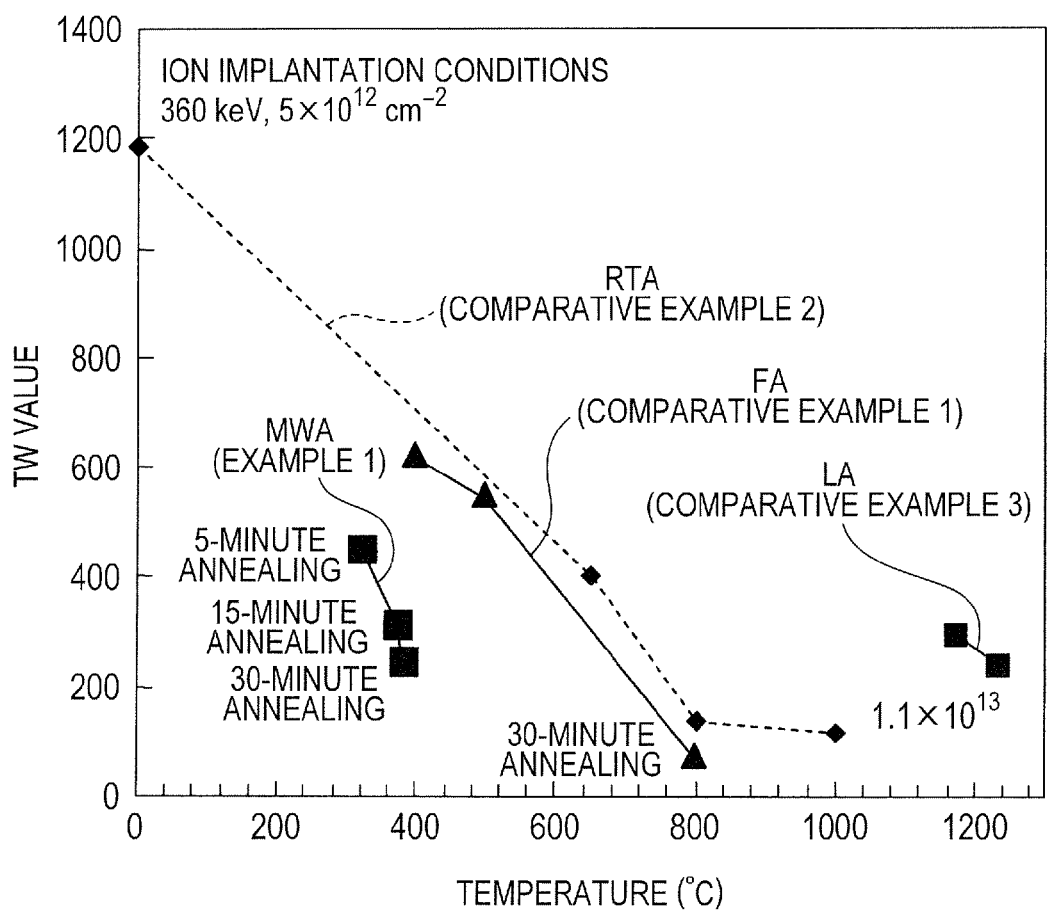
FIG. 45 is a graph showing the relationship between the TW value and an annealing temperature when ion implantation into a semiconductor substrate was performed and then annealing was further performed by various methods under various conditions.

FIG. 45 is a graph showing the relationship between the TW value and an annealing temperature when ion implantation into a semiconductor substrate was performed and then annealing was further performed by various methods under various conditions. FIG. 45 shows the result of measuring the TW values after ion implantation was performed with an energy of 360 keV at a dosage of $5\times10^{12}$ $cm^{-2}$ and then furnace annealing using an annealing furnace is further performed as Comparative Example 1, RTA using an infrared lamp heating furnace is further performed as Comparative Example 2, and laser annealing is further performed as Comparative Example 3. In FIG. 45, the furnace annealing using the annealing furnace is represented by FA and the laser annealing is represented by LA.

As shown in FIG. 45, in either of the furnace annealing using the annealing furnace (Comparative Example 1) and the RTA (Comparative Example 2), when the annealing temperature is in the range of not more than 500° C., the TW value cannot be controlled to be not more than 500. On the other hand, in the laser annealing (Comparative Example 3), the annealing time is shorter, but it is difficult to control the annealing time to a level of not more than 1000° C.

In addition, FIG. 45 also shows the result of measuring the TW values after ion implantation was performed under such ion implantation conditions that an energy was 360 keV and a dosage was $5\times10^{12}$ $cm^{-2}$ and then microwave annealing was further performed as Example 1 of Embodiment 1. In FIG. 45, microwave annealing is represented by MWA.

Figure 46:
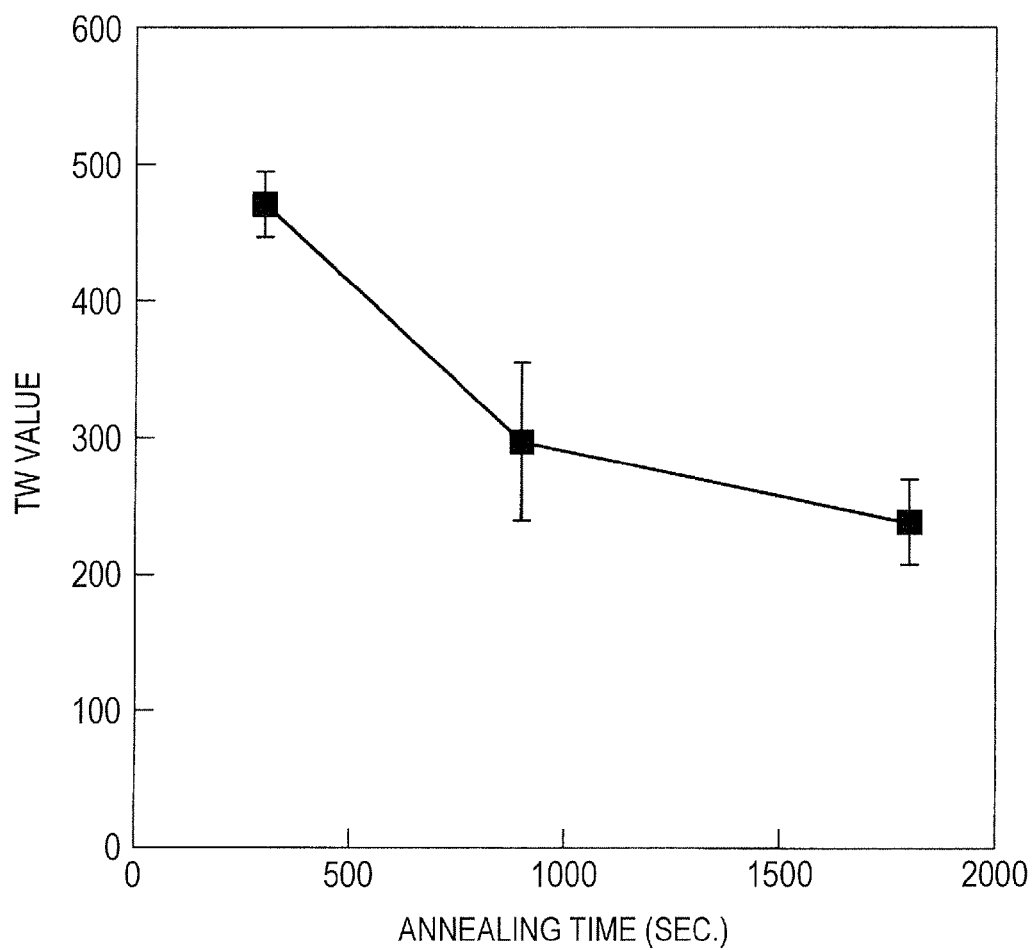
FIG. 46 is a graph showing the relationship between the TW value and the annealing temperature when ion implantation into a semiconductor substrate was performed and then microwave annealing was further performed as Example 1 of Embodiment 1.

FIG. 46 is a graph showing the relationship between the TW value and the annealing time when ion implantation into a semiconductor substrate was performed and then the microwave annealing was further performed as Example 1 of Embodiment 1. Note that the power of the microwave used in Embodiment 1 is 5 kW.

As shown in FIG. 45, with regard to the microwave annealing (Example 1), the TW value is not more than 500 even when the annealing time is 5 minutes (300 seconds), 15 minutes (900 seconds), or 30 minutes (1800 seconds) despite the annealing temperature which is in the range of not more than 400° C. Among the annealing temperatures needed to obtain the same TW value for the microwave annealing (Example 1), the furnace annealing using the annealing furnace (Comparative Example 1), the RTA (Comparative Example 2), and the laser annealing (Comparative Example 3), the annealing temperature needed for the microwave annealing (Example 1) is lower than the annealing temperatures needed for the furnace annealing using the furnace (Comparative Example 1), the RTA (Comparative Example 2), and the laser annealing (Comparative Example 3). As shown in FIG. 46, with regard to the microwave annealing (Example 1), the value decreases as the annealing time increases from 5 minutes to 15 minutes and to 30 minutes. A conceivable reason for this is, in addition to the effect of the increased annealing time, a slight increase in annealing temperature which occurs with an increase in annealing time.

Note that, as shown in FIG. 46, the decrease rate of the TW value when the annealing time has increased from 5 minutes to 15 minutes is higher than the decrease rate of the TW value when the annealing time has increased from 15 minutes to 30 minutes. Accordingly, the annealing time is preferably not less than 15 minutes and not more than 30 minutes. When the annealing time is less than 15 minutes, a sufficient effect may not possibly be obtained from the decrease in TW value. On the other hand, when the annealing time exceeds 30 minutes, the manufacturing time of the semiconductor device may increase to result in increased manufacturing cost.

<About Advantage of Microwave Annealing>

Here, a description will be given of the advantage of the microwave annealing.

For example, in typical annealing as in Comparative Example 1, the inner portion of the semiconductor substrate 1S is heated by heat conduction from the top surface of the semiconductor substrate 1S. Accordingly, as a depth from the top surface of the semiconductor substrate 1S increases, state is reached where the temperature is lower than at the top surface. In the photodiode, crystal defects are formed in a region at a depth of, e.g., 500 nm to several micrometers from the top surface of the semiconductor substrate. Accordingly, to cure the crystal defects, it is necessary to set the inner portion of the semiconductor substrate 1S at a high temperature.

To thus enhance the effect of curing the crystal defects, it is effective to perform annealing at a higher temperature. Accordingly, to cure the crystal defects formed in a deep region in the semiconductor substrate 1S, it is necessary to perform heat treatment at a temperature of not less than the temperature needed to cure the crystal defects, e.g., a temperature of not less than 800° C. In other words, when typical heat treatment other than microwave annealing, such as, e.g., furnace annealing using an annealing furnace is performed on the semiconductor substrate 1S at a temperature of less than 800° C., crystal defects cannot be cured.

However, in the manufacturing process of a semiconductor device including a pixel region and a peripheral circuit region, when annealing is performed at a temperature of not less than 800° C., an impurity is diffused in the peripheral circuit region to possibly vary the characteristics of semiconductor elements including transistors such as MISFETs and other elements, resulting in the degradation of the performance of the semiconductor device. Therefore, in terms of curing crystal defects in a photodiode or the like formed in the pixel region, it is desirable to perform annealing at a high temperature. However, in terms of suppressing variations in the characteristics of the semiconductor elements formed in the peripheral circuit region, it is not desirable to perform annealing at a high temperature.

On the other hand, in the microwave annealing used in Embodiment 1, to the semiconductor substrate 1S, a microwave at a frequency (5.8 GHz) which allows the microwave to be resonantly absorbed by a silicon crystal is applied. As a result, the microwave is resonantly absorbed by the silicon crystal forming the semiconductor substrate 1S to directly induce the lattice vibration of the silicon crystal and heat the semiconductor substrate 1S. Therefore, the microwave annealing in Embodiment 1 allows the silicon crystal present in the depth direction of the semiconductor substrate 1S to be uniformly heated. This eliminates the need to heat the semiconductor substrate 1S to a temperature of not less than the temperature needed to cure the crystal defects formed in the deep region in the semiconductor substrate 1S.

As shown in FIG. 45, with the microwave annealing in Embodiment 1, even when annealing is performed at a low temperature of not more than, e.g., 400° C., the crystal defect can be cured. Therefore, it is possible to suppress variations in the characteristics of the semiconductor elements formed in the top surface of the semiconductor substrate 1S including the transistors formed in the peripheral circuit region and the transfer transistor formed in the pixel region.

Next, a description will be given of the result of another examination verifying that the microwave annealing in Embodiment 1 allows the crystal defects formed in the inner portion of the semiconductor substrate 1S to be cured, similarly to related-art furnace annealing or the like.

Figure 47:
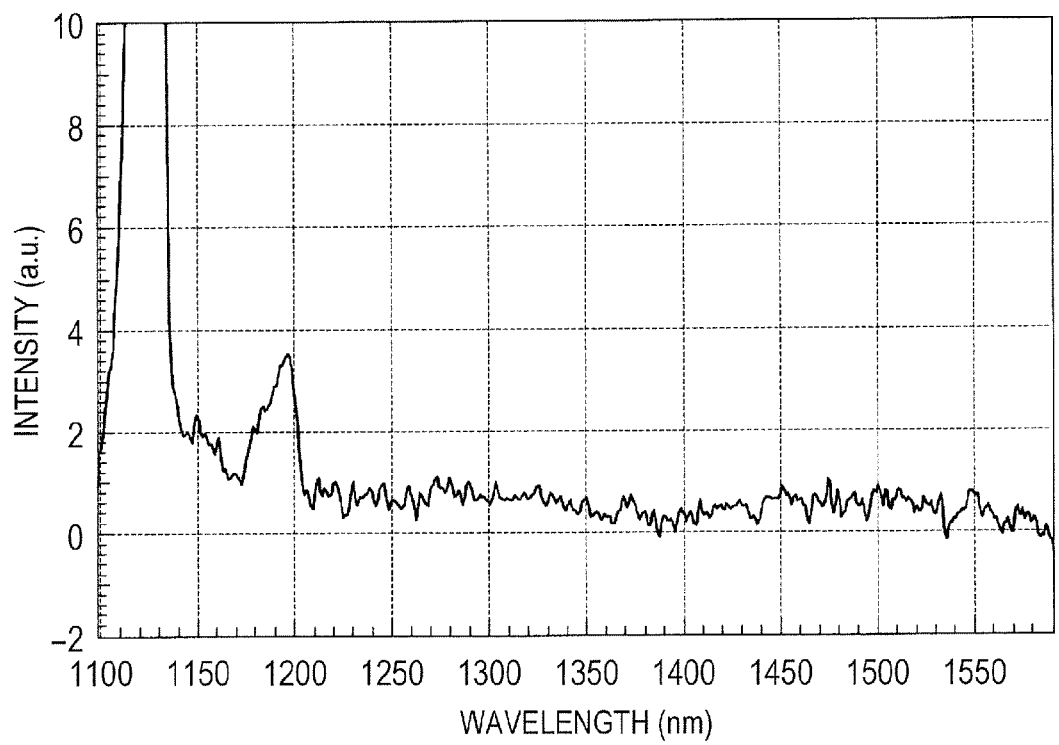
FIG. 47 is a graph showing the result of analysis in a cathode luminescence method in a state where ion implantation into a semiconductor substrate was performed and then furnace annealing of Comparative Example 1 was further performed.

FIG. 47 is a graph showing the result of analysis in accordance with a cathode luminescence (CL) method in a state where ion implantation into a semiconductor was performed and then the furnace annealing of Comparative Example 1 was further performed. FIG. 47 shows the result of analyzing an example in which annealing was performed at, e.g., 900° C. for about 30 minutes as the furnace annealing of Comparative Example 1. Note that, when there are crystal defects in the semiconductor substrate, broad light emission is monitored in the range of wavelengths larger than, e.g., 1400 nm, though the illustration thereof is omitted.

As shown in FIG. 47, in Comparative Example 1, broad light emission was not monitored in the range of large wavelengths. Accordingly, it can be seen that, when ion implantation into the semiconductor substrate was performed and then the furnace annealing of Comparative Example 1 was further performed, the crystal defects present in the semiconductor substrate were cured.

Figure 48:
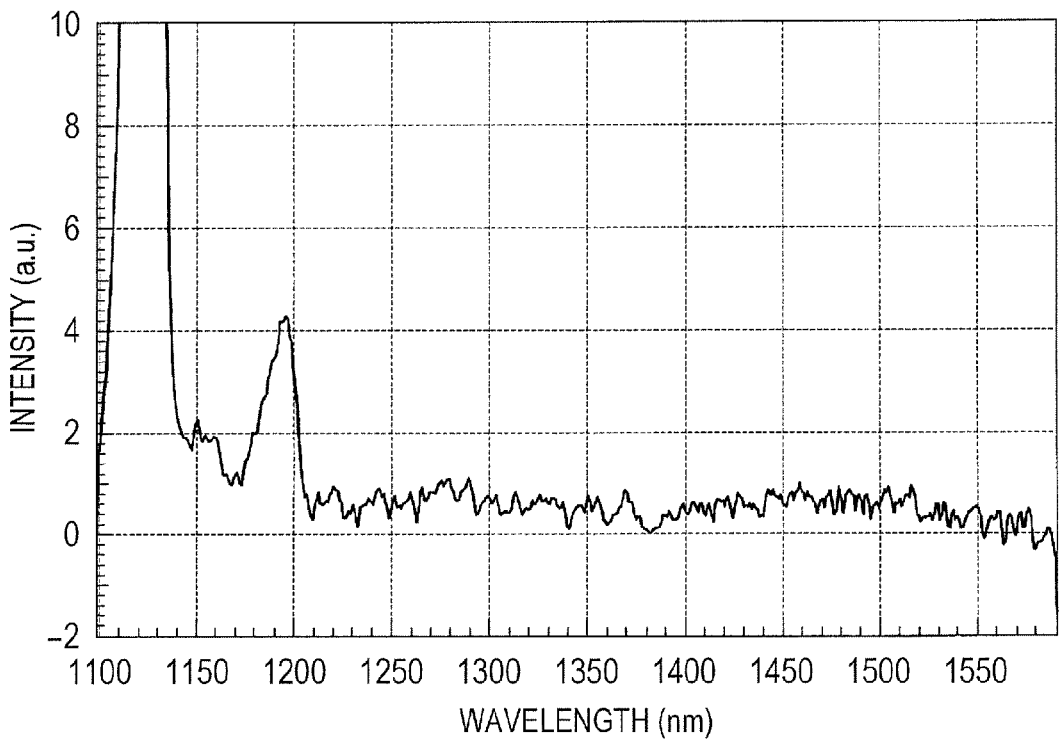
FIG. 48 is a graph showing the result of analysis in the cathode luminescence method in a state where ion implantation into a semiconductor substrate was performed and then microwave annealing of Example 1 was further performed.

FIG. 48 is a graph showing the result of analysis in accordance with the cathode luminescence method in a state where ion implantation into a semiconductor substrate was performed and then the microwave annealing of Example 1 was further performed. FIG. 48 shows the result of analyzing an example in which, e.g., annealing was performed with a microwave having a power of 2 to 10 kW at a temperature of not more than 400° C. for about 5 to 30 minutes as the microwave annealing of Example 1.

As shown in FIG. 48, in Embodiment 1, broad light emission was not monitored in the range of large wavelengths. Accordingly, it can be seen that, when ion implantation into the semiconductor substrate was performed and then the microwave annealing of Example 1 was further performed, the crystal defects present in the semiconductor substrate were cured.

When a comparison is made between FIGS. 47 and 48, it can be seen that, even from microwave annealing at a low temperature of not more than 400° C., a crystal recovery property comparable to that obtained from annealing at a high temperature of about 900° C. was obtained. That is, by the microwave annealing in Embodiment 1, even under a temperature condition of not more than 400° C. which is sufficiently lower than in typical annealing such as furnace annealing performed at, e.g., about 900° C., the crystal defects in the semiconductor substrate can be sufficiently cured. As described above using FIG. 46, in the microwave annealing in Embodiment 1, in terms of sufficiently curing the crystal defects present in the semiconductor substrate, it is desirable to set the power of the microwave to 5 to 10 kW and set the annealing time to 15 to 30 minutes.

A further description will be given of the result of an examination verifying that the microwave annealing in Embodiment 1 can suppress the diffusion of a conductive impurity introduced in a semiconductor substrate.

Figure 49:
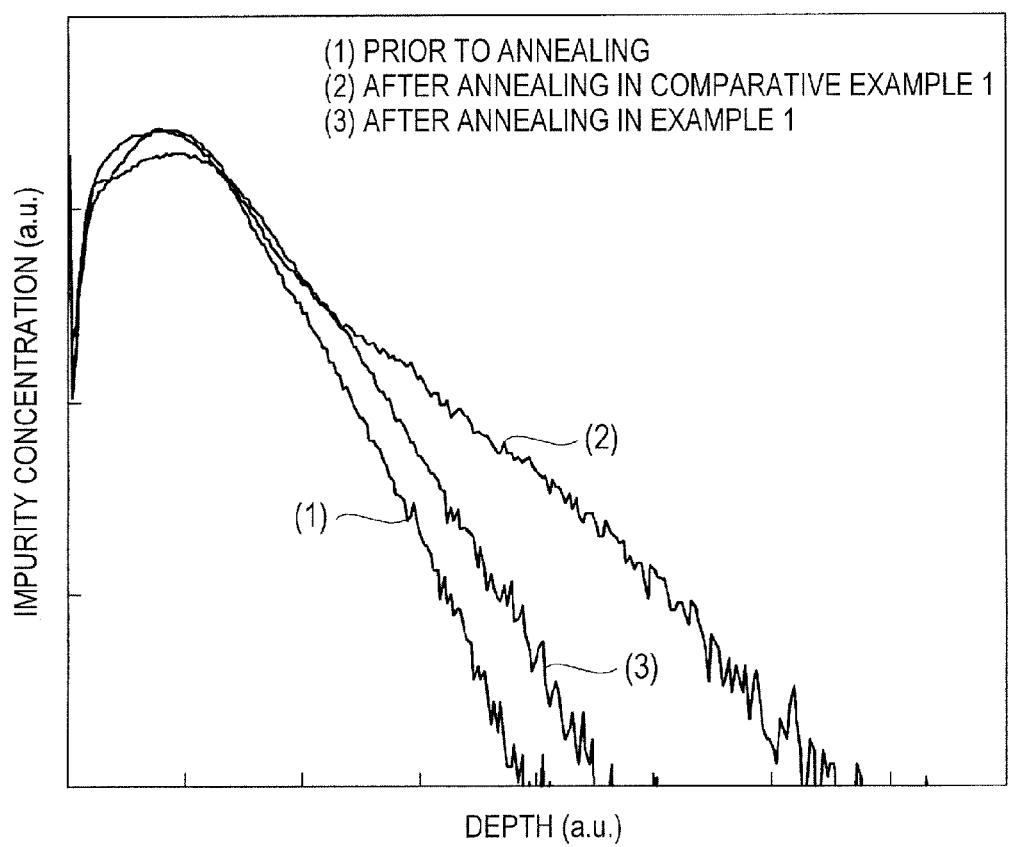
FIG. 49 is a graph showing an impurity concentration profile of boron introduced in a semiconductor substrate.

FIG. 49 is a graph showing the impurity concentration profiles of boron (B) introduced in the semiconductor substrate. In FIG. 49, the abscissa axis shows a depth from the top surface of the semiconductor substrate and the ordinate axis shows the impurity concentration of boron. Also, in FIG. 49, the profile (1) shows a state where boron was merely introduced into the semiconductor substrate using an ion implantation method, i.e., an impurity profile prior to annealing. The profile (2) shows an impurity profile after annealing when boron was introduced and then the furnace annealing of Comparative Example 1 was performed. The profile (3) shows an annealing profile after annealing when the microwave annealing of Example 1 was performed.

As shown in FIG. 49, it can be seen that, in the state where boron (B) was merely introduced into the semiconductor substrate using the ion implantation method (profile (1)), the diffusion of the impurity in the depth direction of the semiconductor substrate is minimum. This shows that, no matter what kind of annealing is performed, boron as the impurity is more diffused than before annealing.

However, as shown by the profiles (2) and (3), the diffusion of the impurity in the depth direction of the semiconductor substrate is more suppressed in the impurity profile when the microwave annealing of Example 1 was performed (3)) than in the impurity profile when the furnace annealing of Comparative Example 1 was performed (profile (2)). This is because, in contrast to the annealing temperature in Comparative Example 1 which is about 900° C., the annealing temperature in Example 1 is, e.g., not more than 400° C. and the diffusion of the impurity can be suppressed more in the case where the microwave annealing in Embodiment 1 is performed than in the case where the furnace annealing using the annealing furnace in Comparative Example 1 is performed.

Using FIG. 49, as an example of the impurity, boron (B) which is a p-type impurity has been described. However, even with phosphorus (P) or arsenic (As) which is an n-type impurity also, the diffusion of the impurity can be suppressed more in the case where the microwave annealing of Example 1 is performed than in the case where the furnace annealing of Comparative Example 1 is performed.

From the foregoing, it can be seen that the advantage of the microwave annealing in Embodiment 1 is that the effect of curing crystal defects comparable to that obtained from the related-art annealing can be obtained, though the microwave annealing in Embodiment 1 is heat treatment at a temperature far lower than the temperature at which the related-art annealing of Comparative Example 1 or the like is performed. Thus, according to Embodiment 1, it is possible to cure the crystal defects present in the semiconductor substrate without giving an excessively large thermal load.

<About Additional Annealing>

Next, a description will be given of a process in which the occurrence of dislocation is suppressed by performing the microwave annealing of Example 1.

Figure 50:
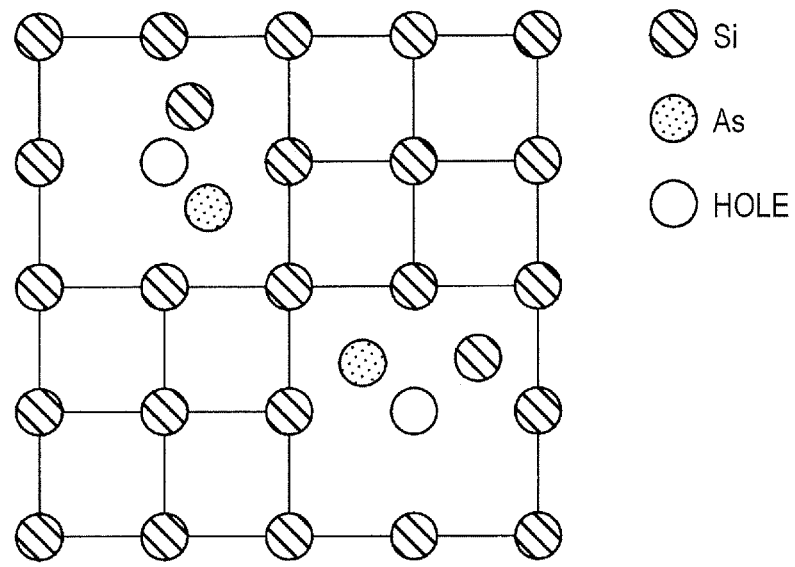
FIG. 50 is a view schematically showing the crystal lattice of silicon after ion implantation is performed.
Figure 51:
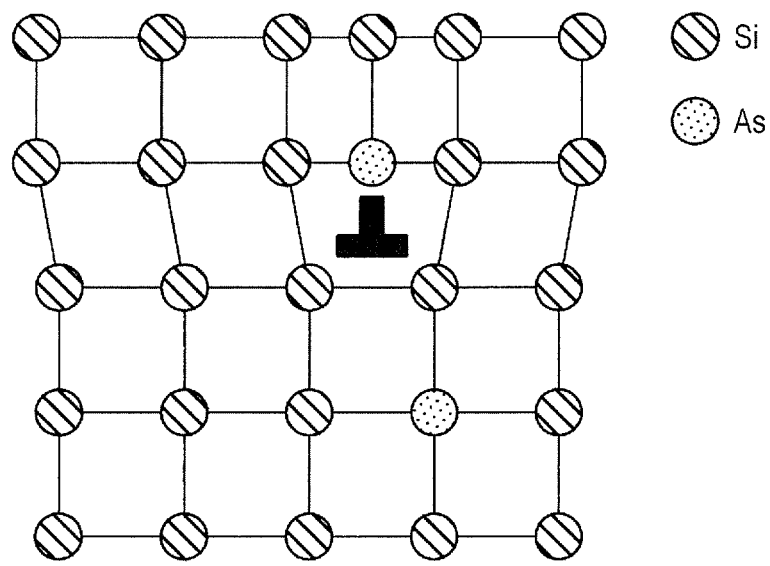
FIG. 51 is a view schematically showing the crystal lattice of silicon after ion implantation is performed.
Figure 52:
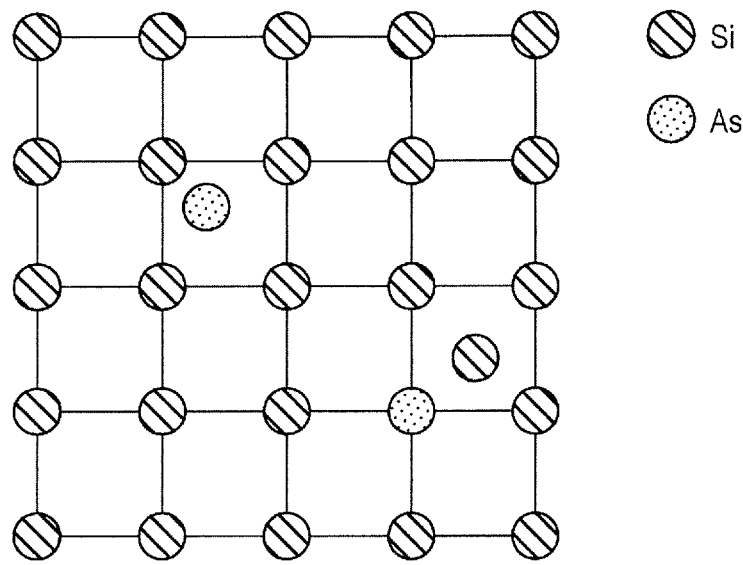
FIG. 52 is a view schematically showing the crystal lattice of silicon after ion implantation is performed.
Figure 53:
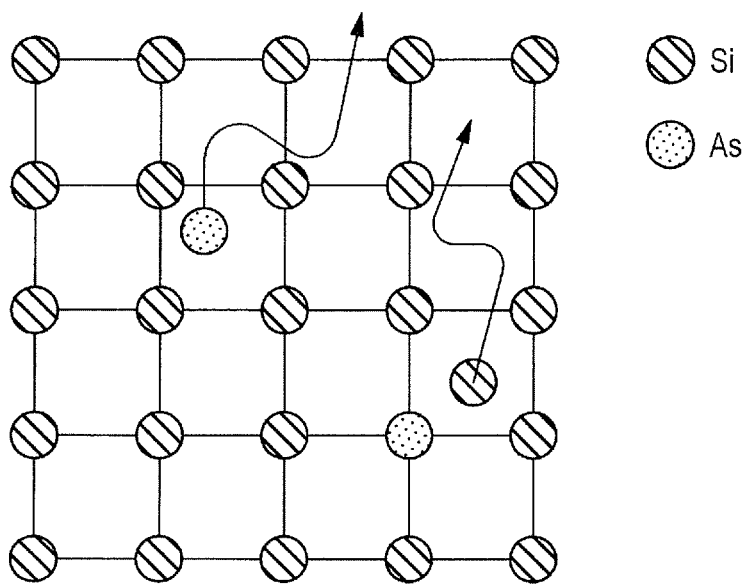
FIG. 53 is a view schematically showing the crystal lattice of silicon after ion implantation is performed.

FIGS. 50 to 53 are views each schematically showing the crystal lattice of silicon after ion implantation is performed. FIG. 50 shows the crystal lattice of silicon immediately after the ion implantation is performed. FIG. 51 shows the crystal lattice of silicon after the ion implantation is performed and then the RTA of Comparative Example 2 is performed at the same temperature as in the microwave annealing. FIG. 52 shows the crystal lattice of silicon after the ion implantation is performed and then the microwave annealing of Example 1 is performed. FIG. 53 shows the crystal lattice of silicon after the microwave annealing of Example 1 is performed and then activation annealing, e.g., the RTA at a temperature of not less than 800° C. of Comparative Example 2 is performed. Note that FIGS. 50 to 53 show the case where arsenic (As) is ion-implanted.

As shown in FIG. 50, immediately after ion implantation is performed, holes are generated in the crystal lattice of silicon and there are silicon (Si) and arsenic (As) between lattice unit cells. Then, after the ion implantation is performed, when the RTA of Comparative Example 2 is performed at a temperature of, e.g., 600° C., the temperature of the semiconductor substrate is raised so that the holes as well as As and Si each as the impurity are diffused to operate to rapidly reduce a hole density. It can be considered that, since dislocation functions to reduce the hole density, Si and As between the lattice unit cells decrease as shown in FIG. 51, but dislocation occurs in the crystal lattice.

When crystal defects resulting from dislocation occur in the crystal lattice, it is difficult to subsequently cure the crystal defects resulting from the dislocation that has occurred. For example, in a typical semiconductor device manufacturing process, before activation annealing is performed, e.g., when an anti-reflection film is formed, the semiconductor substrate may be heated to a temperature of about 600° C. At a temperature of about 600° C., the crystal defects are slightly cured, but are not completely cured, resulting in a state where a given amount of dislocation remains in the semiconductor substrate. In such a state where a given number of crystal defects remain in the semiconductor substrate, even when activation annealing is subsequently performed at a high temperature of about 1000° C., it is difficult to completely cure the remaining crystal defects.

By contrast, when the ion implantation is performed and then the microwave annealing of Example 1 is performed, the semiconductor substrate is annealed at a low temperature so that the diffusion of the holes as well as As and Si each as the impurity over a wide range is suppressed so that diffusion in a proximate range occurs. As a result, as shown in FIG. 52, As and Si between the lattice unit cells do not significantly decrease. However, it can be considered that, since a given number of the holes in the crystal lattice are replaced with As or filled again with Si, the occurrence of dislocation is suppressed.

When the microwave annealing of Example 1 is performed and then the RTA of Comparative Example 2 is performed as additional annealing, it can be considered that, since the additional annealing is performed after the microwave annealing is performed and the hole density is reduced to a degree, even when the semiconductor substrate is annealed at a high temperature by performing the RTA, the occurrence of dislocation is suppressed, as shown in FIG. 53, and the crystal can be completely cured. Thus, it is possible to further cure the crystal defects that have been cured by the microwave annealing, while suppressing the occurrence of crystal defects resulting from new dislocation.

That is, by performing the microwave annealing immediately after the ion implantation and the annealing at a high temperature of, e.g., not less than 800° C. after the microwave annealing in combination, it is possible to cure the crystal defects without causing dislocation in the crystal lattice.

<Main Characteristic Feature and Effect of Embodiment 1>

In Embodiment 1, in the manufacturing process of the semiconductor device in which the photodiode or the like is formed in the pixel region and the semiconductor elements are formed in the peripheral circuit region, after the ion implantation is performed and before the activation annealing is performed, the microwave annealing is performed. This allows the annealing to be performed at a temperature lower than the temperature at which typical annealing is performed and allows the diffusion of the impurity to be suppressed. Accordingly, it is possible to cure the crystal defects in the photodiode or the like formed in the pixel region, while suppressing variations in the characteristics of the semiconductor elements formed in the peripheral circuit region. Therefore, it is possible to improve the performance of the semiconductor device.

Preferably, after the ion implantation is performed and the microwave annealing is performed, typical activation annealing is performed at a temperature of, e.g., not less than 800° C. As described above, by performing the microwave annealing, the crystal defects resulting from, e.g., the dislocation that has occurred during the ion implantation are cured. Accordingly, when the microwave annealing is performed and then typical annealing such as furnace annealing is performed at a temperature of, e.g., not less than 800° C., the occurrence of dislocation is suppressed. Therefore, it is possible to further cure the crystal defects that have been cured by the microwave annealing, while suppressing the occurrence of crystal defects resulting from increased dislocation.

Figure 54:
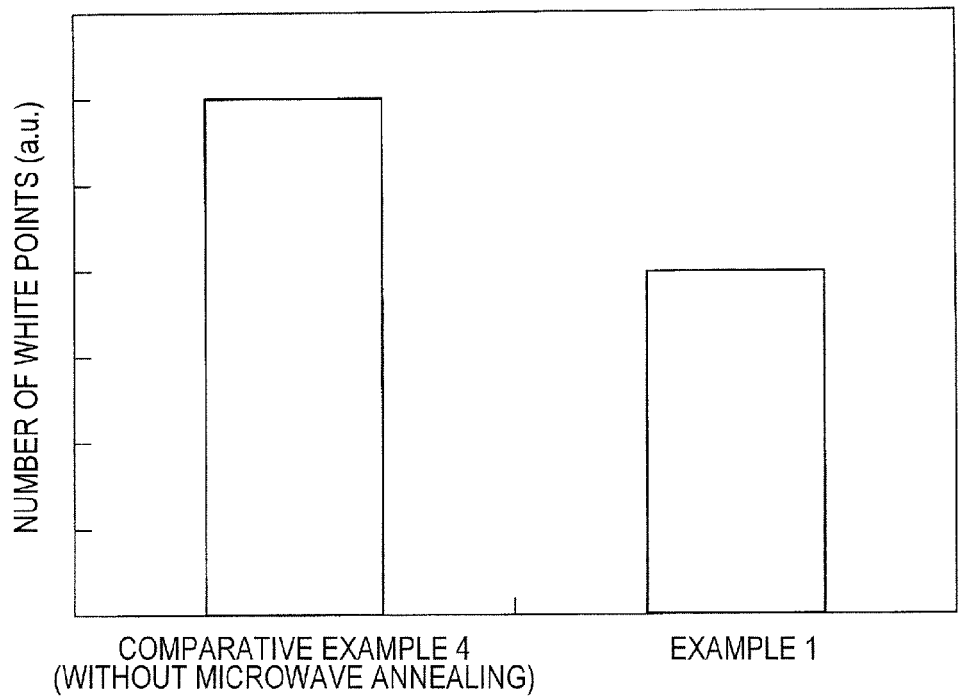
FIG. 54 is a graph showing, for comparison, the results of measuring the number of pixels in which white points are observed among a given number of pixels, i.e., the number of the white points in Comparative Example 4 and Example 1.

FIG. 54 is a graph showing, for comparison, the results of measuring the number of pixels in which white points are observed among a given number of pixels, i.e., the number of the white points in Comparative Example 4 and Example 1. The ordinate axis in FIG. 54 shows, in an arbitrary unit, the numbers of the white points in Comparative Example 4 and Example 1 that have been normalized with, e.g., the number of the white points in Comparative Example 4. Comparative Example corresponds to the case where activation annealing is performed without performing the microwave annealing.

As shown in FIG. 54, the number of the white points in Example 1 is smaller than the number of the white points in Comparative Example 4, i.e., in the case where the activation annealing is performed without performing the microwave annealing.

Figure 55:
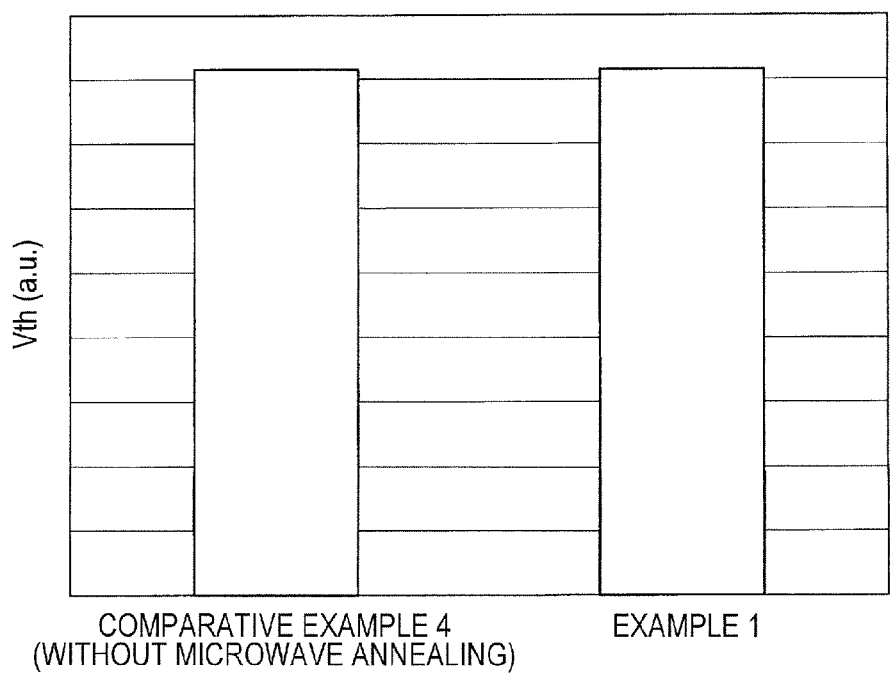
FIG. 55 is a graph showing, for comparison, the results of measuring the threshold voltages of MISFETs formed in a peripheral circuit region in Comparative Example 4 and Example 1.

FIG. 55 is a graph showing, for comparison, the results of measuring the threshold voltages (Vth) of the MISFETs formed in the peripheral circuit region in Comparative Example 4 and Example 1. The ordinate axis in FIG. 55 shows, in an arbitrary unit, the threshold voltages Vth in Comparative Example 4 and Example 1 that have been normalized with, e.g., the threshold voltage Vth in Comparative Example 4, i.e., in the case where the activation annealing is performed without performing the microwave annealing.

As shown in FIG. 55, the threshold voltage Vth in Example 1 has undergone no variation, i.e., no Vth shift in contrast to the threshold voltage Vth in Comparative Example 4. Therefore, according to Embodiment 1, since the microwave annealing is performed at a low temperature, it is possible to prevent a Vth shift from occurring in each of the MISFETs formed in the peripheral circuit region by suppressing the impurity diffusion.

(Embodiment 2)

In Embodiment 1, a description has been given of the example in which the semiconductor device is the front-side-illuminated image sensor on which light is incident from the front side of the semiconductor substrate. By contrast, in Embodiment 2, a description will be given of an example in which a semiconductor device is a back-side-illuminated image sensor on which light is incident from the back side of a semiconductor substrate.

For example, in the front-side-illuminated image sensor, light incident on the microlens is transmitted by the interlayer insulating film to illuminate the photodiode. Of the interlayer insulating film, the portion located over the photodiode is not formed with the interconnect layers and serves as a light transmitting region. However, as the number of the pixels of the image sensor increases and the size thereof decreases, the area of the light transmitting region decreases. As a result, in the front-side-illuminated image sensor, the amount of light incident on the photodiode may decrease.

Accordingly, the back-side-illuminated image sensor has been proposed on which light is incident from the back side of the semiconductor substrate and the incident light is led to efficiently reach the photodiode.

The configuration of the semiconductor device of Embodiment 2 and the structures of the elements in the peripheral circuit region thereof are the same as the configuration of the semiconductor device of Embodiment 1 and the structures of the elements in the peripheral circuit region thereof that have been described using FIGS. 1 to 6 and 8 so that a description thereof is omitted.

<Structures of Elements in Pixel Region>

Figure 56:
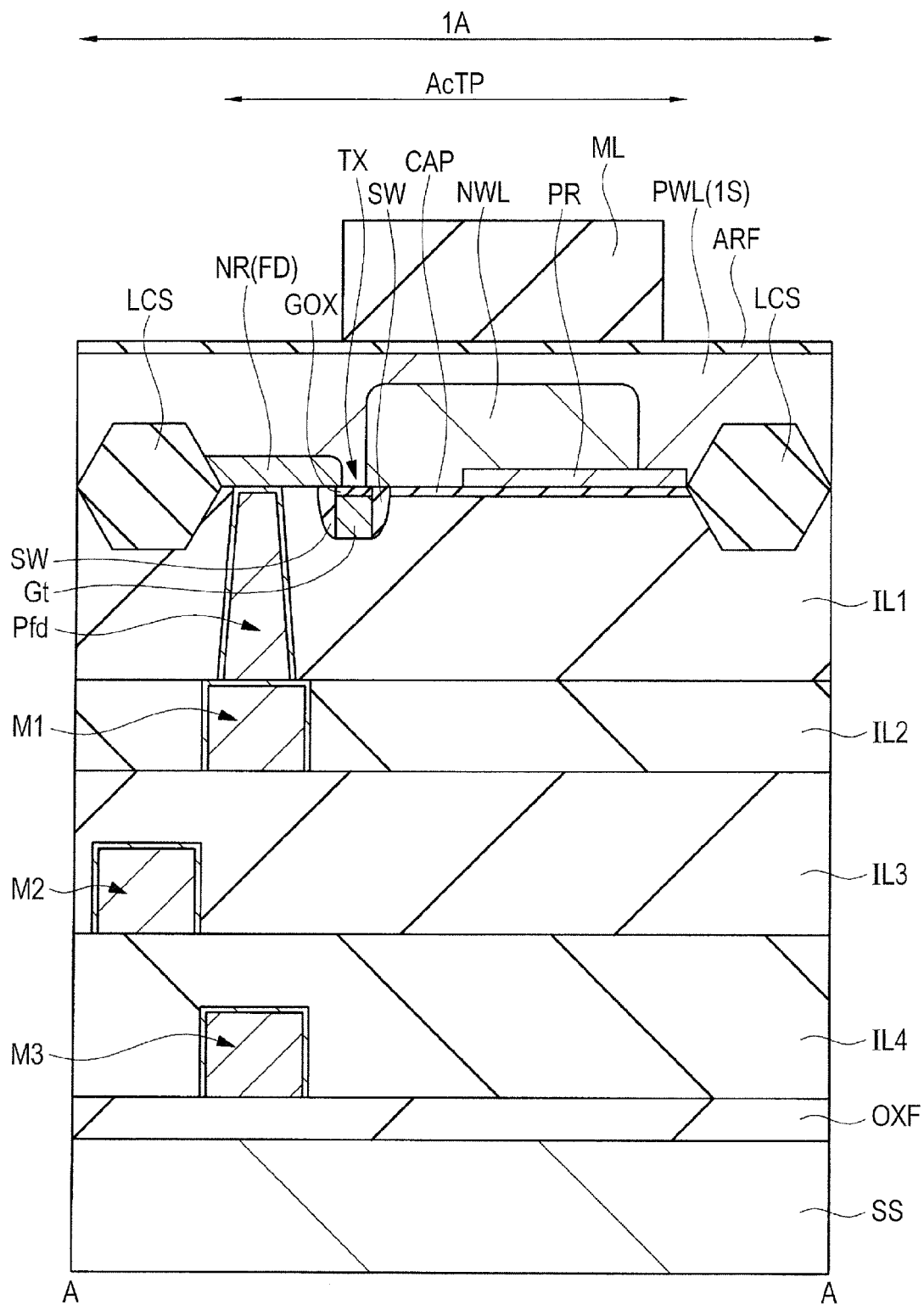
FIG. 56 is a cross-sectional view showing a configuration of a semiconductor device of Embodiment 2.

Next, the structures of the elements in the pixel region will be described. FIG. 56 is a cross-sectional view showing the configuration of the semiconductor device of Embodiment 2. FIG. 56 corresponds to a cross section along the line A-A in FIG. 3.

As shown in FIG. 56, Embodiment 2 is the same as Embodiment 1 in that, in the semiconductor substrate 1S, the photodiode and the transfer transistor TX are formed and, on the top surface side (lower side in FIG. 56) of the semiconductor substrate 1S, the interlayer insulating films and the interconnect layers are formed. In Embodiment 2, in a layer under the interlayer insulating film, an adhesion film OXF is formed and, in a layer under the adhesion film OXF, a supporting substrate SS is placed.

Also, in Embodiment 2, the thickness of the semiconductor substrate 1S is smaller than in Embodiment 1, the anti-reflection film ARF is formed of, e.g., a silicon oxynitride film over the back surface (upper surface in FIG. 56) of the semiconductor substrate 1S, and, over the anti-reflection film ARF, the microlens ML is mounted. Note that, between the semiconductor substrate 1S and the anti-reflection film ARF, $p^+$-type semiconductor region may also be formed.

In the pixel region 1A thus configured, when light is incident on the microlens ML, the light incident on the microlens ML reaches the back surface of the semiconductor substrate 1S through the anti-reflection film ARF. Then, the light that has reached the back surface of the semiconductor substrate 1S enters the semiconductor substrate 1S to illuminate the photodiode.

<Manufacturing Method of Semiconductor Device>

Next, a description will be given of a manufacturing method of the semiconductor device of Embodiment 2. Note that, in the following, a description will be given of a manufacturing process in the pixel region.

Figure 57:
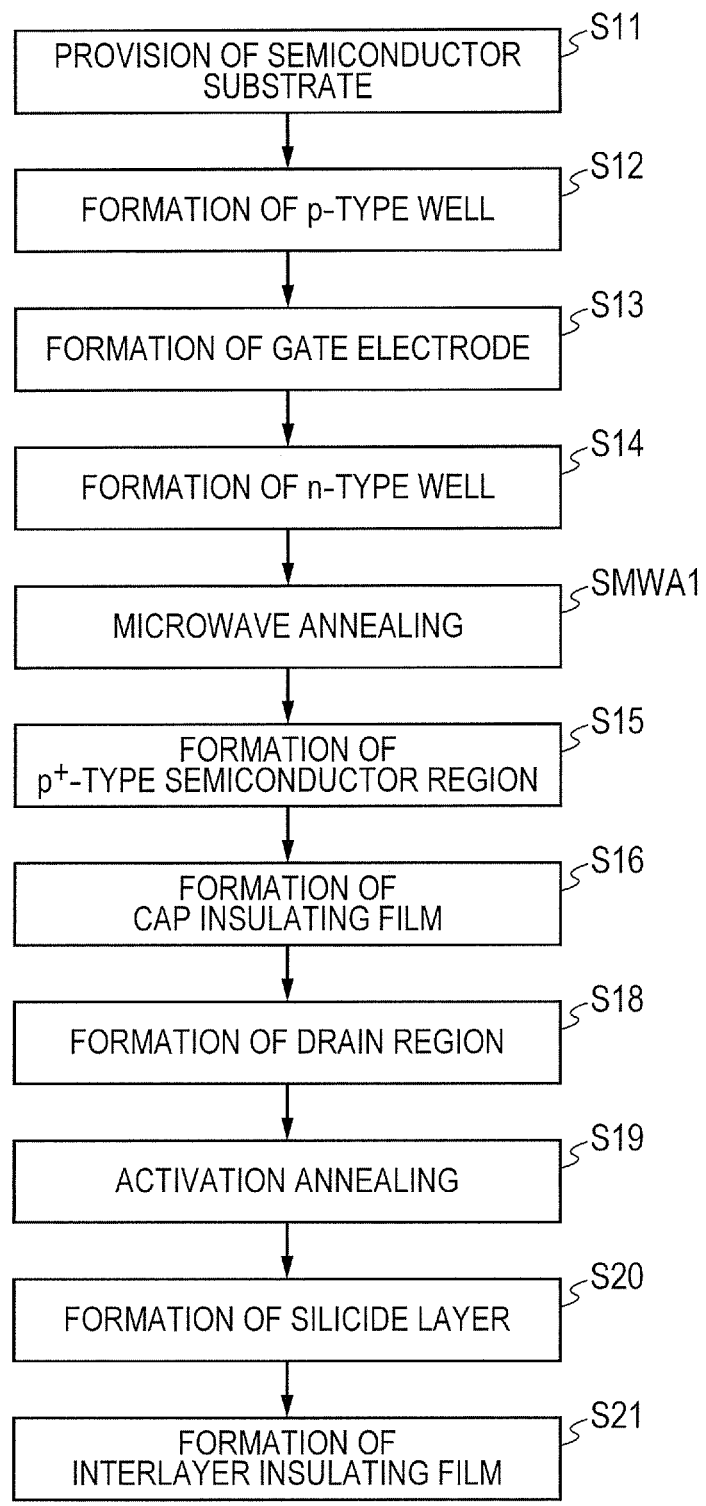
FIG. 57 is a process flow chart showing a part of a manufacturing process of the semiconductor device of Embodiment 2.

FIG. 57 is a process flow chart showing a part of the manufacturing process of the semiconductor device of Embodiment 2. FIGS. 58 to 63 are cross-sectional views each showing the manufacturing process of the semiconductor device of Embodiment 2. Note that FIG. 57 mainly shows, of the manufacturing process of the semiconductor device of Embodiment 2, the manufacturing process in the pixel region 1A. Each of the cross-sectional views of FIGS. 58 to 63 corresponds to a cross section along the line A-A in FIG. 3.

The manufacturing method of the semiconductor device of Embodiment 2 is different from the manufacturing method of the semiconductor device of Embodiment 1 in that the anti-reflection film is not formed after the cap insulating film is formed and before the drain region is formed.

In Embodiment 2, the same steps (Steps S11 to S14 and SMWA1 in FIG. 57) as Steps S11 to S14 and SMWA1 in FIG. 10 are formed.

Figure 58:
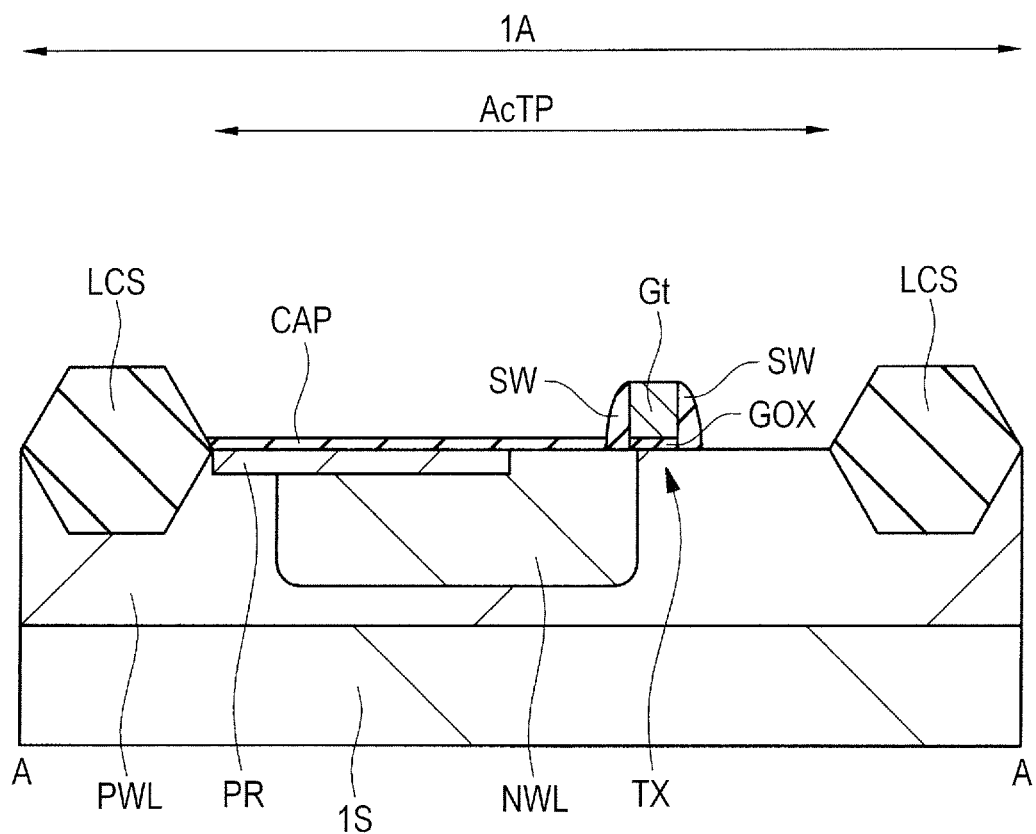
FIG. 58 is a cross-sectional view showing the manufacturing process of the semiconductor device of Embodiment 2.

Next, as shown in FIG. 58, in the pixel region 1A, the $p^+$-type semiconductor region PR and the cap insulating film CAP (Steps S15 and S16 in FIG. 57) are formed. The respective processes in Steps S15 and S16 can be performed similarly to the respective processes in Steps S15 and S16 in Embodiment 1.

Figure 59:
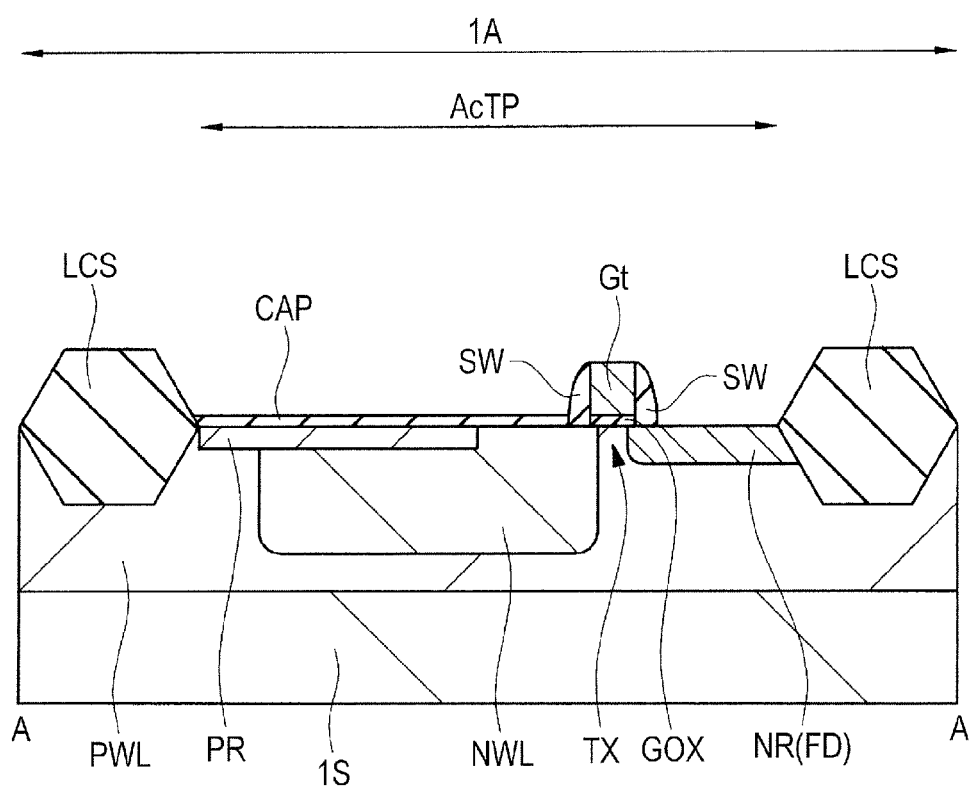
FIG. 59 is a cross-sectional view showing the manufacturing process of the semiconductor device of Embodiment 2.

Next, as shown in FIG. 59, in the pixel region 1A, in the p-type well PWL on the other side (right-hand side in FIG. 59) of the gate electrode Gt, the n-type higher-concentration semiconductor region NR as each of the floating diffusion FD and the drain region of the transfer transistor TX is formed (Step S18 in FIG. 57). The process in Step S18 can be performed similarly to the process in Step S18 in Embodiment 1.

Figure 60:
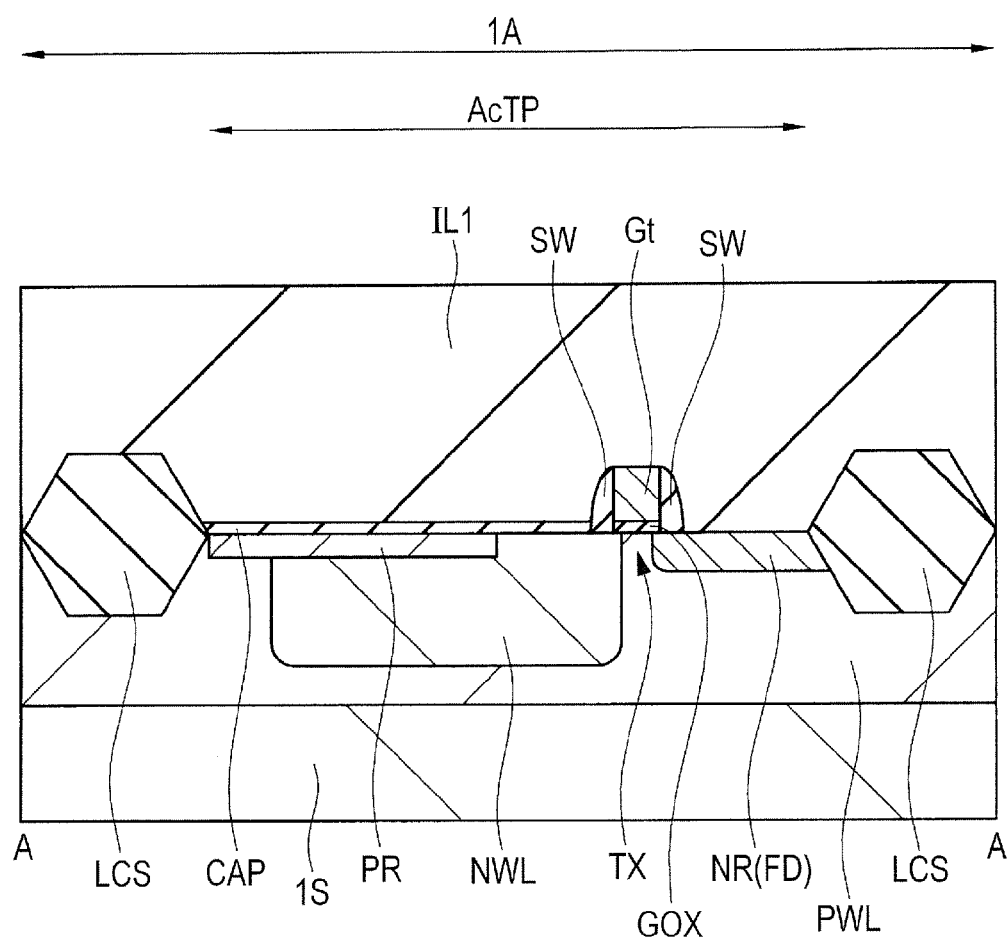
FIG. 60 is a cross-sectional view showing the manufacturing process of the semiconductor device of Embodiment 2.
Figure 61:
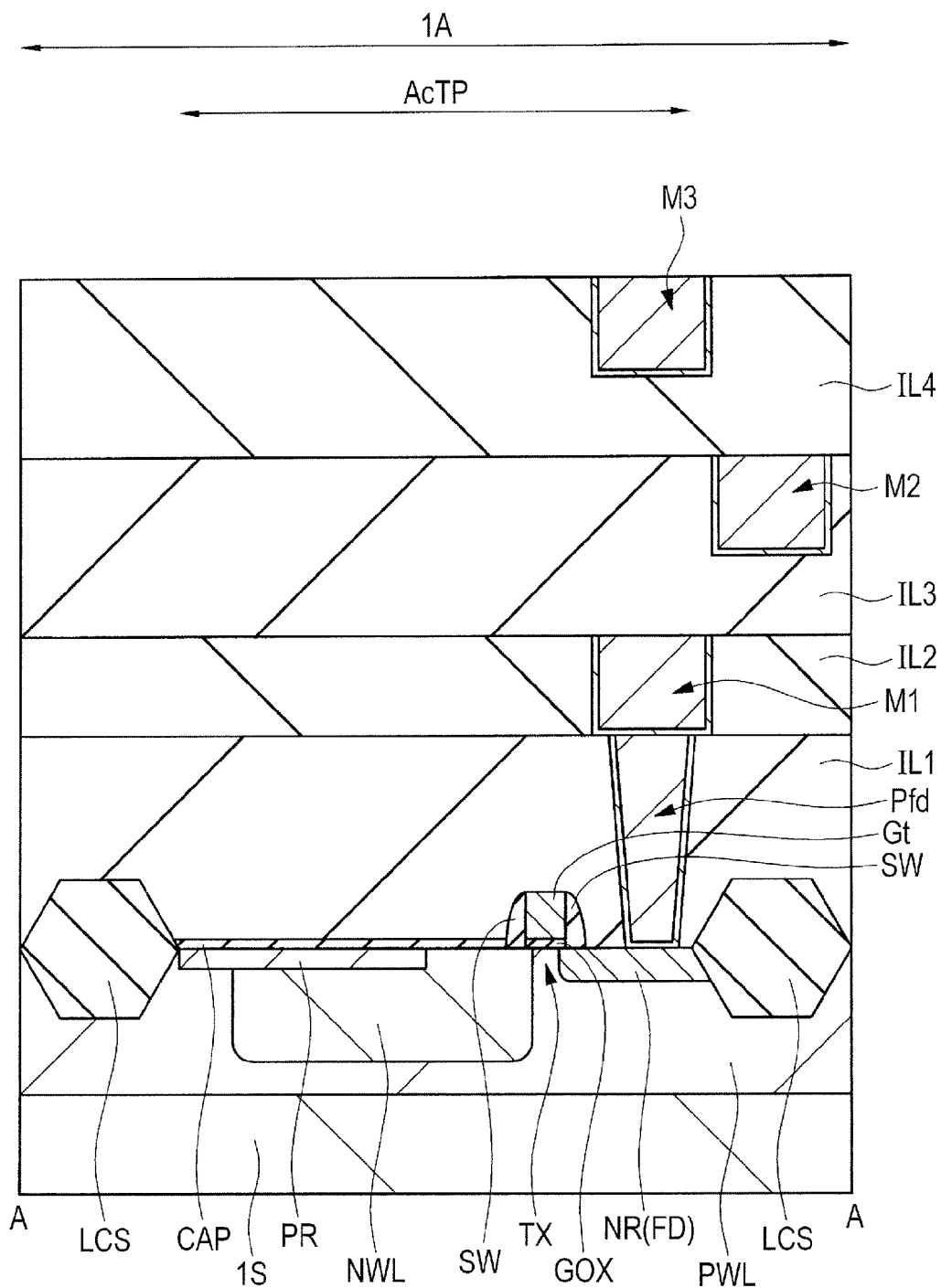
FIG. 61 is a cross-sectional view showing the manufacturing process of the semiconductor device of Embodiment 2.

Thereafter, by performing the same processes (Steps S19 to S21 in FIG. 57) as Steps S19 to S21 in FIG. 10, as shown in FIG. 60, the interlayer insulating film IL1 is formed. Then, after the contact hole CHfd is formed in the same manner as in FIG. 36, as shown in FIG. 61, the plug Pfd, the interlayer insulating films IL2 to IL4, and the interconnects M1 to M3 are formed. The process of forming the contact hole CHfd, the plug Pfd, the interlayer insulating films IL2 to IL4, and the interconnects M1 to M3 can be performed in the same manner as in Embodiment 1. However, the structures shown in FIGS. 60 and 61 are different from the structures shown in FIGS. 34 and 38 in Embodiment 1 in that no anti-reflection film is formed.

Note that FIGS. 60 and 61 show an example in which no silicide layer is formed in the top surface of the n-type higher-concentration semiconductor region NR as each of the floating diffusion FD and the drain region of the transfer transistor TX (the same holds true in FIGS. 62 and 63 described later). However, as has been described using FIG. 9 in Embodiment 1, a silicide layer may also be formed in the top surface of the n-type higher-concentration semiconductor region NR as each of the floating diffusion FD and the drain region of the transfer transistor TX.

Figure 62:
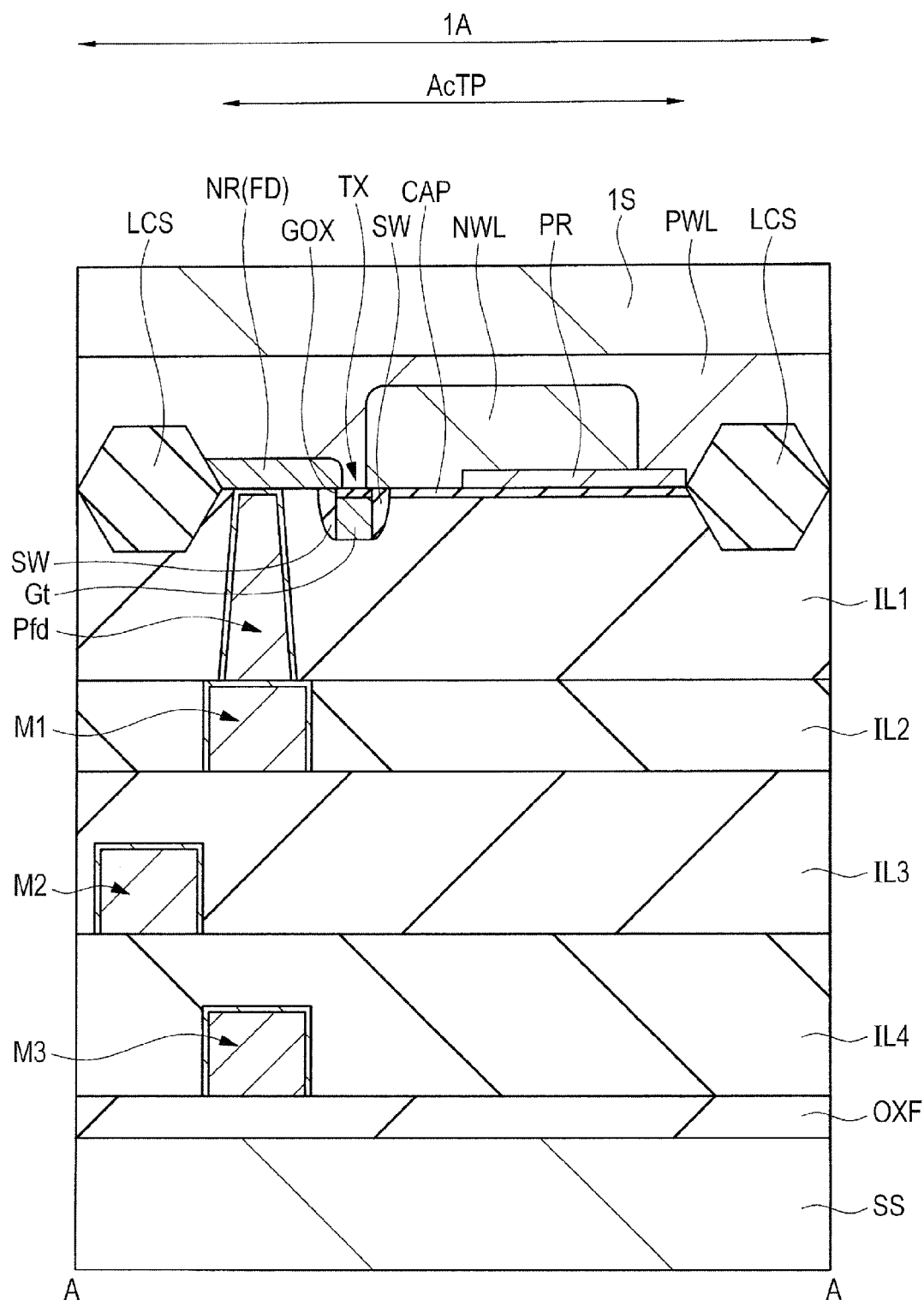
FIG. 62 is a cross-sectional view showing the manufacturing process of the semiconductor device of Embodiment 2.
Figure 63:
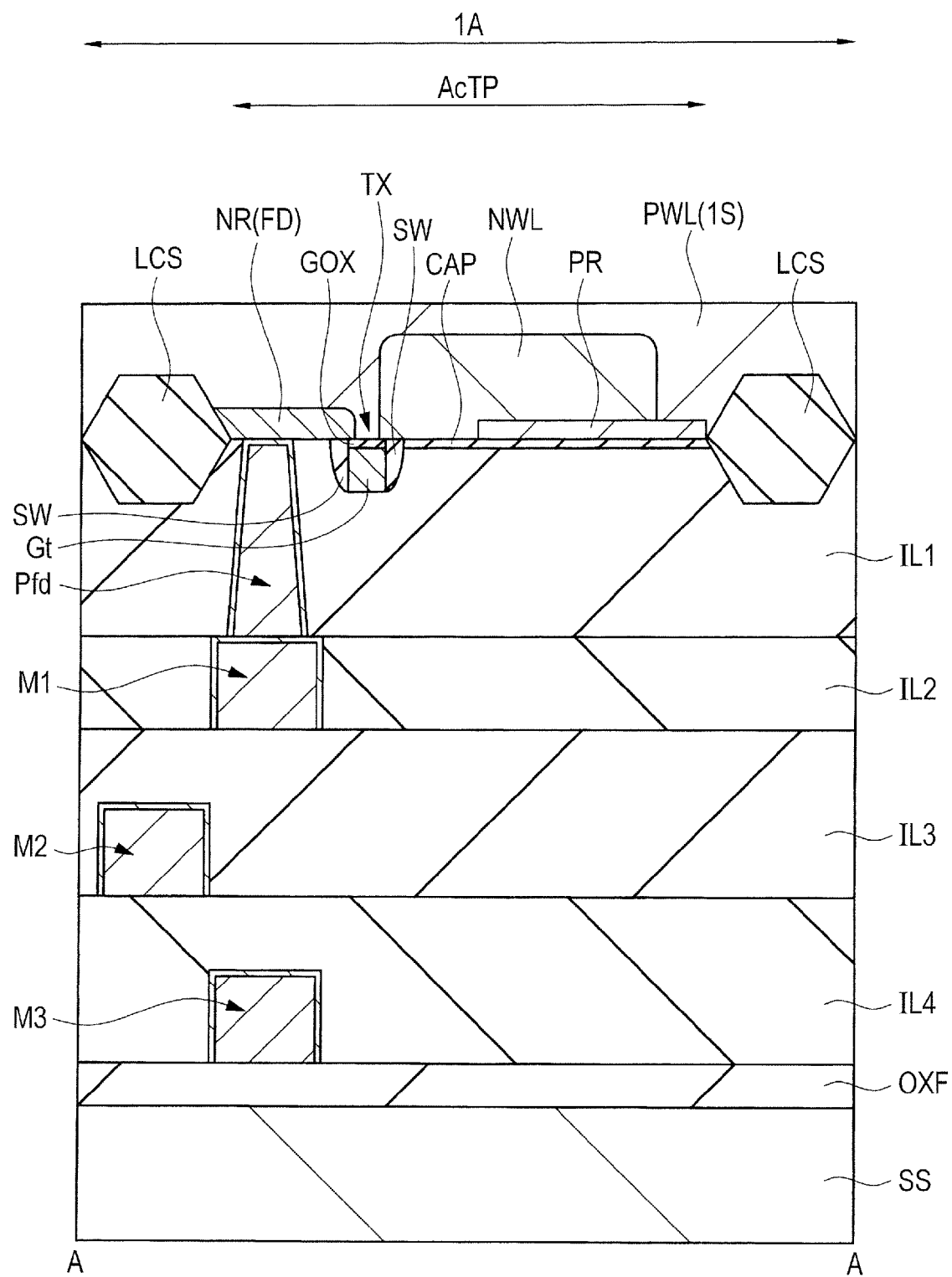
FIG. 63 is a cross-sectional view showing the manufacturing process of the semiconductor device of Embodiment 2.

Next, as shown in FIG. 62, the top surface of the interlayer insulating film IL4 formed with the interconnects M3 is caused to face downward and, over the top surface of the interlayer insulating film Il4, the supporting substrate SS is placed via the adhesion film OXF formed of, e.g., a silicon oxide film. As a result, the semiconductor substrate 1S is fixed to the supporting substrate SS with the back surface of the semiconductor substrate 1S facing upward. Then, as shown in FIG. 63, the back surface of the semiconductor substrate 1S facing upward is ground. Thus, the thickness of the semiconductor substrate 1S can be reduced.

Subsequently, as shown in FIG. 56, over the back surface of the semiconductor substrate 1S, the anti-reflection film ARF formed of, e.g., a silicon oxynitride film is formed. Note that, by using a photolithographic technique and an ion implantation method, a p-type impurity such as boron (B) may also be introduced into the back surface of the semiconductor substrate 1S facing upward to form a $p^+$-type semiconductor region between the semiconductor substrate 1S and the anti-reflection film ARF.

Next, as shown in FIG. 56, onto the anti-reflection film ARF, the microlens ML is attached so as to face the n-type well NWL forming the photodiode in planar view. In this manner, the semiconductor device as the image sensor in Embodiment 2 can be manufactured.

<Modification of Manufacturing Method of Semiconductor Device>

Figure 64:
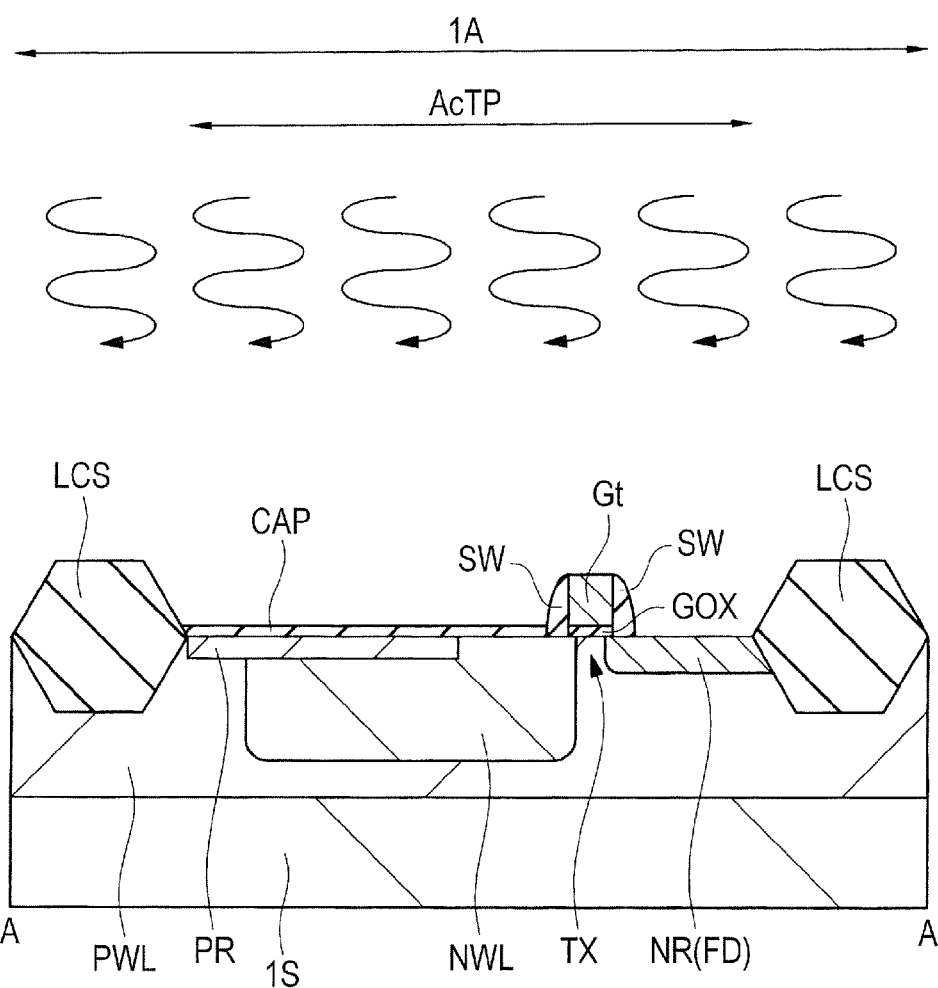
FIG. 64 is a cross-sectional view showing a manufacturing process of a semiconductor device of a modification of Embodiment 2.

Next, a description will be given of a modification of Embodiment 2. FIG. 64 is a cross-sectional view showing a manufacturing process of a semiconductor device of a modification of Embodiment 2. The cross-sectional view of FIG. 64 corresponds to a cross section along the line A-A in FIG. 3.

In the manufacturing method of the semiconductor device of the modification of Embodiment 2 also, in the same manner as in the first modification of the manufacturing method of the semiconductor device of Embodiment 1, after the process in Step S12 in FIG. 57 is performed and before the process in Step S13 in FIG. 57 is performed, microwave annealing based on the same process as in Step SMWA2 in FIG. 39 can be performed.

In the manufacturing method of the semiconductor device of the modification of Embodiment 2 also, in the same manner as in the second modification of the manufacturing method of the semiconductor device of Embodiment 1, after the process in Step S18 in FIG. 57 is performed and before the process in Step S19 in FIG. 57 is performed, as shown in FIG. 64, microwave annealing based on the same process as in Step SMWA3 in FIG. 41 can be performed.

That is, in the same manner as in each of the modifications of Embodiment 1, as the modification of Embodiment 2, any two or three of Steps SMWA1, SMWA2, and SMWA3 can be performed in combination. This allows the same effect as the effect of the microwave annealing in each of the combined steps to be obtained and allows the crystal defects formed in each of the processes to be cured immediately.

<Main Characteristic Feature and Effect of Embodiment 2>

In Embodiment 2, in the same manner as in Embodiment 1, in the manufacturing process of the semiconductor device in which the photodiode or the like is formed in the pixel region and the semiconductor elements are formed in the peripheral circuit region, after the ion implantation is performed and before the activation annealing is performed, the microwave annealing is performed. Accordingly, it is possible to cure the crystal defects in the photodiode or the like formed in the pixel region, while ensuring the characteristics of the semiconductor elements each formed in the peripheral circuit region and having the same effect as in Embodiment 1. Therefore, it is possible to improve the performance of the semiconductor device.

Also, in the same manner as in Embodiment 1, it is preferable to perform ion implantation, perform microwave annealing immediately thereafter, and then perform typical annealing at a temperature of, e.g., not less than 800° C. This allows the crystal defects cured by the microwave annealing to be further cured, while suppressing the occurrence of crystal defects resulting from increased dislocation.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising:
    (a) providing a semiconductor substrate having a first conductivity type;
    (b) after the step (a), forming, in the semiconductor substrate, a first semiconductor region having a second conductivity type opposite to the first conductivity type and forming a part of a photodiode;
    (c) forming, over the semiconductor substrate, a gate electrode of a transfer transistor which transfers charges generated by the photodiode;
    (d) forming a second semiconductor region having the first conductivity type and forming the other part of the photodiode such that the second semiconductor region is included in the first semiconductor region;
    (e) after the step (d), applying a microwave to the semiconductor substrate to heat the semiconductor substrate;
    (f) after the step (e), forming, in the semiconductor substrate, a drain region of the transfer transistor;

(g) after the step (f), forming an interlayer insulating film over the semiconductor substrate;
(o) forming a contact hole extending through the interlayer insulating film to reach the drain region;
(p) filling the contact hole with a conductor film to form a plug;
(q) after the step (p), forming an interconnect layer over the interlayer insulating film;
(r) after the step (q), attaching a supporting substrate to the semiconductor substrate; and
(s) after the step (r), grinding a back surface of the semiconductor substrate.

2. The method of manufacturing a semiconductor device according to claim 1,
wherein the first conductivity type is an n-type, and
wherein the second conductivity type is a p-type.

3. The method of manufacturing a semiconductor device according to claim 1,
wherein, in the step (e), the microwave is applied to the semiconductor substrate to induce lattice vibration of a silicon crystal forming the semiconductor substrate and thus heat the semiconductor substrate, and
wherein the microwave used in the step (e) has a frequency which allows the microwave to be resonantly absorbed by the silicon crystal.

4. The method of manufacturing a semiconductor device according to claim 3,
wherein the frequency of the microwave is 5.8 GHz.

5. The method of manufacturing a semiconductor device according to claim 1,
wherein the microwave used in the step (e) has a power of 5 to 10 kW.

6. The method of manufacturing a semiconductor device according to claim 1,
wherein a time during which the semiconductor substrate is heated using the microwave in the step (e) is 15 to 30 minutes.

7. The method of manufacturing a semiconductor device according to claim 1, further comprising the step of:
(h) after the step (b) and prior to the step (d), applying a microwave to the semiconductor substrate to heat the semiconductor substrate.

8. The method of manufacturing a semiconductor device according to claim 7, further comprising the step of:
(i) after the step (f) and prior to the step (g), applying a microwave to the semiconductor substrate to heat the semiconductor substrate.

9. The method of manufacturing a semiconductor device according to claim 1, further comprising the step of:
(i) after the step (f) and prior to the step (g), applying a microwave to the semiconductor substrate to heat the semiconductor substrate.

10. The method of manufacturing a semiconductor device according to claim 1, further comprising the step of:
(j) after the step (e), subjecting the semiconductor substrate to heat treatment at a temperature of not less than 800° C.

11. The method of manufacturing a semiconductor device according to claim 1, further comprising the step of:
(k) after the step (e) and prior to the step (f), forming an anti-reflection film over the second semiconductor region.

12. The method of manufacturing a semiconductor device according to claim 11, further comprising the steps of:
(l) forming a contact hole extending through the interlayer insulating film to reach the drain region;
(m) filling the contact hole with a conductor film to form a plug; and
(n) after the step (m), forming an interconnect layer over the interlayer insulating film.

* * * * *